United States Patent
Lo et al.

(10) Patent No.: US 9,640,476 B2
(45) Date of Patent: May 2, 2017

(54) DRIVING CIRCUIT AND PIN OUTPUT ORDER ARRANGING METHOD

(71) Applicant: Raydium Semiconductor Corporation, Hsinchu (TW)

(72) Inventors: Shin-Tai Lo, Miaoli (TW); Cheng-Nan Lin, Taipei (TW); Shao-Ping Hung, Hsinchu (TW)

(73) Assignee: Raydlum Semiconductor Corporation, Hsinchu County (TW)

( * ) Notice: Subject to any disclaimer, the term of this patent is extended or adjusted under 35 U.S.C. 154(b) by 0 days.

(21) Appl. No.: 15/218,823

(22) Filed: Jul. 25, 2016

(65) Prior Publication Data

US 2017/0077024 A1    Mar. 16, 2017

Related U.S. Application Data

(60) Provisional application No. 62/256,754, filed on Nov. 18, 2015, provisional application No. 62/218,643, filed on Sep. 15, 2015.

(51) Int. Cl.
  *H01L 21/70* (2006.01)
  *H01L 23/50* (2006.01)
  *H01L 27/02* (2006.01)
(52) U.S. Cl.
  CPC .......... *H01L 23/50* (2013.01); *H01L 27/0207* (2013.01)

(58) Field of Classification Search
  CPC .......... H01L 23/5384; H01L 23/49827; H01L 23/49811; H01L 21/486; H01L 21/4853; H01L 27/0207; H01L 23/50; H01L 41/0475
  See application file for complete search history.

(56) References Cited

U.S. PATENT DOCUMENTS

| | | | |
|---|---|---|---|
| 2005/0146011 A1* | 7/2005 | Roper | H01L 23/3114 257/686 |
| 2015/0253593 A1* | 9/2015 | Sugiyama | G02F 1/0121 385/40 |
| 2016/0049742 A1* | 2/2016 | Han | G06K 19/07743 365/185.18 |

* cited by examiner

*Primary Examiner* — Yosef Gebreyesus

(57) ABSTRACT

A driving circuit and a pin output order arranging method are disclosed. The driving circuit includes (M*N) pins and an arranging module. A first pin~an N-th pin of the (M*N) pins, a (N+1)-th pin~an 2N-th pin of the (M*N) pins, . . . , a [(M−1)*N+1]-th pin~a (M*N)-th pin of the (M*N) pins are arranged along a first direction in a specific distance spaced to form a first row of pins~an M-th row of pins. The first row of pins~the M-th row of pins are staggered along a second direction in a staggering way or an aligning way. M and N are integers larger than 1. The arranging module correspondingly arranges the pin output order of the (M*N) pins according to different application modes of the driving circuit.

42 Claims, 36 Drawing Sheets

US 9,640,476 B2

DRIVING CIRCUIT AND PIN OUTPUT ORDER ARRANGING METHOD

BACKGROUND OF THE INVENTION

Field of the Invention

This invention relates to a driving circuit, especially to a driving circuit having a pin output order arranging function and a pin output order arranging method.

Description of the Related Art

In general, if a conventional driving IC is designed for chip on glass (COG) applications, the pitch of its IC pins is usually smaller, such as the pitch of 11 um; if a conventional driving IC is designed for chip on film (COF) applications, the pitch of its IC pins is usually larger, such as the pitch of 22 um. Therefore, it is hard to use the COG driving IC having smaller pitch in the COF driving IC having larger pitch.

In order to make the conventional driving IC meets the pitch requirements of COG and COF applications and used in COG and COF products at the same time, the conventional driving IC will have larger pitch of 22 um instead of smaller pitch of 11 um. This will cause some drawbacks such as larger size and higher cost of the conventional driving IC.

SUMMARY OF THE INVENTION

Therefore, the invention provides a driving circuit and a pin output order arranging method to solve the above-mentioned problems.

A preferred embodiment of the invention is a driving circuit. In this embodiment, the driving circuit has a pin output order arranging function. The driving circuit includes (M*N) pins and an arranging module. The (M*N) pins include a first pin, a second pin, . . . , and a (M*N)-th pin, wherein the first pin, the second pin, . . . , and an N-th pin of the (M*N) pins are arranged along a first direction in a specific distance spaced to form a first row of pins, a (N+1)-th pin, a (N+2)-th pin, . . . , and an 2N-th pin of the (M*N) pins are arranged along the first direction in the specific distance spaced to form a second row of pins, . . . , and a [(M−1)*N+1]-th pin, a [(M−1)*N+2]-th pin, . . . , and a (M*N)-th pin of the (M*N) pins are arranged along the first direction in the specific distance spaced to form a M-th row of pins. The first row of pins, the second row of pins, . . . , and the M-th row of pins are staggered along a second direction in a staggering way or an aligning way, and M and N are integers larger than 1. The arranging module is coupled to the (M*N) pins. The arranging module correspondingly arranges a pin output order S1~SMN of the (M*N) pins according to different application modes of the driving circuit.

In an embodiment, M=4, when an application mode of the driving circuit is a chip-on-glass (COG) mode, the pin output order S1~S4N of the (4*N) pins arranged by the arranging module is: (S1) the first pin, (S2) the (2N+1)-th pin, (S3) the (N+1)-th pin, (S4) the (3N+1)-th pin, . . . , (S4N−3) the N-th pin, (S4N−2) the 3N-th pin, (S4N−1) the 2N-th pin, and (S4N) the 4N-th pin, so that a distance between two pins having adjacent output order corresponds to the COG mode.

In an embodiment, M=4, when an application mode of the driving circuit is a COG mode, the pin output order S1~S4N of the (4*N) pins arranged by the arranging module is: (S1) the 4N-th pin, (S2) the 2N-th pin, (S3) the 3N-th pin, (S4) the N-th pin, . . . , (S4N−3) the (3N+1)-th pin, (S4N−2) the (N+1)-th pin, (S4N−1) the (2N+1)-th pin, and (S4N) the first pin, so that a distance between two pins having adjacent output order corresponds to the COG mode.

In an embodiment, M=4, when an application mode of the driving circuit is a chip-on-film (COF) mode, the pin output order S1~S4N of the (4*N) pins arranged by the arranging module is: (S1) the (3N+K)-th pin in the fourth row of pins, (S2) the (2N+K)-th pin in the third row of pins, (S3) the (3N+K−1)-th pin in the fourth row of pins, (S4) the (2N+K−1)-th pin in the third row of pins, . . . , the (3N+1)-th pin in the fourth row of pins, the (2N+1)-th pin in the third row of pins, the first pin in the first row of pins, the (N+1)-th pin in the second row of pins, . . . , the N-th pin in the first row of pins, the 2N-th pin in the second row of pins, the 4N-th pin in the fourth row of pins, the 3N-th pin in the third row of pins, . . . , (S4N−1) the (3N+K+1)-th pin in the fourth row of pins, and (S4N) the (2N+K+1)-th pin in the third row of pins, K is a positive integer and 1≤K≤N, so that a distance between two pins having adjacent output order corresponds to the COF mode.

In an embodiment, M=4, when an application mode of the driving circuit is a COF mode, the pin output order S1~S4N of the (4*N) pins arranged by the arranging module is: (S1) the K-th pin in the first row of pins, (S2) the (N+K)-th pin in the second row of pins, (S3) the (K+1)-th pin in the first row of pins, (S4) the (N+K+1)-th pin in the second row of pins, . . . , the 4N-th pin in the fourth row of pins, the 3N-th pin in the third row of pins, . . . , the (3N+1)-th pin in the fourth row of pins, the (2N+1)-th pin in the third row of pins, the first pin in the first row of pins, the (N+1)-th pin in the second row of pins, . . . , (S4N−1) the (K−1)-th pin in the first row of pins, and (S4N) the (N+K−1)-th pin in the second row of pins, K is a positive integer and 1≤K≤N, so that a distance between two pins having adjacent output order corresponds to the COF mode.

In an embodiment, M=4, when the first row of pins, the second row of pins, . . . , and the M-th row of pins are staggered in a first staggering way, a distance between the first pin in the first row of pins and the (2N+1)-th pin in the third row of pins along the first direction<a distance between the first pin in the first row of pins and the (N+1)-th pin in the second row of pins along the first direction<a distance between the first pin in the first row of pins and the (3N+1)-th pin in the fourth row of pins along the first direction.

In an embodiment, M=4, when an application mode of the driving circuit is a COG mode, the pin output order S1~S4N of the (4*N) pins arranged by the arranging module is: (S1) the first pin, (S2) the (N+1)-th pin, (S3) the (2N+1)-th pin, (S4) the (3N+1)-th pin, . . . , (S4N−3) the N-th pin, (S4N−2) the 2N-th pin, (S4N−1) the 3N-th pin, and (S4N) the 4N-th pin, so that a distance between two pins having adjacent output order corresponds to the COG mode.

In an embodiment, M=4, when an application mode of the driving circuit is a COG mode, the pin output order S1~S4N of the (4*N) pins arranged by the arranging module is: (S1) the 4N-th pin, (S2) the 3N-th pin, (S3) the 2N-th pin, (S4) the N-th pin, . . . , (S4N−3) the (3N+1)-th pin, (S4N−2) the (2N+1)-th pin, (S4N−1) the (N+1)-th pin, and (S4N) the first pin, so that a distance between two pins having adjacent output order corresponds to the COG mode.

In an embodiment, M=4, when an application mode of the driving circuit is a COF mode, the pin output order S1~S4N of the (4*N) pins arranged by the arranging module is: (S1) the (3N+K)-th pin in the fourth row of pins, (S2) the (2N+K)-th pin in the third row of pins, (S3) the (3N+K−1)-th pin in the fourth row of pins, (S4) the (2N+K−1)-th pin in the third row of pins, . . . , the (3N+1)-th pin in the fourth row of pins, the (2N+1)-th pin in the third row of pins, the first pin in the first row of pins, the (N+1)-th pin in the second row of pins, . . . , the N-th pin in the first row of pins, the 2N-th pin in the second row of pins, the 4N-th pin in the fourth row of pins, the 3N-th pin in the third row of pins, . . . , (S4N−1) the (3N+K+1)-th pin in the fourth row of pins, and (S4N) the (2N+K+1)-th pin in the third row of pins, K is a positive integer and 1≤K≤N, so that a distance between two pins having adjacent output order corresponds to the COF mode.

In an embodiment, M=4, when an application mode of the driving circuit is a COF mode, the pin output order S1~S4N of the (4*N) pins arranged by the arranging module is: (S1) the K-th pin in the first row of pins, (S2) the (N+K)-th pin in the second row of pins, (S3) the (K+1)-th pin in the first row of pins, (S4) the (N+K+1)-th pin in the second row of pins, . . . , the N-th pin in the first row of pins, the 2N-th pin in the second row of pins, the 4N-th pin in the fourth row of pins, the 3N-th pin in the third row of pins, . . . , the (3N+1)-th pin in the fourth row of pins, the (2N+1)-th pin in the third row of pins, the first pin in the first row of pins, the (N+1)-th pin in the second row of pins, . . . , (S4N−1) the (K−1)-th pin in the first row of pins, and (S4N) the (N+K−1)-th pin in the second row of pins, K is a positive integer and 1≤K≤N, so that a distance between two pins having adjacent output order corresponds to the COF mode.

In an embodiment, M=4, when the first row of pins, the second row of pins, . . . , and the M-th row of pins are staggered in a second staggering way, a distance between the first pin in the first row of pins and the (N+1)-th pin in the second row of pins along the first direction<a distance between the first pin in the first row of pins and the (2N+1)-th pin in the third row of pins along the first direction<a distance between the first pin in the first row of pins and the (3N+1)-th pin in the fourth row of pins along the first direction.

In an embodiment, M=4, when an application mode of the driving circuit is a COG mode, the pin output order S1~S4N of the (4*N) pins arranged by the arranging module is: (S1) the first pin, (S2) the (3N+1)-th pin, (S3) the (N+1)-th pin, (S4) the (2N+1)-th pin, . . . , (S4N−3) the N-th pin, (S4N−2) the 4N-th pin, (S4N−1) the 2N-th pin, and (S4N) the 3N-th pin, so that a distance between two pins having adjacent output order corresponds to the COG mode.

In an embodiment, M=4, when an application mode of the driving circuit is a COG mode, the pin output order S1~S4N of the (4*N) pins arranged by the arranging module is: (S1) the 3N-th pin, (S2) the 2N-th pin, (S3) the 4N-th pin, (S4) the N-th pin, . . . , (S4N−3) the (2N+1)-th pin, (S4N−2) the (N+1)-th pin, (S4N−1) the (3N+1)-th pin, and (S4N) the first pin, so that a distance between two pins having adjacent output order corresponds to the COG mode.

In an embodiment, M=4, when an application mode of the driving circuit is a COF mode, the pin output order S1~S4N of the (4*N) pins arranged by the arranging module is: (S1) the (2N+K)-th pin in the third row of pins, (S2) the (3N+K)-th pin in the fourth row of pins, (S3) the (2N+K−1)-th pin in the third row of pins, (S4) the (3N+K−1)-th pin in the fourth row of pins, . . . , the (2N+1)-th pin in the third row of pins, the first pin in the first row of pins, the (N+1)-th pin in the second row of pins, . . . , the N-th pin in the first row of pins, the 2N-th pin in the second row of pins, the 3N-th pin in the third row of pins, the 4N-th pin in the fourth row of pins, . . . , (S4N−1) the (2N+K+1)-th pin in the third row of pins, and (S4N) the (3N+K+1)-th pin in the fourth row of pins, K is a positive integer and 1≤K≤N, so that a distance between two pins having adjacent output order corresponds to the COF mode.

In an embodiment, M=4, when an application mode of the driving circuit is a COF mode, the pin output order S1~S4N of the (4*N) pins arranged by the arranging module is: (S1) the K-th pin in the first row of pins, (S2) the (N+K)-th pin in the second row of pins, (S3) the (K+1)-th pin in the first row of pins, (S4) the (N+K+1)-th pin in the second row of pins, . . . , the N-th pin in the first row of pins, the 2N-th pin in the second row of pins, the 3N-th pin in the third row of pins, the 4N-th pin in the fourth row of pins, . . . , the (2N+1)-th pin in the third row of pins, the (3N+1)-th pin in the fourth row of pins, the first pin in the first row of pins, the (N+1)-th pin in the second row of pins, . . . , (S4N−1) the (K−1)-th pin in the first row of pins, and (S4N) the (N+K−1)-th pin in the second row of pins, K is a positive integer and 1≤K≤N, so that a distance between two pins having adjacent output order corresponds to the COF mode.

In an embodiment, M=4, when the first row of pins, the second row of pins, . . . , and the M-th row of pins are staggered in a third staggering way, a distance between the first pin in the first row of pins and the (3N+1)-th pin in the fourth row of pins along the first direction<a distance between the first pin in the first row of pins and the (N+1)-th pin in the second row of pins along the first direction<a distance between the first pin in the first row of pins and the (2N+1)-th pin in the third row of pins along the first direction.

In an embodiment, M=4, when an application mode of the driving circuit is a COG mode, the pin output order S1~S4N of the (4*N) pins arranged by the arranging module is: (S1) the first pin, (S2) the (N+1)-th pin, (S3) the (2N+1)-th pin, (S4) the (3N+1)-th pin, . . . , (S4N−3) the N-th pin, (S4N−2) the 2N-th pin, (S4N−1) the 3N-th pin, and (S4N) the 4N-th pin, so that a distance between two pins having adjacent output order corresponds to the COG mode.

In an embodiment, M=4, when an application mode of the driving circuit is a COG mode, the pin output order S1~S4N of the (4*N) pins arranged by the arranging module is: (S1) the 4N-th pin, (S2) the 3N-th pin, (S3) the 2N-th pin, (S4) the N-th pin, . . . , (S4N−3) the (3N+1)-th pin, (S4N−2) the (2N+1)-th pin, (S4N−1) the (N+1)-th pin, and (S4N) the first pin, so that a distance between two pins having adjacent output order corresponds to the COG mode.

In an embodiment, M=4, when an application mode of the driving circuit is a COF mode, the pin output order S1~S4N of the (4*N) pins arranged by the arranging module is: (S1) the (2N+K)-th pin in the third row of pins, (S2) the (3N+K)-th pin in the fourth row of pins, (S3) the (2N+K−1)-th pin in the third row of pins, (S4) the (3N+K−1)-th pin in the fourth row of pins, . . . , the (2N+1)-th pin in the third row of pins, the (3N+1)-th pin in the fourth row of pins, the first pin in the first row of pins, the (N+1)-th pin in the second row of pins, . . . , the N-th pin in the first row of pins, the 2N-th pin in the second row of pins, the 3N-th pin in the third row of pins, the 4N-th pin in the fourth row of pins, . . . , (S4N−1) the (2N+K+1)-th pin in the third row of pins, and (S4N) the (3N+K+1)-th pin in the fourth row of pins, K is a positive integer and so that a distance between two pins having adjacent output order corresponds to the COF mode.

In an embodiment, M=4, when an application mode of the driving circuit is a COF mode, the pin output order S1~S4N of the (4*N) pins arranged by the arranging module is: (S1) the K-th pin in the first row of pins, (S2) the (N+K)-th pin in the second row of pins, (S3) the (K+1)-th pin in the first row of pins, (S4) the (N+K+1)-th pin in the second row of pins, . . . , the N-th pin in the first row of pins, the 2N-th pin in the second row of pins, the 3N-th pin in the third row of pins, the 4N-th pin in the fourth row of pins, . . . , the (2N+1)-th pin in the third row of pins, the (3N+1)-th pin in the fourth row of pins, the first pin in the first row of pins, the (N+1)-th pin in the second row of pins, . . . , (S4N−1) the (K−1)-th pin in the first row of pins, and (S4N) the (N+K−1)-th pin in the second row of pins, K is a positive integer and 1≤K≤N, so that a distance between two pins having adjacent output order corresponds to the COF mode.

In an embodiment, M=4, when the first row of pins, the second row of pins, . . . , and the M-th row of pins are staggered in a second staggering way, a distance between the first pin in the first row of pins and the (N+1)-th pin in the second row of pins along the first direction<a distance between the first pin in the first row of pins and the (2N+1)-th pin in the third row of pins along the first direction<a distance between the first pin in the first row of pins and the (3N+1)-th pin in the fourth row of pins along the first direction.

Another preferred embodiment of the invention is a pin output order arranging method. In this embodiment, the pin output order arranging method is applied to a driving circuit. The driving circuit includes (M*N) pins. The (M*N) pins include a first pin, a second pin, . . . , and a (M*N)-th pin. The pin output order arranging method includes steps of: (a) arranging the first pin, the second pin, . . . , and an N-th pin of the (M*N) pins along a first direction in a specific distance spaced to form a first row of pins, arranging a (N+1)-th pin, a (N+2)-th pin, . . . , and an 2N-th pin of the (M*N) pins along the first direction in the specific distance spaced to form a second row of pins, . . . , and arranging a [(M−1)*N+1]-th pin, a [(M−1)*N+2]-th pin, . . . , and a (M*N)-th pin of the (M*N) pins along the first direction in the specific distance spaced to form a M-th row of pins respectively, so that the first row of pins, the second row of pins, . . . , and the M-th row of pins are staggered along a second direction in a staggering way or an aligning way, and M and N are integers larger than 1; and (b) correspondingly arranging a pin output order S1~SMN of the (M*N) pins according to different application modes of the driving circuit.

Compared to the prior art, a driving circuit and a pin output order arranging method of the invention can randomly arrange the output order of all pins of the driving IC according to different applications of the driving IC, so that the pins of the driving circuit of the invention can be used in COG and COF products at the same time without increasing the pitch of the pins. Therefore, the drawbacks such as larger size and higher cost of the conventional driving IC can be effectively solved by the driving circuit and the pin output order arranging method of the invention and the application range of the driving IC can be also broadened.

The advantage and spirit of the invention may be understood by the following detailed descriptions together with the appended drawings.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3B-1 and FIG. 3B-2 illustrate schematic diagrams of the pin output order of FIG. 3A applied to the driving circuit.

FIG. 4B-1 and FIG. 4B-2 illustrate schematic diagrams of the pin output order of FIG. 4A applied to the driving circuit.

FIG. 5B-1 and FIG. 5B-2 illustrate schematic diagrams of the pin output order of FIG. 5A applied to the driving circuit.

FIG. 6B-1 and FIG. 6B-2 illustrate schematic diagrams of the pin output order of FIG. 6A applied to the driving circuit.

FIG. 7B-1 and FIG. 7B-2 illustrate schematic diagrams of the pin output order of FIG. 7A applied to the driving circuit.

DETAILED DESCRIPTION

A preferred embodiment of the invention is a driving circuit having a pin output order arranging function capable of being used in COG and COF products at the same time without larger size and higher cost.

Figure 1:
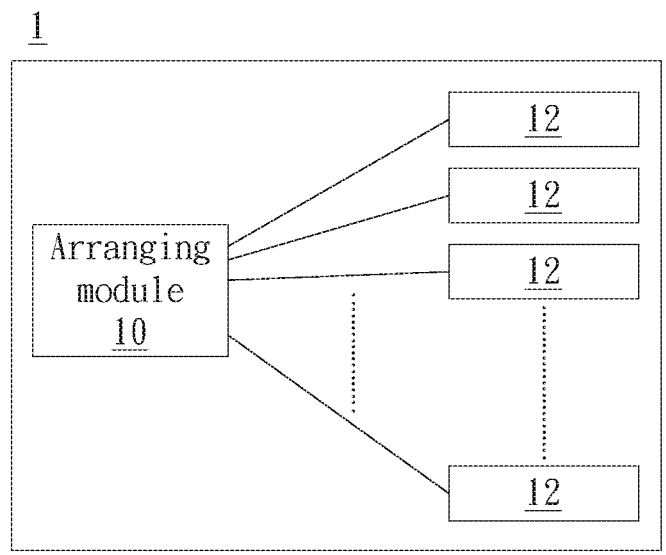
FIG. 1 illustrates a functional block diagram of the driving circuit in a preferred embodiment of the invention.

Please refer to FIG. 1. FIG. 1 illustrates a functional block diagram of the driving circuit in a preferred embodiment of the invention. As shown in FIG. 1, the driving circuit 1 includes an arranging module 10 and a plurality of pins 12. The arranging module 10 is coupled to the plurality of pins 12. The arranging module 10 will correspondingly arrange a pin output order of the plurality of pins 12 according to different application modes of the driving circuit 1.

In practical applications, it is assumed that the plurality of pins 12 includes (M*N) pins. The (M*N) pins include a first pin P1, a second pin P2, ..., a N-th pin PN, a (N+1)-th pin P(N+1), a (N+2)-th pin P(N+2), ..., a 2N-th pin P2N, ..., a [(M−1)*N+1] pin P[(M−1)*N+1], a [(M−1)*N+2] pin P[(M−1)*N+2], ..., and a (M*N)-th pin P(M*N). M and N are positive integers larger than 1. The first pin P1, the second pin P2, ..., and an N-th pin PN of the (M*N) pins are arranged along a first direction (e.g., the horizontal direction) in a specific distance (e.g., 44 um) spaced to form a first row of pins; a (N+1)-th pin P(N+1), a (N+2)-th pin P(N+2), ..., and an 2N-th pin P2N of the (M*N) pins are arranged along the first direction in the specific distance spaced to form a second row of pins, ..., and a [(M−1)*N+1]-th pin P[(M−1)*N+1], a [(M−1)*N+2]-th pin P[(M−1)*N+2], ..., and a (M*N)-th pin P(M*N) of the (M*N) pins are arranged along the first direction in the specific distance spaced to form a M-th row of pins.

It should be noticed that the first row of pins, the second row of pins, ..., and the M-th row of pins can be staggered along a second direction (e.g., the vertical direction) in a staggering way or an aligning way. In other words, the arrangement of different rows of pins along the second direction can be staggered or aligned without any limitations. In fact, each row of pins can use different staggering ways to arranged in the specific distance spaced based on practical needs without any limitations and not limited by the following embodiments of the invention.

For convenience of explanation, it is assumed that M=4 in the following embodiments; in fact, M can be any positive inter larger than 2, such as 2, 3, 5, ..., but not limited to this.

Figure 2:
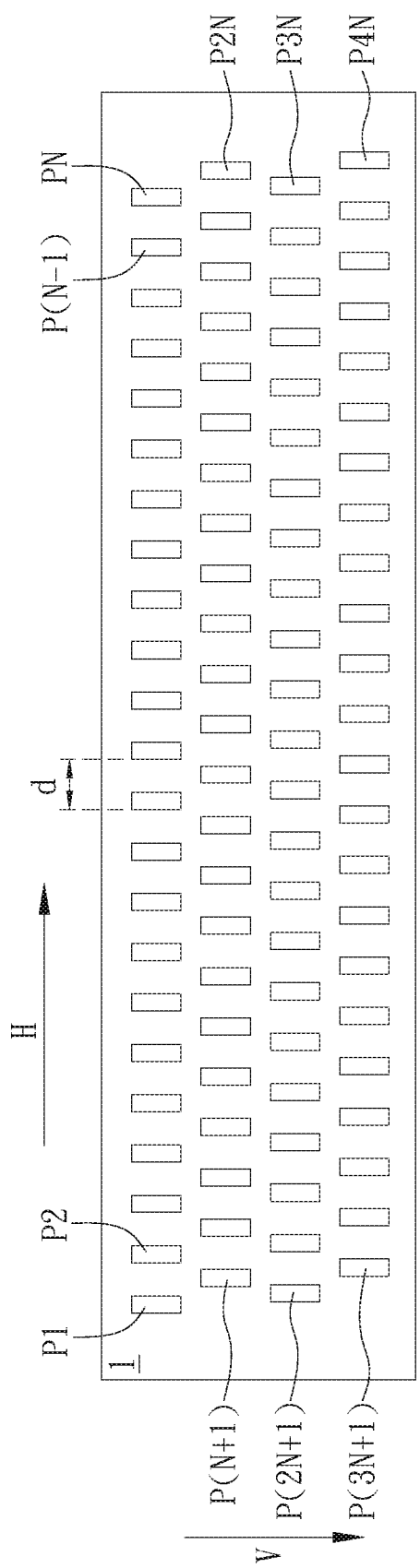
FIG. 2 illustrates a first possible arrangement of the pins in the driving circuit of the invention.

Please refer to FIG. 2. FIG. 2 illustrates a first possible arrangement of the pins in the driving circuit of the invention. As shown in FIG. 2, since M=4, the driving circuit 1 has 4N pins and the 4N pins are arranged along the horizontal direction H in a specific distance spaced to form four rows of pins. Wherein, the first pin P1, the second pin P2, ..., and the N pin PN are arranged to form a first row of pins; the (N+1) pin P(N+1), the (N+2) pin P(N+2), ..., and the 2N pin P2N are arranged to form a second row of pins; the (2N+1) pin P(2N+1), the (2N+2) pin P(2N+2), ..., and the 3N pin P3N are arranged to form a third row of pins; the (3N+1) pin P(3N+1), the (3N+2) pin P(3N+2), ..., and the 4N pin P4N are arranged to form a fourth row of pins. It should be noticed that the first row of pins, the second row of pins, the third row of pins, and the fourth row of pins are staggered along the vertical direction V in a first staggering way; in other words, the arrangement of different rows of pins along the vertical direction V is staggered instead of being aligned.

In a first staggering way shown in FIG. 2, a distance between the first pin P1 and the second pin P2 of the first row of pins along the first direction (the horizontal direction H) is equal to the specific distance d; a distance between the first pin P1 of the first row of pins and the (N+1) pin P(N+1) of the second row of pins along the first direction is d/2; a distance between the first pin P1 of the first row of pins and the (2N+1) pin P(2N+1) of the third row of pins along the first direction is d/4; a distance between the first pin P1 of the first row of pins and the (3N+1) pin P(3N+1) of the fourth row of pins along the first direction is 3d/4. That is to say, along the first direction, the first staggering way has the following arranging order: the first pin P1 of the first row of pins, the (2N+1) pin P(2N+1) of the third row of pins, the (N+1) pin P(N+1) of the second row of pins, and the (3N+1) pin P(3N+1) of the fourth row of pins, but not limited to this.

Then, a first embodiment~a fifth embodiment are used to introduce different pin output orders of the pins of the driving circuit 1 when the driving circuit 1 has the first pin arranging way shown in FIG. 2 to be suitable for both COG and COF products.

Figure 3A:
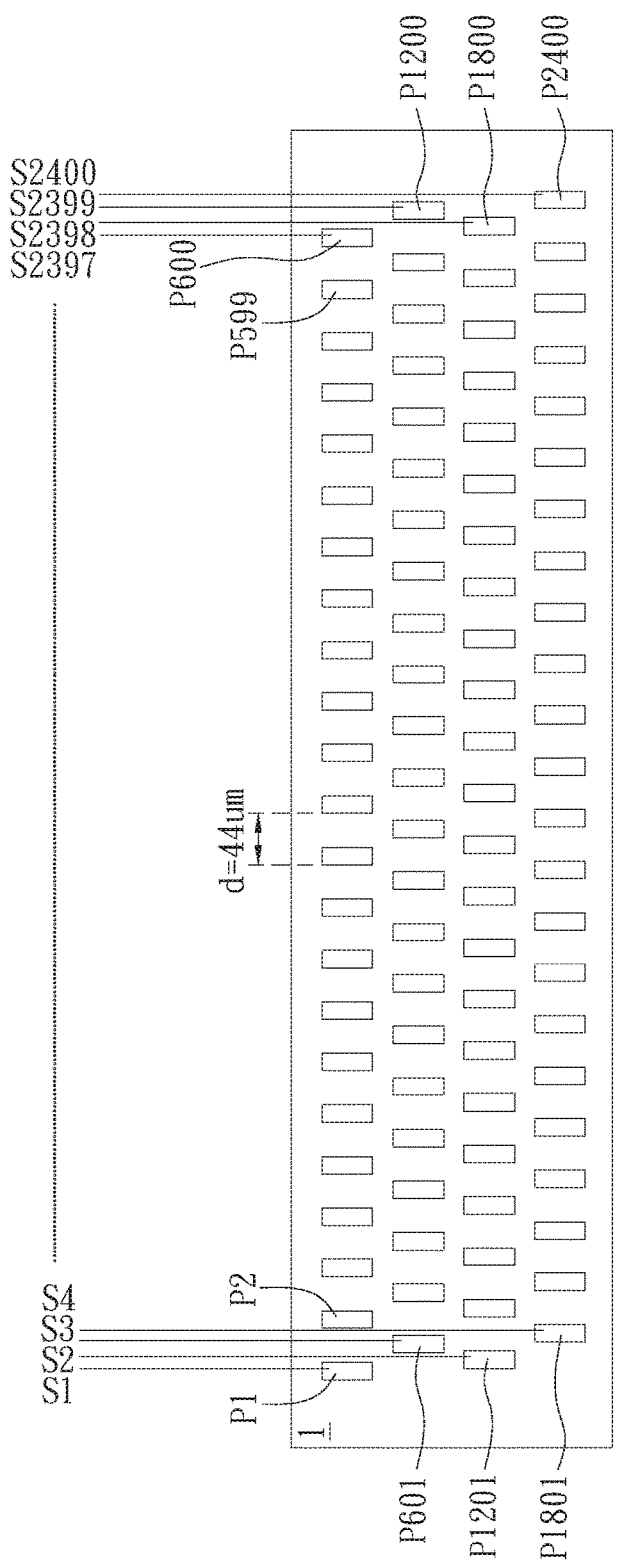
FIG. 3A illustrates a first embodiment of the pin output order arranged in the invention for the COG mode.
Figure 3B:
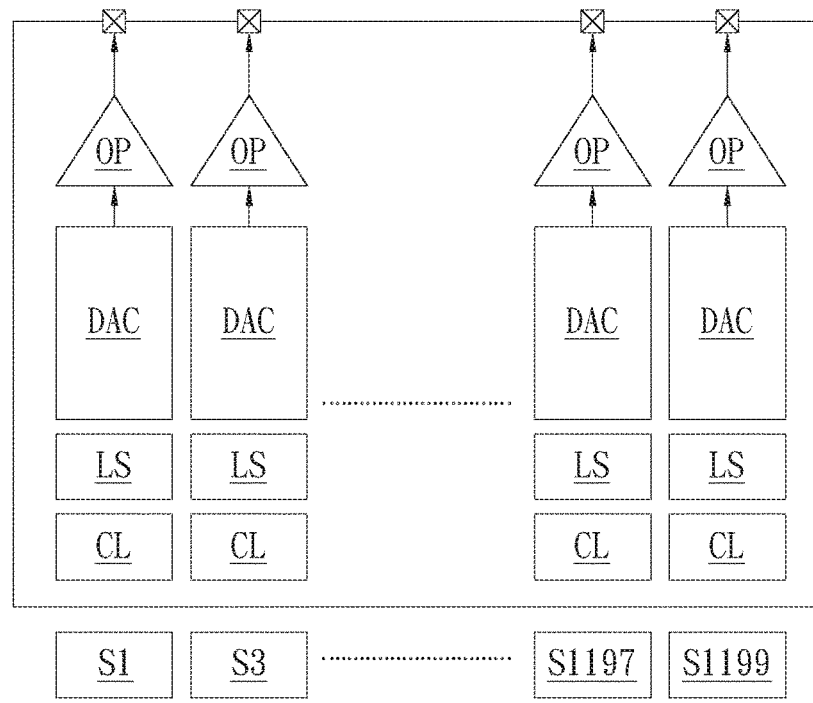
Figure 1:
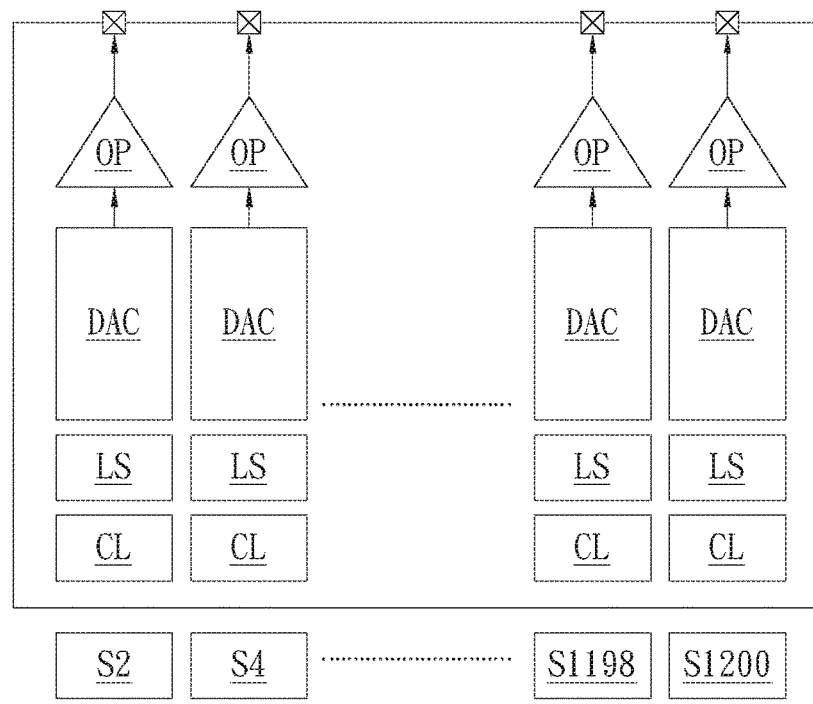
Figure 3B:
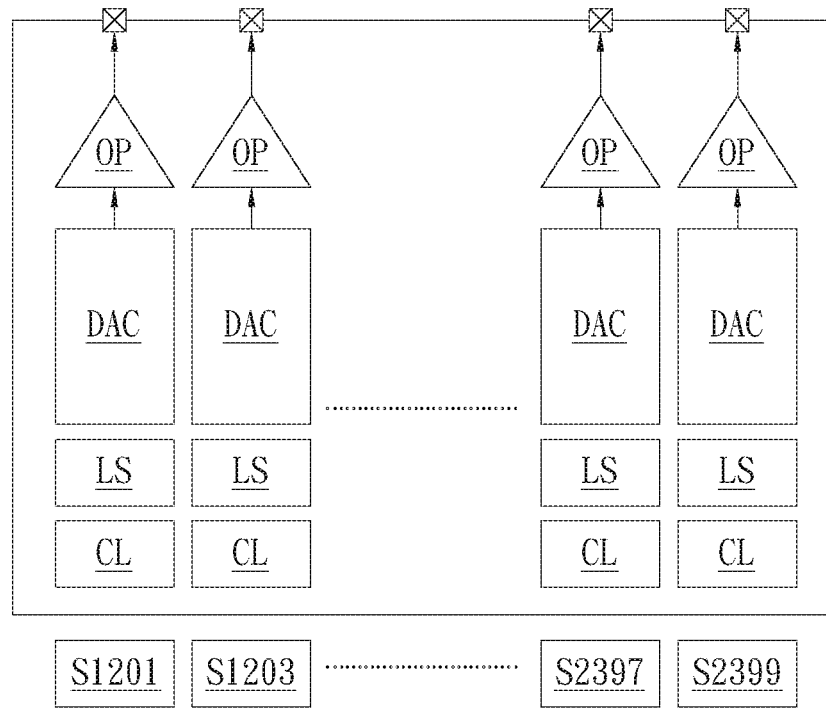
Figure 2:
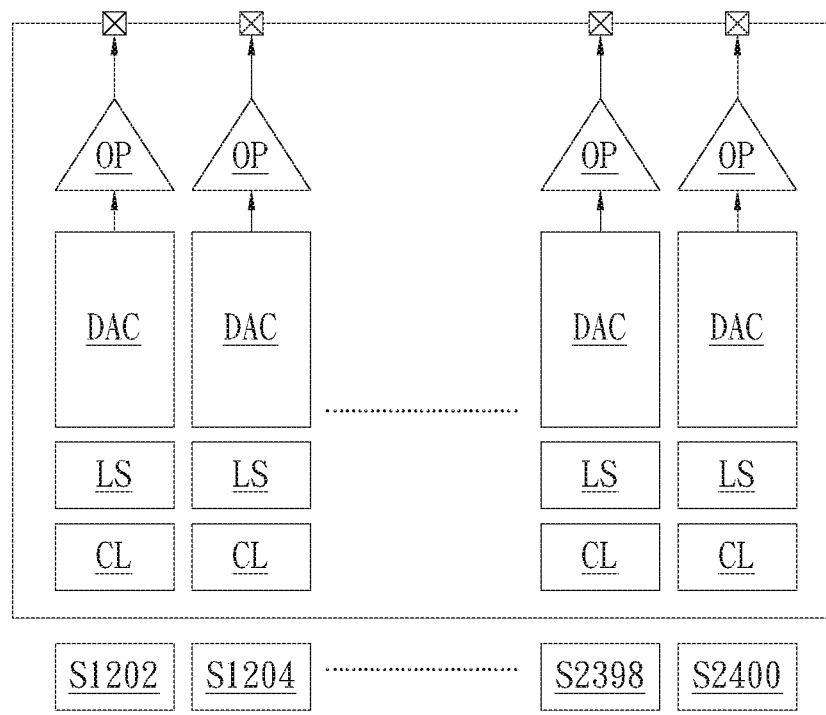

Please refer to FIG. 3A, FIG. 3B-1, and FIG. 3B-2. FIG. 3A illustrates a first embodiment of the pin output order arranged in the invention for the COG mode; FIG. 3B-1 and FIG. 3B-2 illustrate schematic diagrams of the pin output order of FIG. 3A applied to the driving circuit. In this embodiment, when an application mode of the driving circuit is a COG mode, the pin output order S1~S4N of the 4N pins arranged by the arranging module 10 is: (S1) the first pin P1 of the first row of pins, (S2) the (2N+1)-th pin P(2N+1) of the third row of pins, (S3) the (N+1)-th pin P(N+1) of the second row of pins, (S4) the (3N+1)-th pin P(3N+1) of the fourth row of pins, ..., (S4N−3) the N-th pin PN of the first row of pins, (S4N−2) the 3N-th pin P3N of the third row of pins, (S4N−1) the 2N-th pin P2N of the second row of pins, and (S4N) the 4N-th pin P4N of the fourth row of pins, so that a distance between any two pins having adjacent output order is d/4 which is suitable for the COG products having a pitch of d/4.

For example, if the number of pins is 2400, M=4 and N=600, and the specific distance d=44 um, then the distance between the first pin P1 of the first row of pins and the 1201th pin P1201 of the third row of pins having adjacent output orders S1 and S2 is d/4=11 um, and the distance between the 1200th pin P1200 of the second row of pins and the 2400th pin P2400 of the fourth row of pins having adjacent output orders S2399 and S2400 is also d/4=11 um. Therefore, the pin pitch requirement of the COG products can be met.

FIG. 3B-1 shows the outputted signals of the pin output orders S1, S3, ..., S1199 in the upper-left part of FIG. 3A and the pin output orders S2, S4, ..., S1200 in the lower-left part of FIG. 3A processed by data latches CL, level shifters LS, digital-to-analog converters DAC, operational amplifiers OP of different channels respectively and then outputted. FIG. 3B-2 shows the outputted signals of the pin output orders S1201, S1203, ..., S2399 in the upper-right part of FIG. 3A and the pin output orders S1202, S1204, ..., S2400 in the lower-right part of FIG. 3A processed by data latches CL, level shifters LS, digital-to-analog converters DAC, operational amplifiers OP of different channels respectively and then outputted.

Figure 4A:
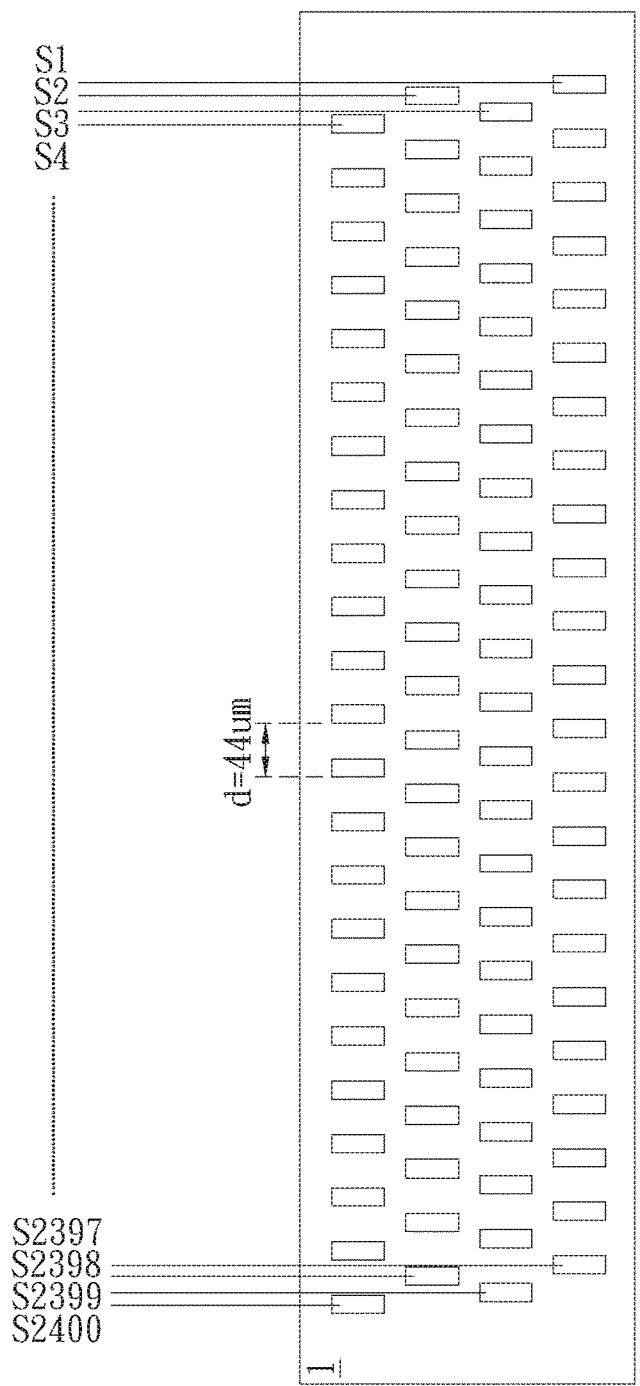
FIG. 4A illustrates a second embodiment of the pin output order arranged in the invention for the COG mode.
Figure 4B:
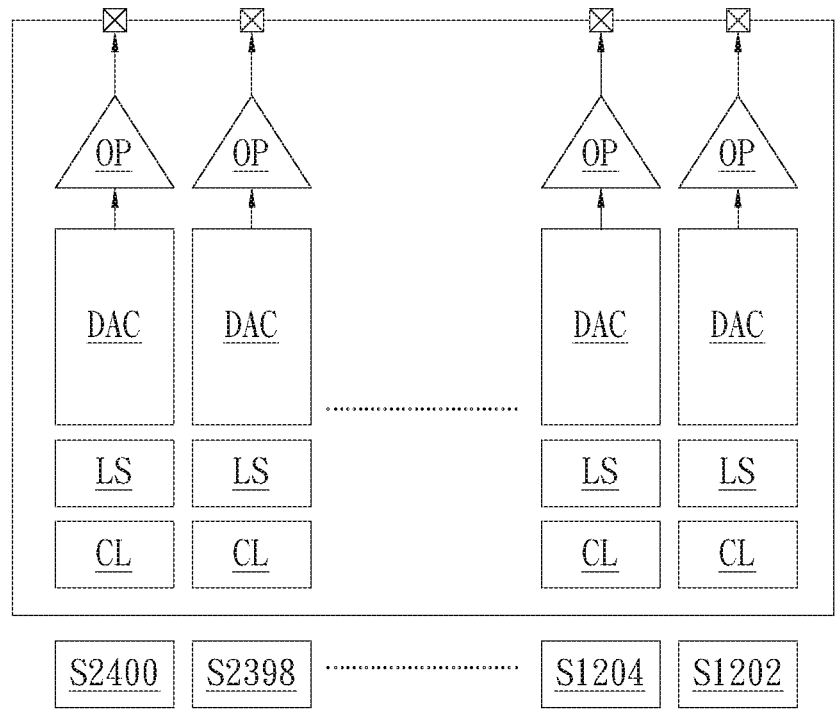
Figure 1:
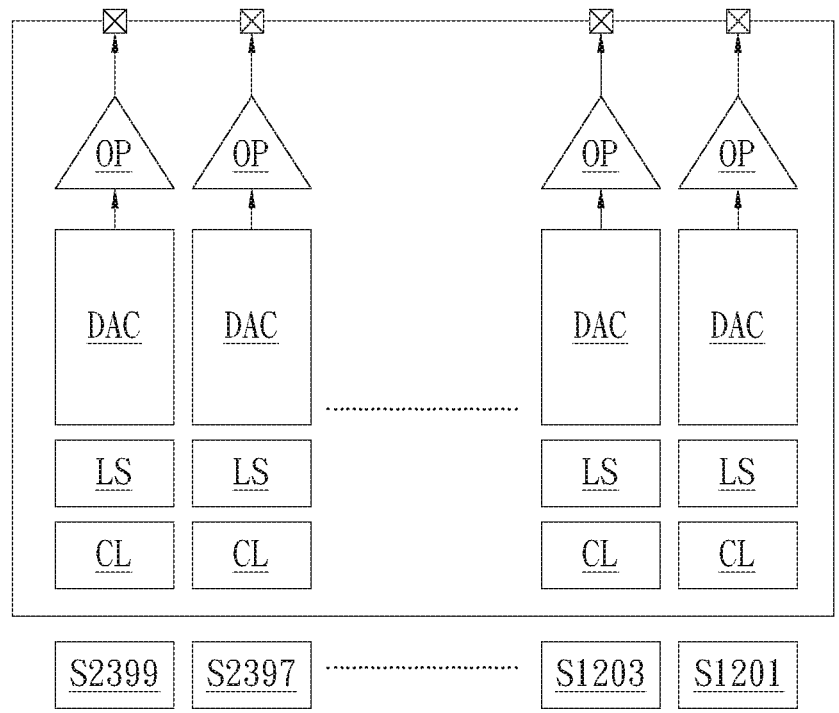
Figure 4B:
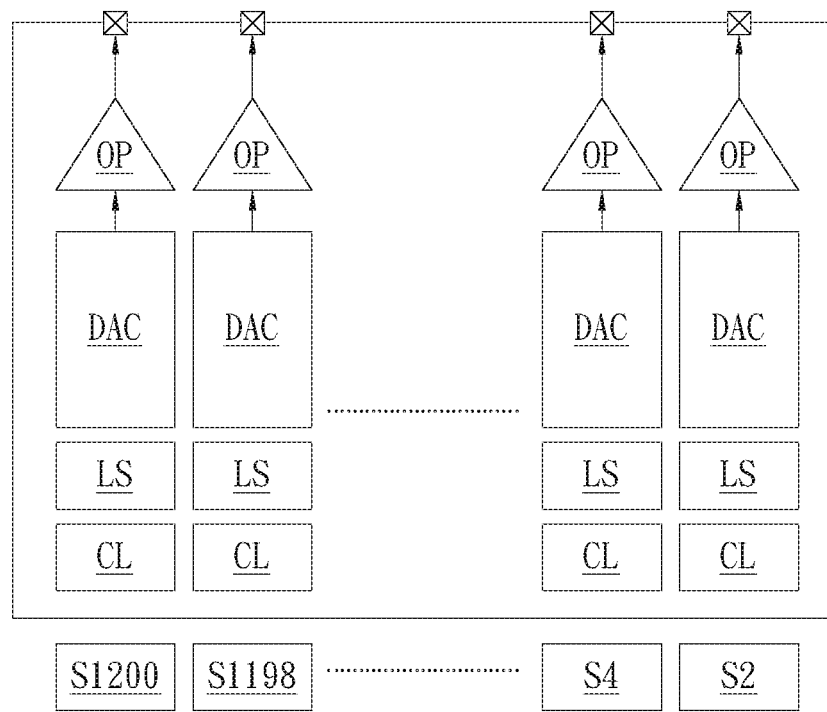
Figure 2:
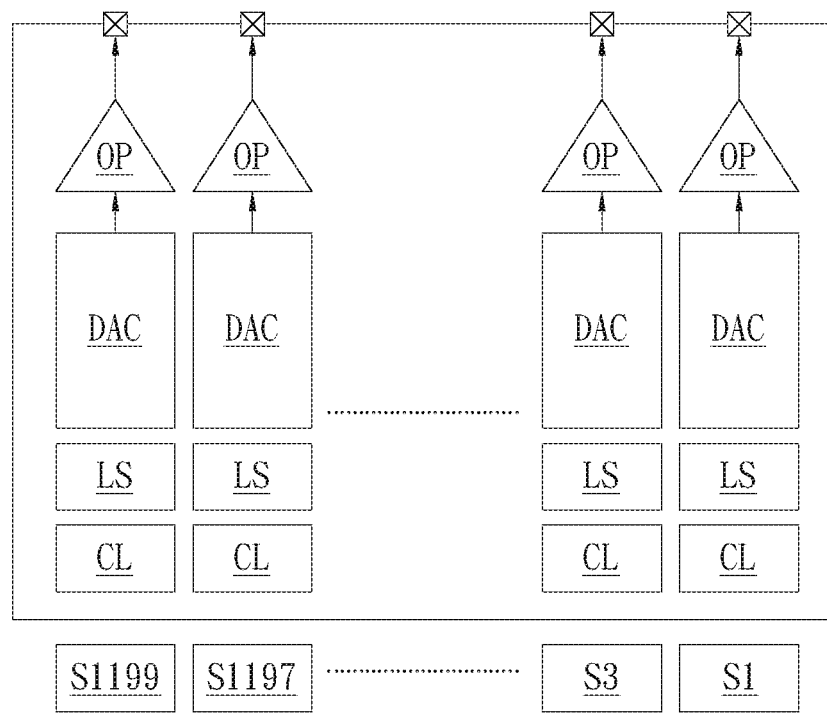

Please refer to FIG. 4A, FIG. 4B-1, and FIG. 4B-2. FIG. 4A illustrates a second embodiment of the pin output order arranged in the invention for the COG mode; FIG. 4B-1 and FIG. 4B-2 illustrate schematic diagrams of the pin output order of FIG. 4A applied to the driving circuit. In this embodiment, when an application mode of the driving circuit is a COG mode, the pin output order S1-54N of the 4N pins arranged by the arranging module 10 is: (S1) the 4N-th pin P4N of the fourth row of pins, (S2) the 2N-th pin P2N of the second row of pins, (S3) the 3N-th pin P3N of the third row of pins, (S4) the N-th pin PN of the first row of pins, . . . , (S4N−3) the (3N+1)-th pin P(3N+1) of the fourth row of pins, (S4N−2) the (N+1)-th pin P(N+1) of the second row of pins, (S4N−1) the (2N+1)-th pin P(2N+1) of the third row of pins, and (S4N) the first pin P1 of the first row of pins, so that a distance between any two pins having adjacent output order is d/4 which is suitable for the COG products having a pitch of d/4.

For example, if the number of pins is 2400, M=4 and N=600, and the specific distance d=44 um, then the distance between the 2400th pin P2400 of the fourth row of pins and the 1200th pin P1200 of the second row of pins having adjacent output orders S1 and S2 is d/4=11 um. Therefore, the pin pitch requirement of the COG products can be met.

FIG. 4B-1 shows the outputted signals of the pin output orders S2400, S2398, . . . , S1202 in the upper-left part of FIG. 4A and the pin output orders S2399, S2397, . . . , S1201 in the lower-left part of FIG. 4A processed by data latches CL, level shifters LS, digital-to-analog converters DAC, operational amplifiers OP of different channels respectively and then outputted. FIG. 4B-2 shows the outputted signals of the pin output orders S1200, S1198, . . . , S2 in the upper-right part of FIG. 4A and the pin output orders S1199, S1197, . . . , S1 in the lower-right part of FIG. 4A processed by data latches CL, level shifters LS, digital-to-analog converters DAC, operational amplifiers OP of different channels respectively and then outputted.

Figure 5A:
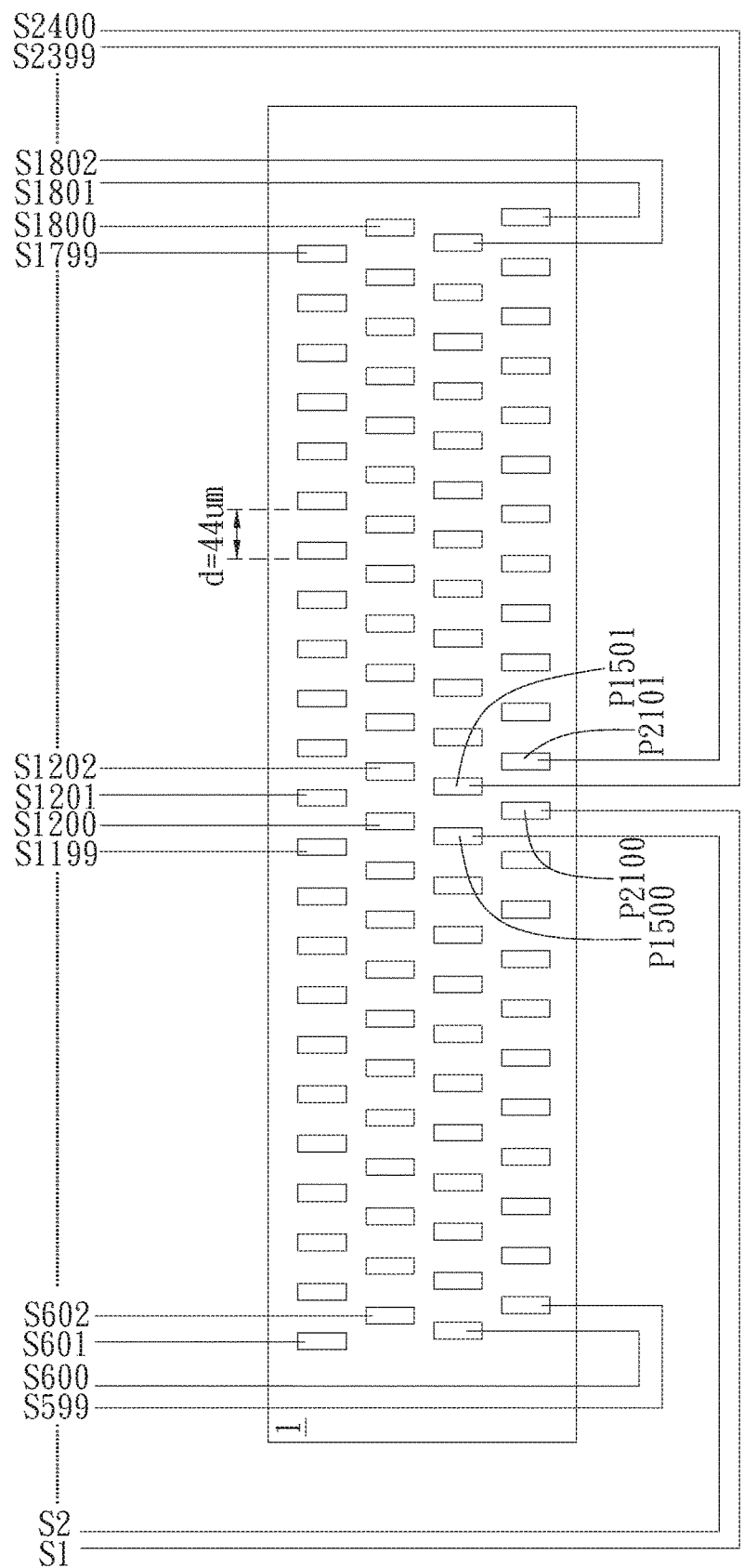
FIG. 5A illustrates a third embodiment of the pin output order arranged in the invention for the COF mode.
Figure 5B:
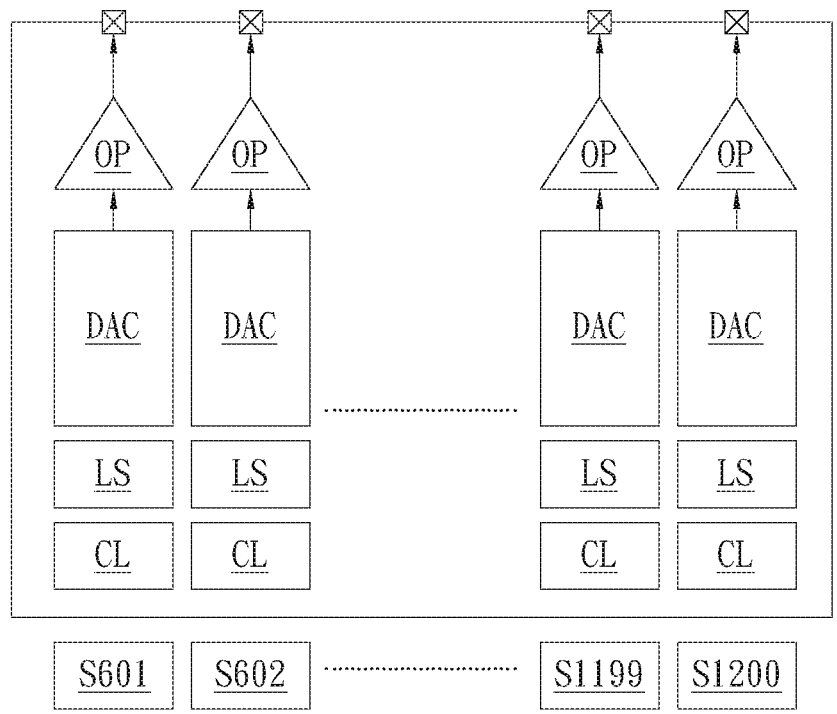
Figure 1:
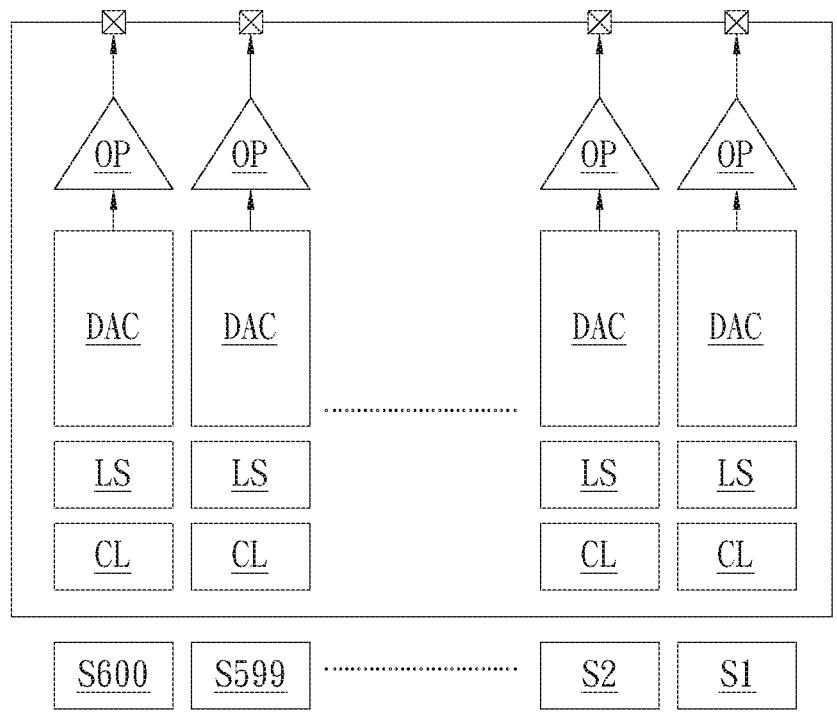
Figure 5B:
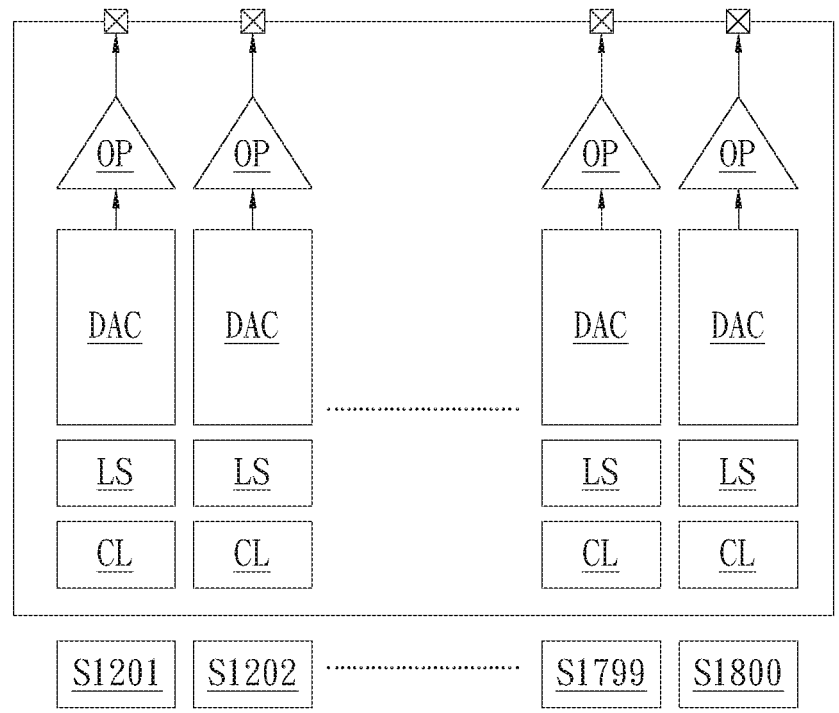
Figure 2:
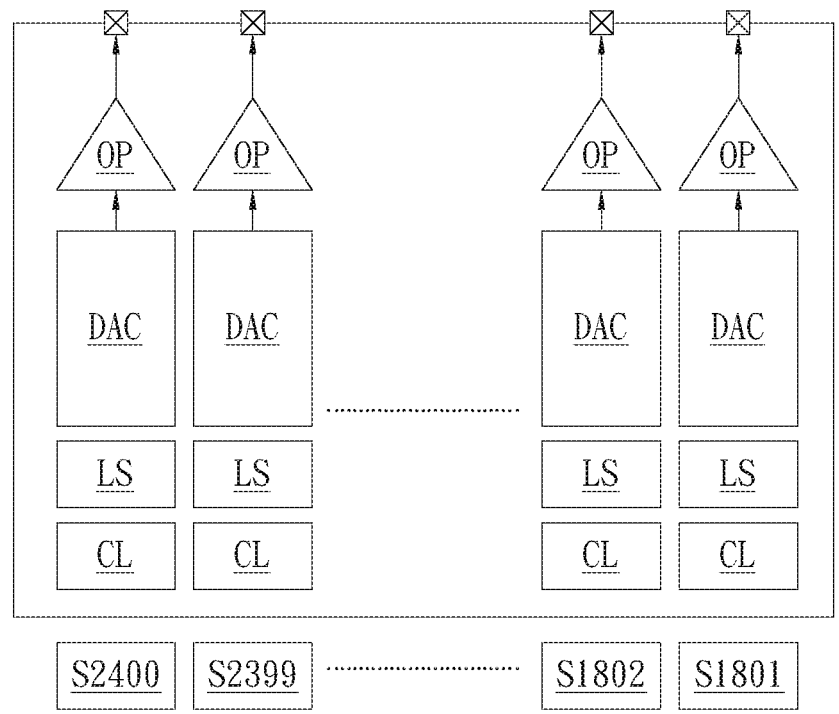

Please refer to FIG. 5A, FIG. 5B-1, and FIG. 5B-2. FIG. 5A illustrates a third embodiment of the pin output order arranged in the invention for the COF mode; FIG. 5B-1 and FIG. 5B-2 illustrate schematic diagrams of the pin output order of FIG. 5A applied to the driving circuit. In this embodiment, when an application mode of the driving circuit is a COF mode, the pin output order S1~S4N of the 4N pins arranged by the arranging module 10 is: (S1) the (3N+K)-th pin P(3N+K) of the fourth row of pins, (S2) the (2N+K)-th pin P(2N+K) of the third row of pins, (S3) the (3N+K−1)-th pin P(3N+K−1) of the fourth row of pins, (S4) the (2N+K−1)-th pin P(2N+K−1) of the third row of pins, . . . , the (3N+1)-th pin P(3N+1) of the fourth row of pins, the (2N+1)-th pin P(2N+1) of the third row of pins, the first pin P1 of the first row of pins, the (N+1)-th pin P(N+1) of the second row of pins, . . . , the N-th pin PN of the first row of pins, the 2N-th pin P2N of the second row of pins, the 4N-th pin P4N of the fourth row of pins, the 3N-th pin P3N of the third row of pins, . . . , (S4N−1) the (3N+K+1)-th pin P(3N+K+1) of the fourth row of pins, and (S4N) the (2N+K+1)-th pin P(2N+K+1) of the third row of pins, K is a positive integer and 1≤K≤N, so that a distance between any two pins having adjacent output order is d/2 which is suitable for the COF products having a pitch of d/2.

For example, if the number of pins is 2400, M=4 and N=600, and the specific distance d=44 um, when K=300, the distance between the 2100th pin P2100 of the fourth row of pins and the 1500th pin P1500 of the third row of pins having adjacent output orders S1 and S2 is d/2=22 um, the distance between the 2101th pin P2101 of the fourth row of pins and the 1501th pin P1501 of the third row of pins having adjacent output orders S2399 and S2400 is d/2=22 um. Therefore, the pin pitch requirement of the COF products can be met.

FIG. 5B-1 shows the outputted signals of the pin output orders S601, S602, . . . , S1200 in the upper-left part of FIG. 5A and the pin output orders S600, S599, . . . , 51 in the lower-left part of FIG. 5A processed by data latches CL, level shifters LS, digital-to-analog converters OP, operational amplifiers OP of different channels respectively and then outputted. FIG. 5B-2 shows the outputted signals of the pin output orders S1201, S1202, . . . , S1800 in the upper-right part of FIG. 5A and the pin output orders S2400, S2399, . . . , S1801 in the lower-right part of FIG. 5A processed by data latches CL, level shifters LS, digital-to-analog converters DAC, operational amplifiers OP of different channels respectively and then outputted.

Figure 6A:
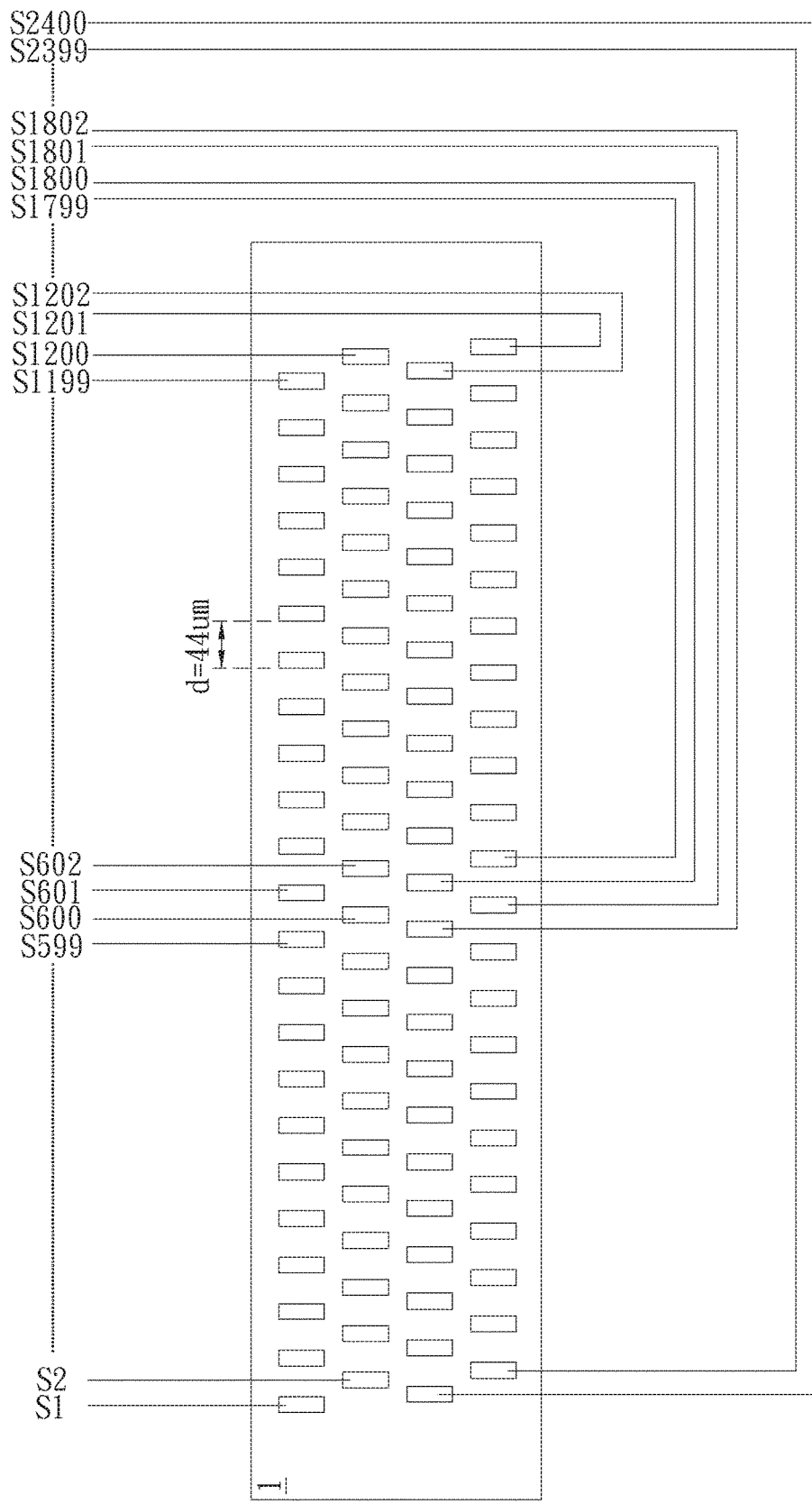
FIG. 6A illustrates a fourth embodiment of the pin output order arranged in the invention for the COF mode.
Figure 6B:
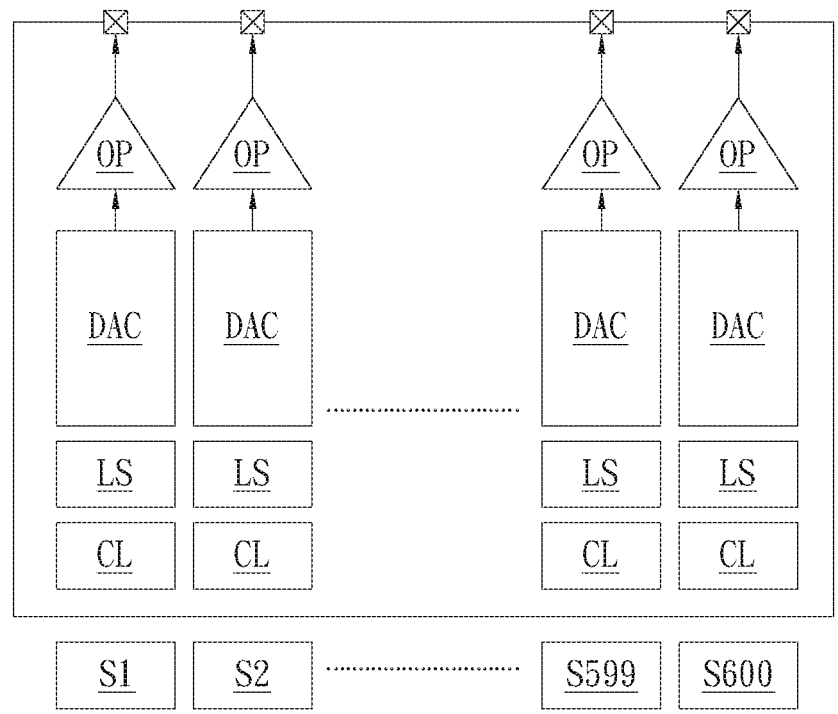
Figure 1:
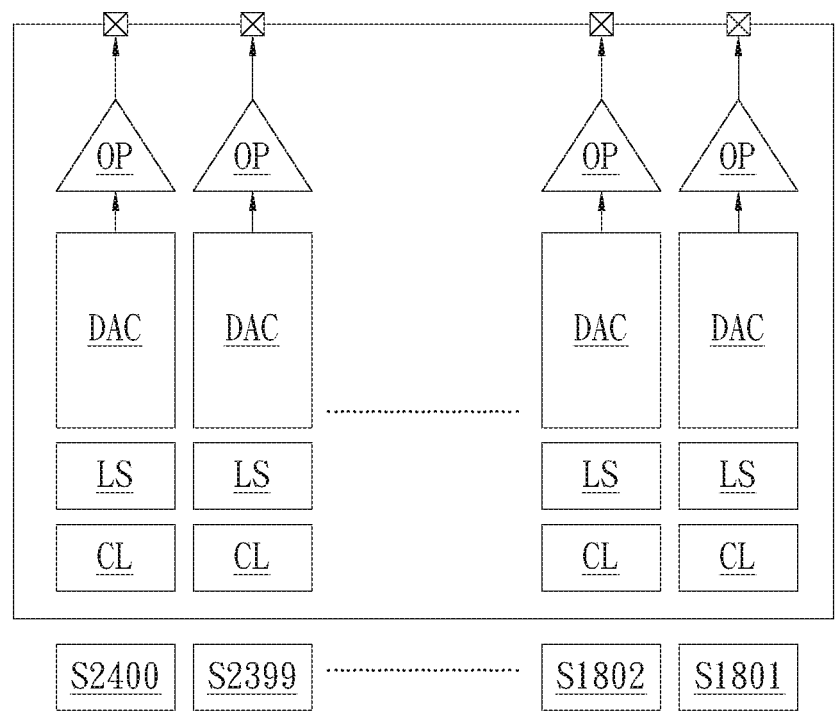
Figure 6B:
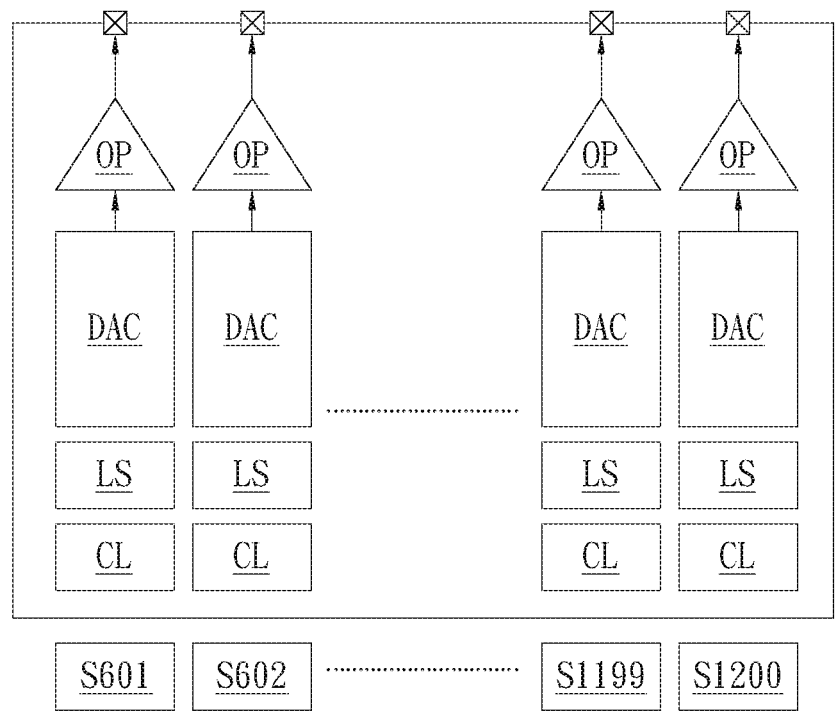
Figure 2:
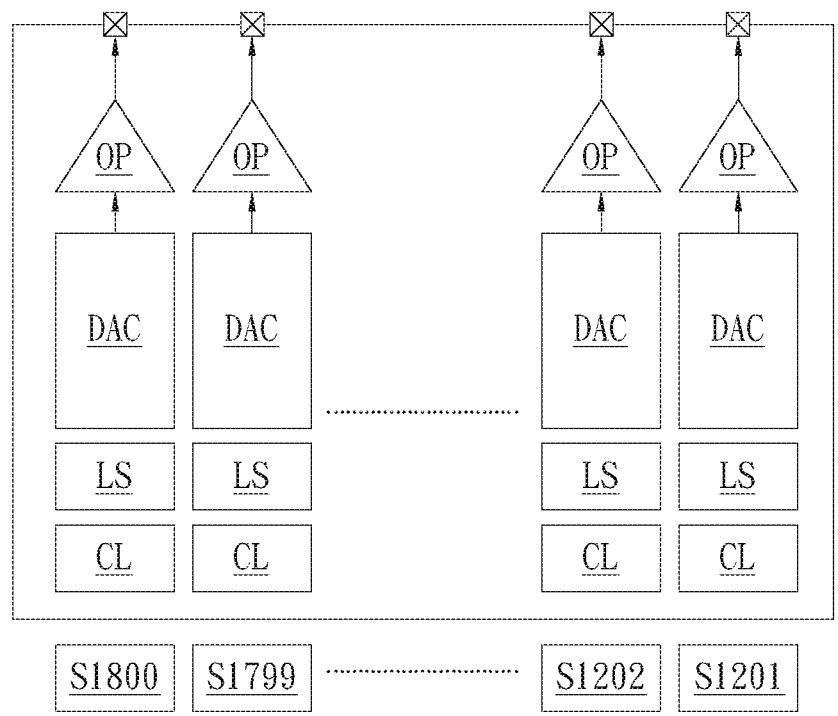

Please refer to FIG. 6A, FIG. 6B-1, and FIG. 6B-2. FIG. 6A illustrates a fourth embodiment of the pin output order arranged in the invention for the COF mode; FIG. 6B-1 and FIG. 6B-2 illustrate schematic diagrams of the pin output order of FIG. 6A applied to the driving circuit. In this embodiment, when an application mode of the driving circuit is a COF mode, the pin output order S1~S4N of the 4N pins arranged by the arranging module 10 is: (S1) the K-th pin PK of the first row of pins, (S2) the (N+K)-th pin P(N+K) of the second row of pins, (S3) the (K+1)-th pin P(K+1) of the first row of pins, (S4) the (N+K+1)-th pin P(N+K+1) of the second row of pins, . . . , the N-th pin PN of the first row of pins, the 2N-th pin P2N of the second row of pins, the 4N-th pin P4N of the fourth row of pins, the 3N-th pin P3N of the third row of pins, . . . , the (3N+1)-th pin P(3N+1) of the fourth row of pins, the (2N+1)-th pin P(2N+1) of the third row of pins, the first pin P1 of the first row of pins, the (N+1)-th pin P(N+1) of the second row of pins, . . . , (S4N−1) the (K−1)-th pin P(K−1) of the first row of pins, and (S4N) the (N+K−1)-th pin P(N+K−1) of the second row of pins, K is a positive integer and 1≤K≤N, so that a distance between any two pins having adjacent output order is d/2 which is suitable for the COF products having a pitch of d/2.

For example, if the number of pins is 2400, M=4 and N=600, and the specific distance d=44 um, when K=1, the distance between the first pin P1 of the first row of pins and the 601th pin P601 of the second row of pins having adjacent output orders 51 and S2 is d/2=22 um. Therefore, the pin pitch requirement of the COF products can be met.

FIG. 6B-1 shows the outputted signals of the pin output orders 51, S2, . . . , S600 in the upper-left part of FIG. 6A and the pin output orders S2400, S2399, . . . , S1800 in the lower-left part of FIG. 6A processed by data latches CL, level shifters LS, digital-to-analog converters DAC, operational amplifiers OP of different channels respectively and then outputted. FIG. 6B-2 shows the outputted signals of the pin output orders S601, S602, . . . , S1200 in the upper-right part of FIG. 6A and the pin output orders S1800, S1799, . . . , S1201 in the lower-right part of FIG. 6A processed by data latches CL, level shifters LS, digital-to-analog converters DAC, operational amplifiers OP of different channels respectively and then outputted.

Figure 7A:
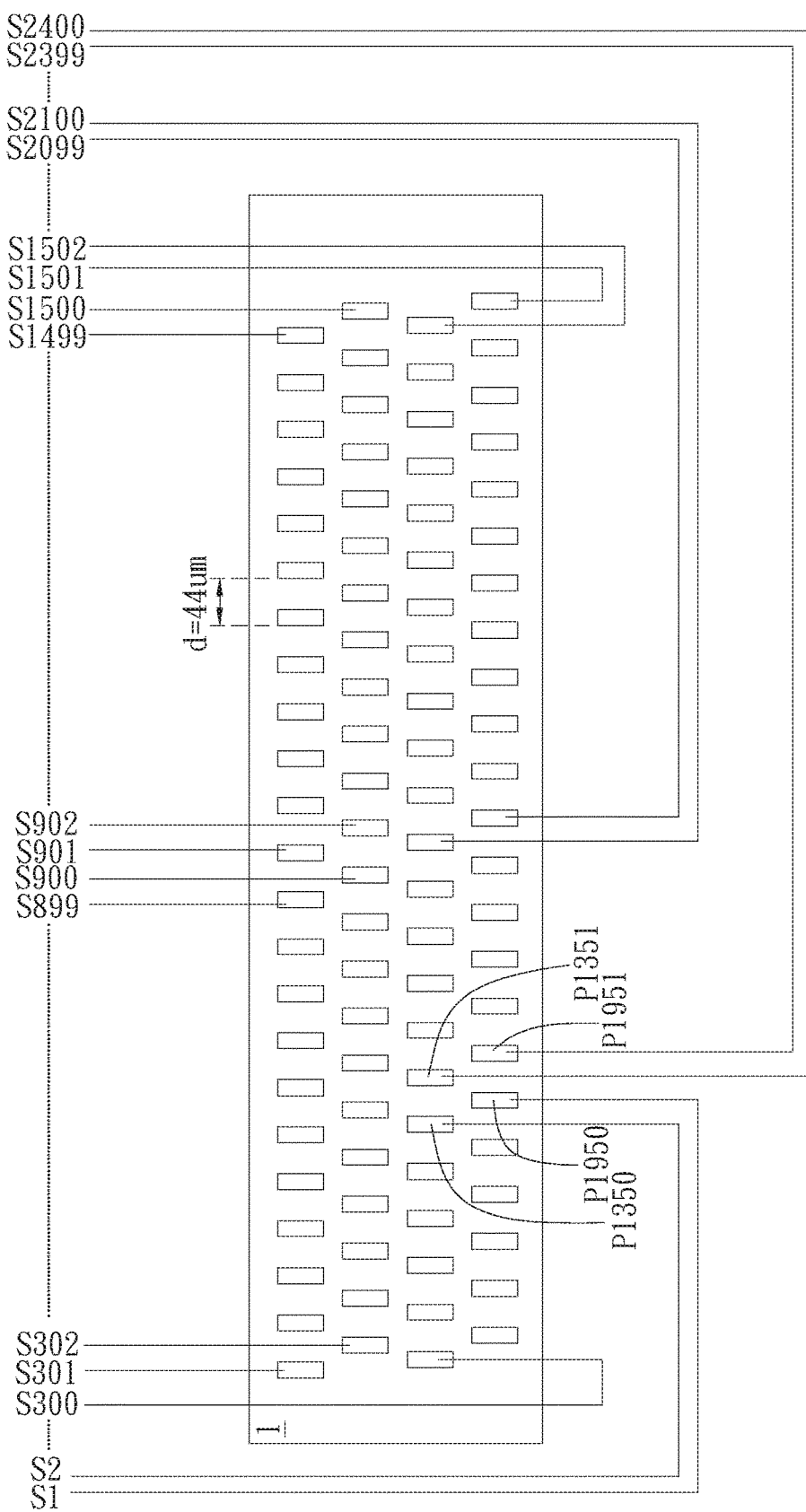
FIG. 7A illustrates a fifth embodiment of the pin output order arranged in the invention for the COF mode.
Figures 1, 7B:
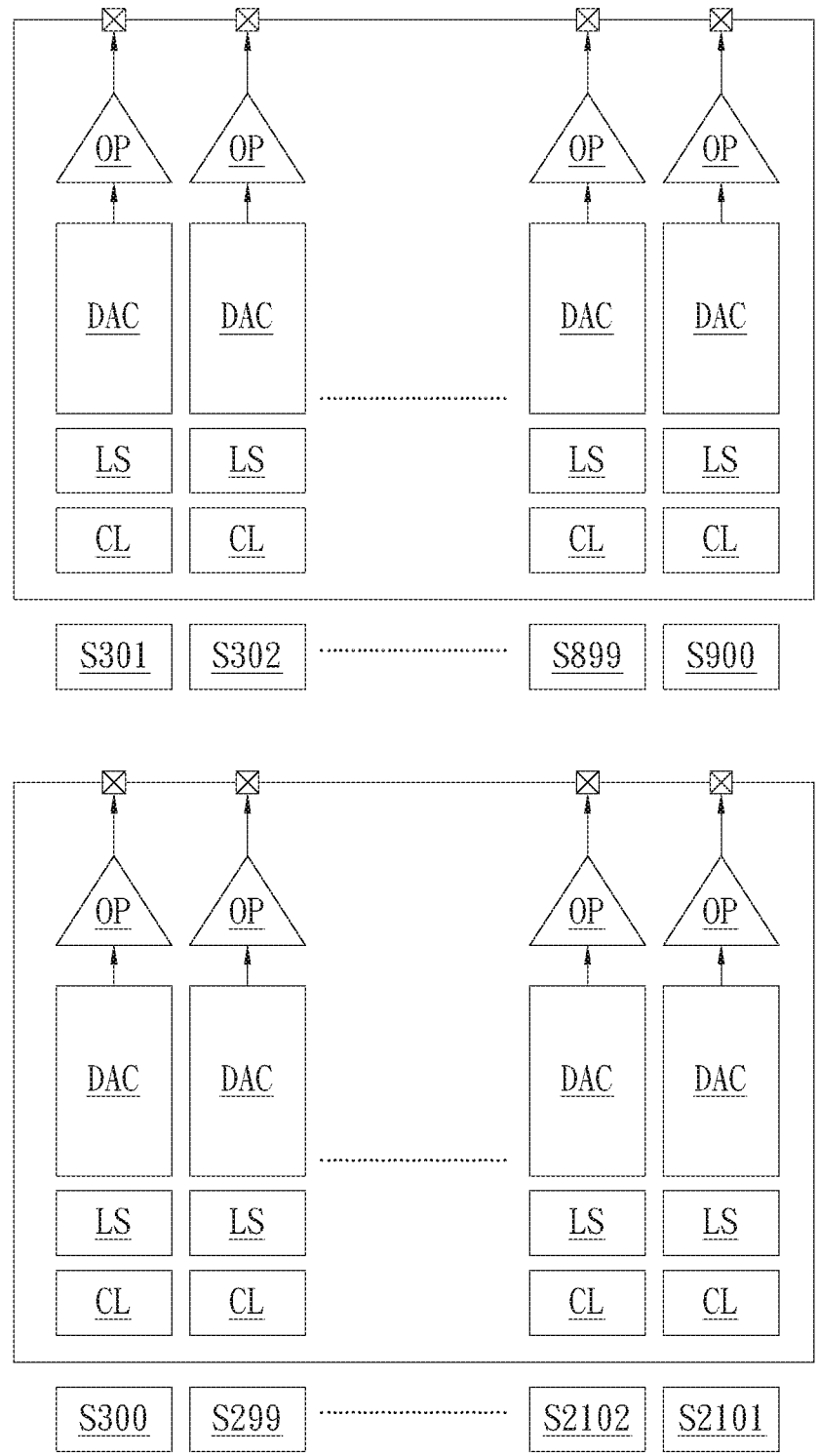
Figure 7B:
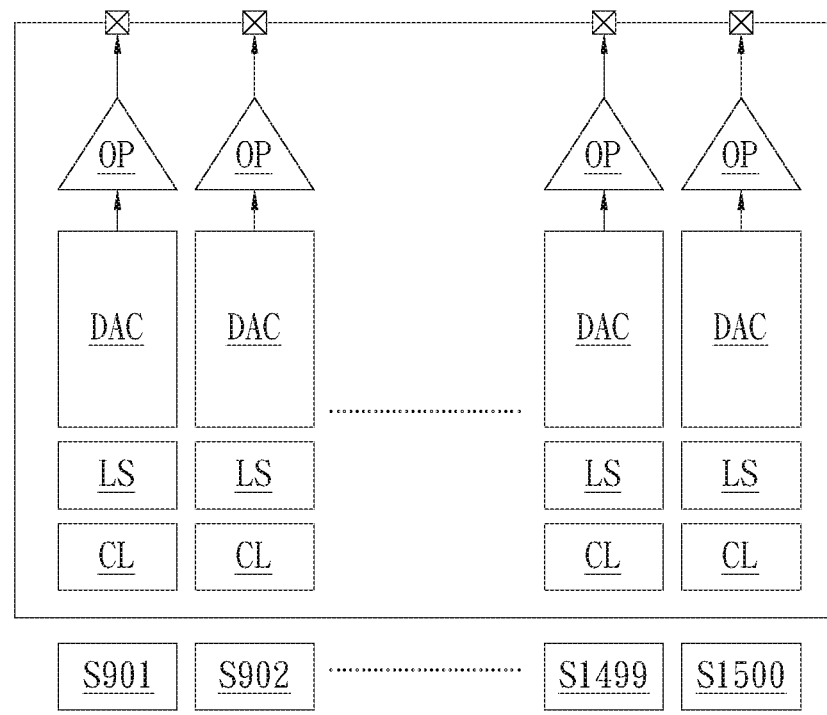
Figure 2:
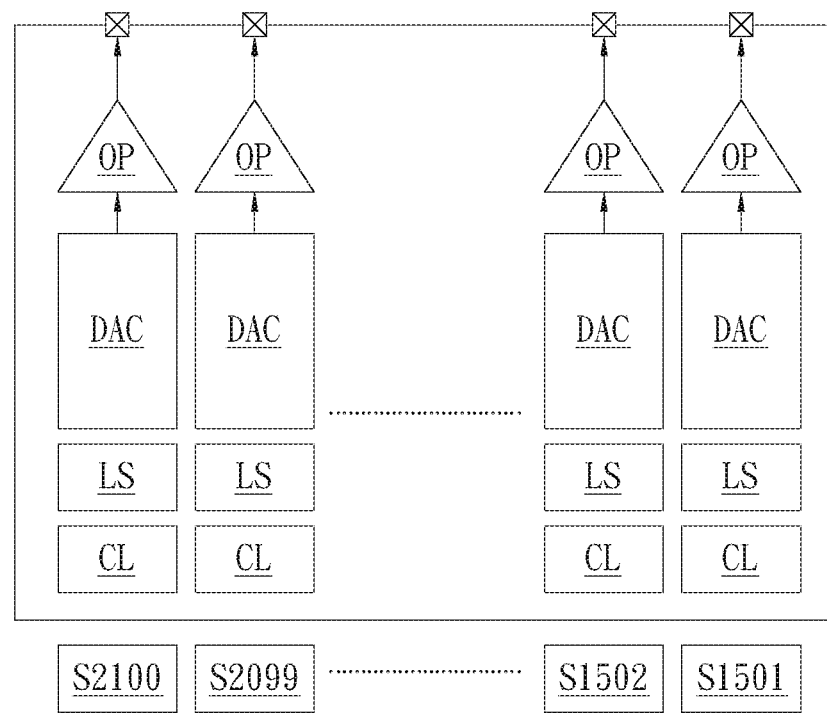

Please refer to FIG. 7A, FIG. 7B-1, and FIG. 7B-2. FIG. 7A illustrates a fifth embodiment of the pin output order arranged in the invention for the COF mode; FIG. 7B-1 and FIG. 7B-2 illustrate schematic diagrams of the pin output order of FIG. 7A applied to the driving circuit. In this embodiment, when an application mode of the driving circuit is a COF mode, the pin output order S1~S4N of the 4N pins arranged by the arranging module 10 is: (S1) the (3N+K)-th pin P(3N+K) of the fourth row of pins, (S2) the (2N+K)-th pin P(2N+K) of the third row of pins, (S3) the (3N+K−1)-th pin P(3N+K−1) of the fourth row of pins, (S4) the (2N+K−1)-th pin P(2N+K−1) of the third row of pins, . . . , the (3N+1)-th pin P(3N+1) of the fourth row of pins, the (2N+1)-th pin P(2N+1) of the third row of pins, the first pin P1 of the first row of pins, the (N+1)-th pin P(N+1) of the second row of pins, . . . , the N-th pin PN of the first row of pins, the 2N-th pin P2N of the second row of pins, the 4N-th pin P4N of the fourth row of pins, the 3N-th pin P3N of the third row of pins, . . . , (S4N−1) the (3N+K+1)-th pin P(3N+K+1) of the fourth row of pins, and (S4N) the (2N+K+1)-th pin P(2N+K+1) of the third row of pins, K is a positive integer and 1≤K≤N, so that a distance between any two pins having adjacent output order is d/2 which is suitable for the COF products having a pitch of d/2.

For example, if the number of pins is 2400, M=4 and N=600, and the specific distance d=44 um, when K=150, the distance between the 1950th pin P1950 of the fourth row of pins and the 1350th pin P1350 of the third row of pins having adjacent output orders S1 and S2 is d/2=22 um, the distance between the 1951th pin P1951 of the fourth row of pins and the 1351th pin P1351 of the third row of pins having adjacent output orders S2399 and S2400 is d/2=22 um. Therefore, the pin pitch requirement of the COF products can be met.

FIG. 7B-1 shows the outputted signals of the pin output orders S301, S302, . . . , S900 in the upper-left part of FIG. 7A and the pin output orders S300, S299, . . . , S1, S2400, . . . , S2100 in the lower-left part of FIG. 7A processed by data latches CL, level shifters LS, digital-to-analog converters DAC, operational amplifiers OP of different channels respectively and then outputted. FIG. 7B-2 shows the outputted signals of the pin output orders S901, S902, . . . , S1500 in the upper-right part of FIG. 7A and the pin output orders S2100, S2099, . . . , S1501 in the lower-right part of FIG. 7A processed by data latches CL, level shifters LS, digital-to-analog converters DAC, operational amplifiers OP of different channels respectively and then outputted.

Then, another possible arranging way of the pins in the driving circuit of the invention will be introduced.

Figure 8:
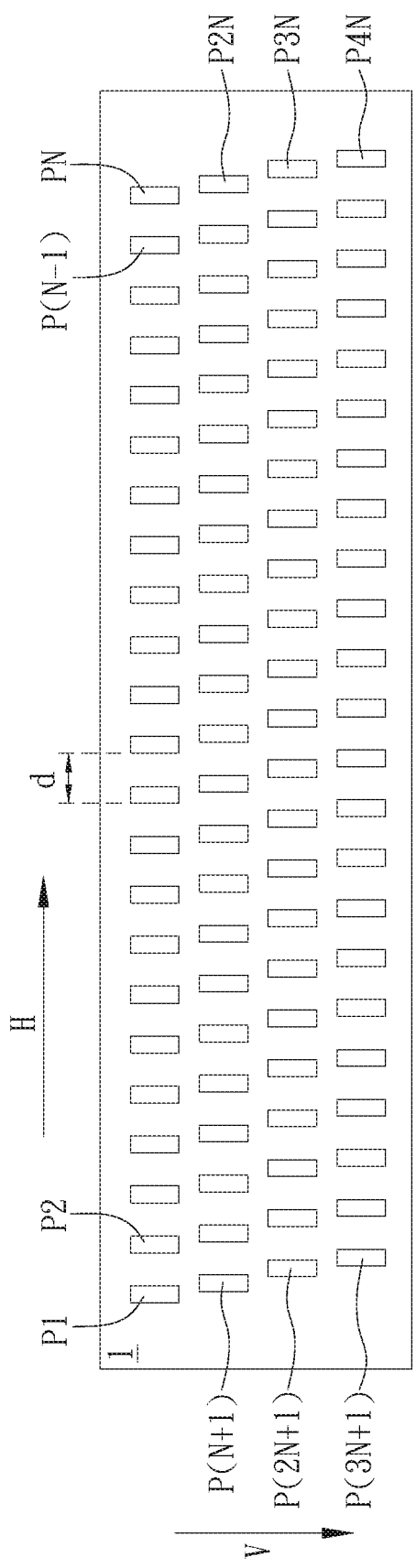
FIG. 8 illustrates a second possible arrangement of the pins in the driving circuit of the invention.

Please refer to FIG. 8. FIG. 8 illustrates a second possible arrangement of the pins in the driving circuit of the invention. As shown in FIG. 8, since M=4, the driving circuit 1 has 4N pins and the 4N pins are arranged along the horizontal direction H in a specific distance spaced to form four rows of pins. Wherein, the first pin P1, the second pin P2, . . . , and the N pin PN are arranged to form a first row of pins; the (N+1) pin P(N+1), the (N+2) pin P(N+2), . . . , and the 2N pin P2N are arranged to form a second row of pins; the (2N+1) pin P(2N+1), the (2N+2) pin P(2N+2), . . . , and the 3N pin P3N are arranged to form a third row of pins; the (3N+1) pin P(3N+1), the (3N+2) pin P(3N+2), . . . , and the 4N pin P4N are arranged to form a fourth row of pins. It should be noticed that the first row of pins, the second row of pins, the third row of pins, and the fourth row of pins are staggered along the vertical direction V in a second staggering way; in other words, the arrangement of different rows of pins along the vertical direction V is staggered instead of being aligned.

In a second staggering way shown in FIG. 8, a distance between the first pin P1 and the second pin P2 of the first row of pins along the first direction (the horizontal direction H) is equal to the specific distance d; a distance between the first pin P1 of the first row of pins and the (N+1) pin P(N+1) of the second row of pins along the first direction is d/4; a distance between the first pin P1 of the first row of pins and the (2N+1) pin P(2N+1) of the third row of pins along the first direction is d/2; a distance between the first pin P1 of the first row of pins and the (3N+1) pin P(3N+1) of the fourth row of pins along the first direction is 3d/4. That is to say, along the first direction, the second staggering way has the following arranging order: the first pin P1 of the first row of pins, the (N+1) pin P(N+1) of the second row of pins, the (2N+1) pin P(2N+1) of the third row of pins, and the (3N+1) pin P(3N+1) of the fourth row of pins, but not limited to this.

Then, a sixth embodiment~a tenth embodiment are used to introduce different pin output orders of the pins of the driving circuit 1 when the driving circuit 1 has the second pin arranging way shown in FIG. 8 to be suitable for both COG and COF products.

Figure 9:
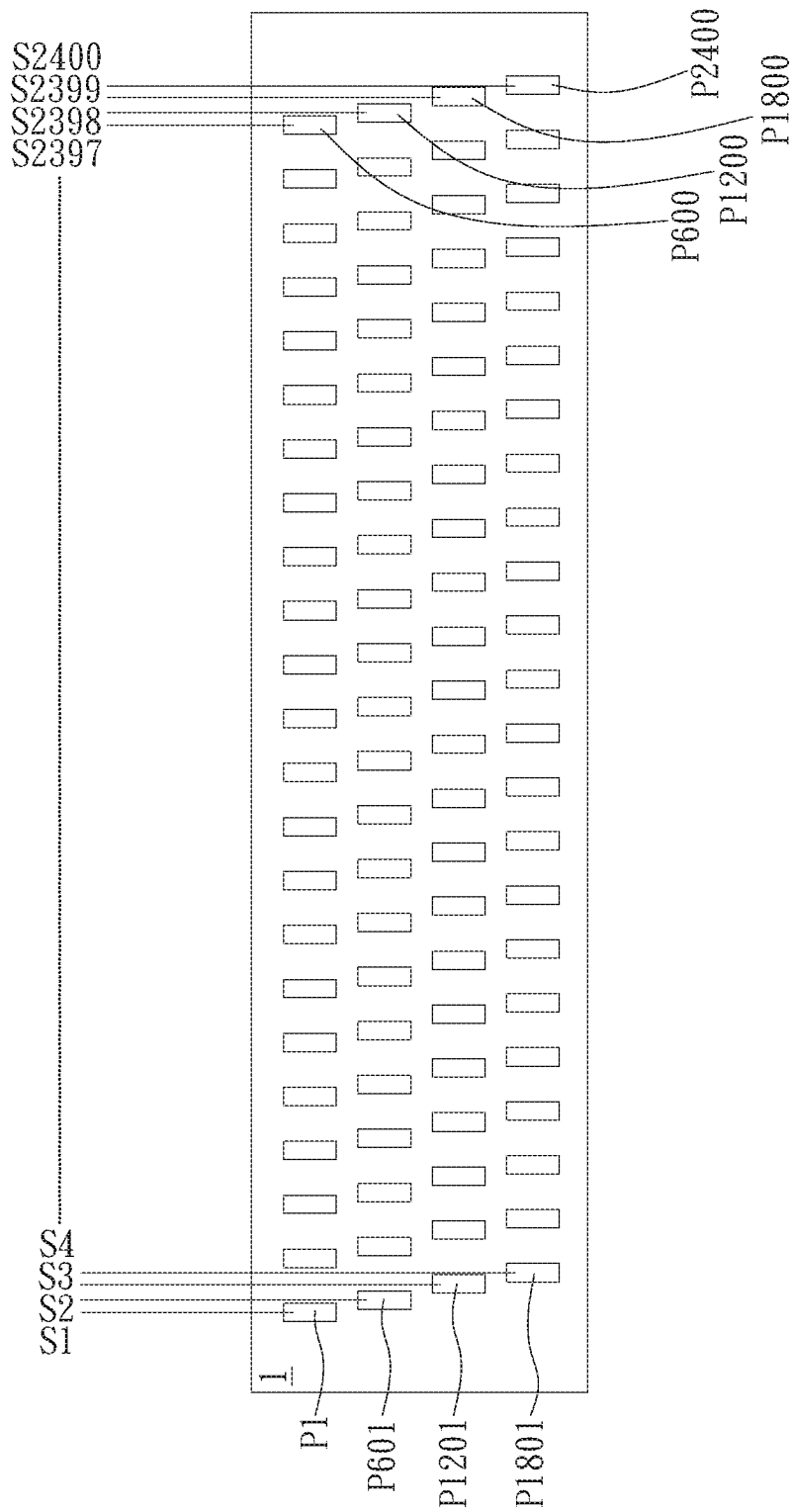
FIG. 9 illustrates a sixth embodiment of the pin output order arranged in the invention for the COG mode.

Please refer to FIG. 9. FIG. 9 illustrates a sixth embodiment of the pin output order arranged in the invention for the COG mode. In this embodiment, when an application mode of the driving circuit is a COG mode, the pin output order S1~S4N of the 4N pins arranged by the arranging module 10 is: (S1) the first pin P1 of the first row of pins, (S2) the (N+1)-th pin P(N+1) of the second row of pins, (S3) the (2N+1)-th pin P(2N+1) of the third row of pins, (S4) the (3N+1)-th pin P(3N+1) of the fourth row of pins, . . . , (S4N−3) the N-th pin PN of the first row of pins, (S4N−2) the 2N-th pin P2N of the second row of pins, (S4N−1) the 3N-th pin P3N of the third row of pins, and (S4N) the 4N-th pin P4N of the fourth row of pins, so that a distance between any two pins having adjacent output order is d/4 which is suitable for the COG products having a pitch of d/4.

For example, if the number of pins is 2400, M=4 and N=600, and the specific distance d=44 um, then the distance between the first pin P1 of the first row of pins and the 601th pin P601 of the second row of pins having adjacent output orders S1 and S2 is d/4=11 um. Therefore, the pin pitch requirement of the COG products can be met.

Figure 10:
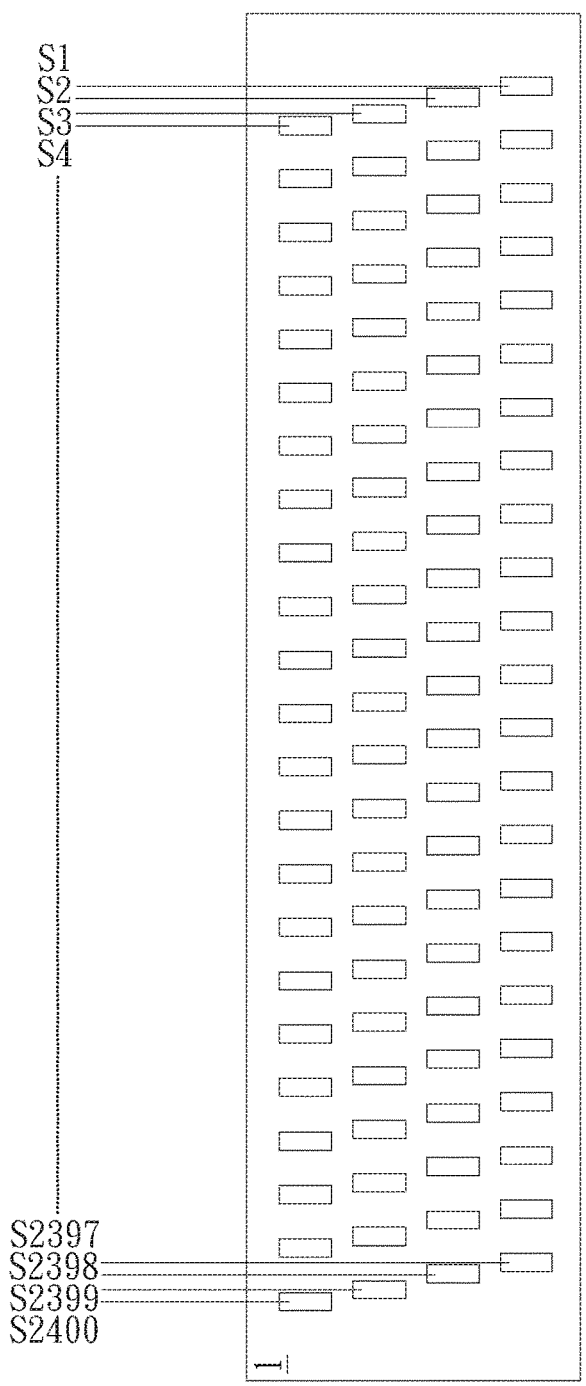
FIG. 10 illustrates a seventh embodiment of the pin output order arranged in the invention for the COG mode.

Please refer to FIG. 10. FIG. 10 illustrates a seventh embodiment of the pin output order arranged in the invention for the COG mode. In this embodiment, when an application mode of the driving circuit is a COG mode, the pin output order S1~S4N of the 4N pins arranged by the arranging module 10 is: (S1) the 4N-th pin P4N of the fourth row of pins, (S2) the 3N-th pin P3N of the third row of pins, (S3) the 2N-th pin P2N of the second row of pins, (S4) the N-th pin PN of the first row of pins, . . . , (S4N−3) the (3N+1)-th pin P(3N+1) of the fourth row of pins, (S4N−2) the (2N+1)-th pin P(2N+1) of the third row of pins, (S4N−1) the (N+1)-th pin P(N+1) of the second row of pins, and (S4N) the first pin P1 of the first row of pins, so that a distance between any two pins having adjacent output order is d/4 which is suitable for the COG products having a pitch of d/4.

For example, if the number of pins is 2400, M=4 and N=600, and the specific distance d=44 um, then the distance between the 2400th pin P2400 of the fourth row of pins and the 1800th pin P1800 of the third row of pins having adjacent output orders S1 and S2 is d/4=11 um. Therefore, the pin pitch requirement of the COG products can be met.

Figure 11:
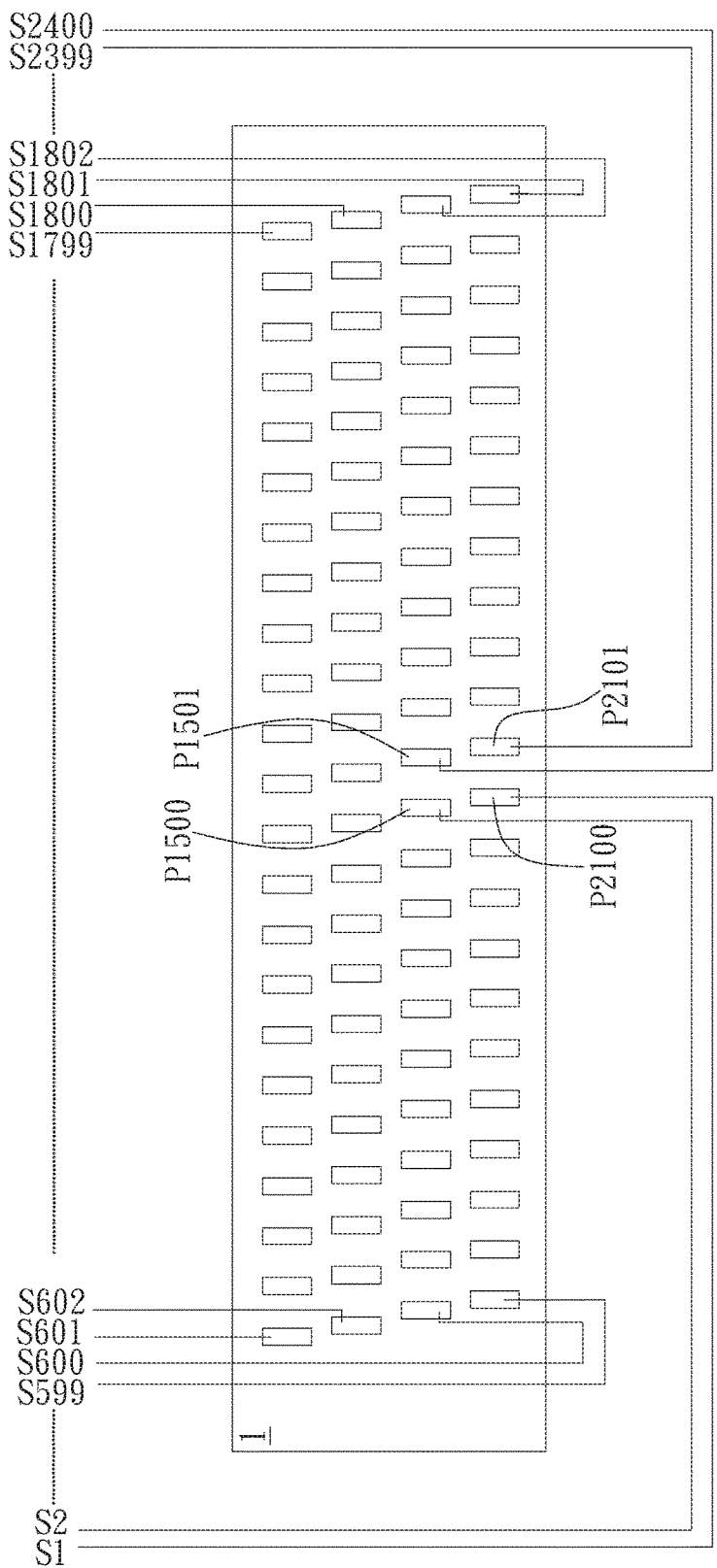
FIG. 11 illustrates an eighth embodiment of the pin output order arranged in the invention for the COF mode.

Please refer to FIG. 11. FIG. 11 illustrates an eighth embodiment of the pin output order arranged in the invention for the COF mode. In this embodiment, when an application mode of the driving circuit is a COF mode, the pin output order S1~S4N of the 4N pins arranged by the arranging module 10 is: (S1) the (3N+K)-th pin P(3N+K) of the fourth row of pins, (S2) the (2N+K)-th pin P(2N+K) of the third row of pins, (S3) the (3N+K−1)-th pin P(3N+K−1) of the fourth row of pins, (S4) the (2N+K−1)-th pin P(2N+K−1) of the third row of pins, . . . , the (3N+1)-th pin P(3N+1) of the fourth row of pins, the (2N+1)-th pin P(2N+1) of the third row of pins, the first pin P1 of the first row of pins, the (N+1)-th pin P(N+1) of the second row of pins, . . . , the N-th pin PN of the first row of pins, the 2N-th pin P2N of the second row of pins, the 4N-th pin P4N of the fourth row of pins, the 3N-th pin P3N of the third row of pins, . . . , (S4N−1) the (3N+K+1)-th pin P(3N+K+1) of the fourth row of pins, and (S4N) the (2N+K+1)-th pin P(2N+K+1) of the third row of pins, K is a positive integer and 1≤K≤N, so that a distance between any two pins having adjacent output order is d/2 which is suitable for the COF products having a pitch of d/2.

For example, if the number of pins is 2400, M=4 and N=600, and the specific distance d=44 um, when K=300, the distance between the 2100th pin P2100 of the fourth row of pins and the 1500th pin P1500 of the third row of pins having adjacent output orders S1 and S2 is d/2=22 um, the distance between the 2101th pin P2101 of the fourth row of pins and the 1501th pin P1501 of the third row of pins having adjacent output orders S2399 and S2400 is d/2=22 um. Therefore, the pin pitch requirement of the COF products can be met.

Figure 12:
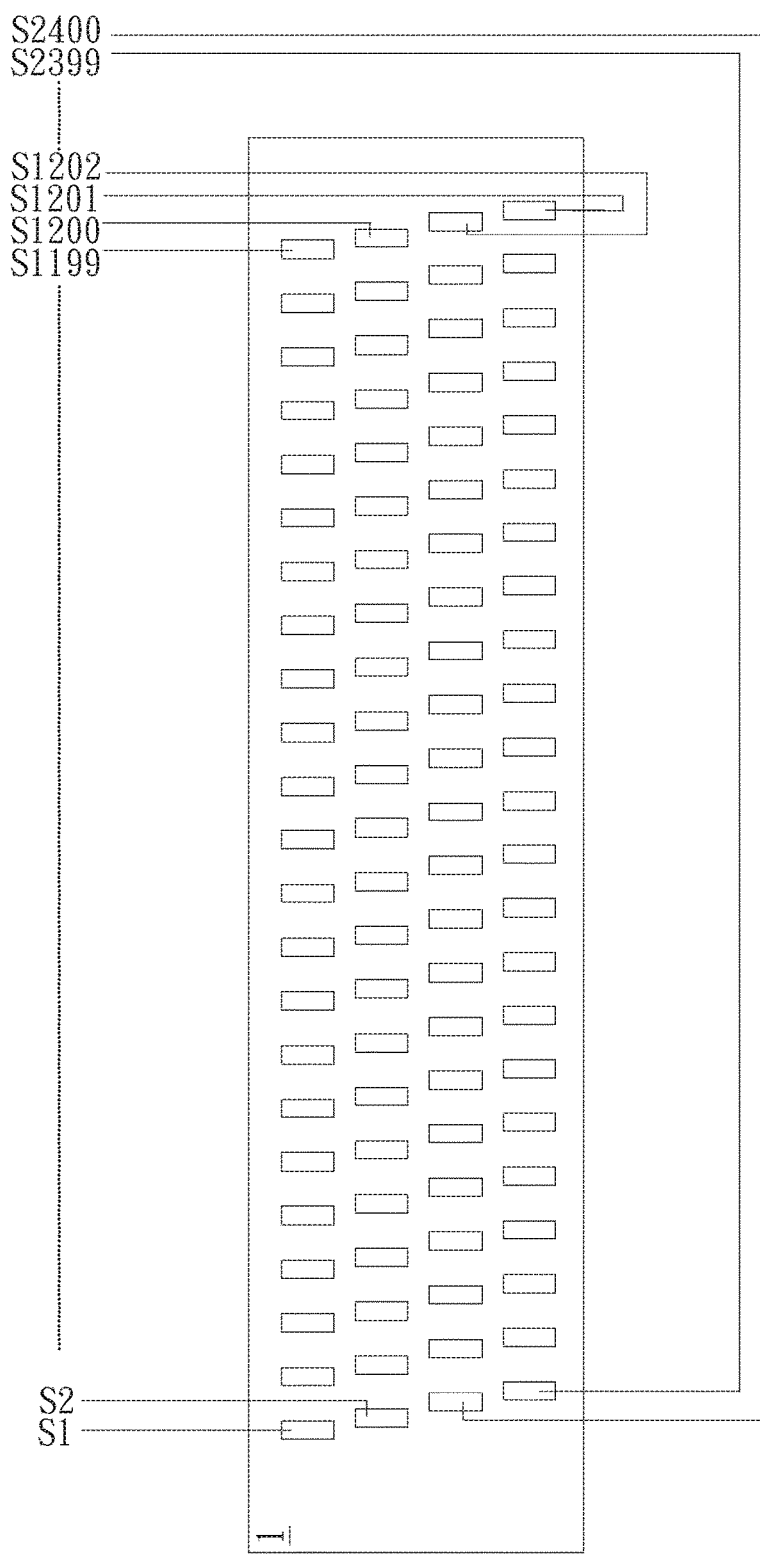
FIG. 12 illustrates a ninth embodiment of the pin output order arranged in the invention for the COF mode.

Please refer to FIG. 12. FIG. 12 illustrates a ninth embodiment of the pin output order arranged in the invention for the COF mode. In this embodiment, when an application mode of the driving circuit is a COF mode, the pin output order S1~S4N of the 4N pins arranged by the arranging module 10 is: (S1) the K-th pin PK of the first row of pins, (S2) the (N+K)-th pin P(N+K) of the second row of pins, (S3) the (K+1)-th pin P(K+1) of the first row of pins, (S4) the (N+K+1)-th pin P(N+K+1) of the second row of pins, . . . , the N-th pin PN of the first row of pins, the 2N-th pin P2N of the second row of pins, the 4N-th pin P4N of the fourth row of pins, the 3N-th pin P3N of the third row of pins, . . . , the (3N+1)-th pin P(3N+1) of the fourth row of pins, the (2N+1)-th pin P(2N+1) of the third row of pins, the first pin P1 of the first row of pins, the (N+1)-th pin P(N+1) of the second row of pins, . . . , (S4N−1) the (K−1)-th pin P(K−1) of the first row of pins, and (S4N) the (N+K−1)-th pin P(N+K−1) of the second row of pins, K is a positive integer and 1≤K≤N, so that a distance between any two pins having adjacent output order is d/2 which is suitable for the COF products having a pitch of d/2.

For example, if the number of pins is 2400, M=4 and N=600, and the specific distance d=44 um, when K=1, the distance between the first pin P1 of the first row of pins and the 601th pin P601 of the second row of pins having adjacent output orders S1 and S2 is d/2=22 um. Therefore, the pin pitch requirement of the COF products can be met.

Figure 13:
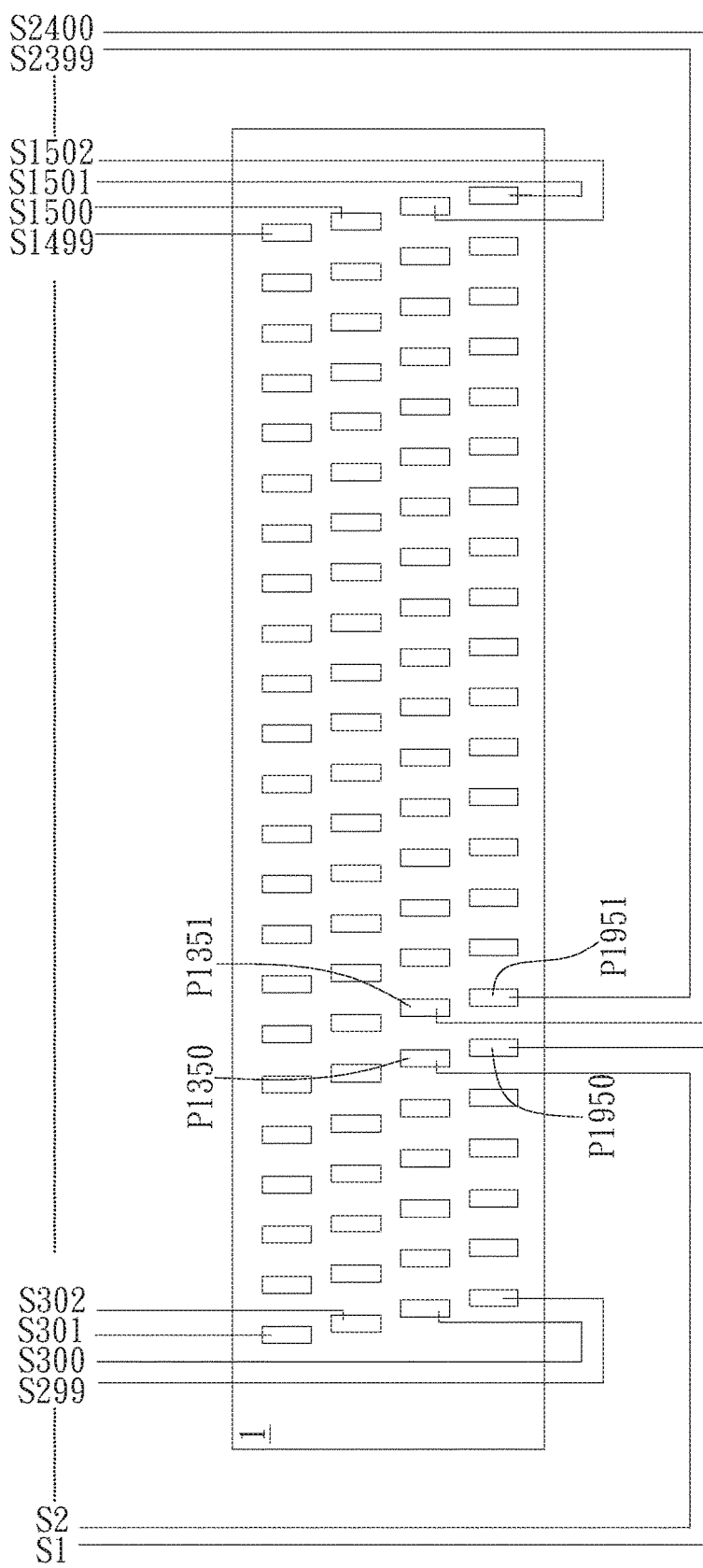
FIG. 13 illustrates a tenth embodiment of the pin output order arranged in the invention for the COF mode.

Please refer to FIG. 13. FIG. 13 illustrates a tenth embodiment of the pin output order arranged in the invention for the COF mode. In this embodiment, when an application mode of the driving circuit is a COF mode, the pin output order S1~S4N of the 4N pins arranged by the arranging module 10 is: (S1) the (3N+K)-th pin P(3N+K) of the fourth row of pins, (S2) the (2N+K)-th pin P(2N+K) of the third row of pins, (S3) the (3N+K−1)-th pin P(3N+K−1) of the fourth row of pins, (S4) the (2N+K−1)-th pin P(2N+K−1) of the third row of pins, . . . , the (3N+1)-th pin P(3N+1) of the fourth row of pins, the (2N+1)-th pin P(2N+1) of the third row of pins, the first pin P1 of the first row of pins, the (N+1)-th pin P(N+1) of the second row of pins, . . . , the N-th pin PN of the first row of pins, the 2N-th pin P2N of the second row of pins, the 4N-th pin P4N of the fourth row of pins, the 3N-th pin P3N of the third row of pins, . . . , (S4N−1) the (3N+K+1)-th pin P(3N+K+1) of the fourth row of pins, and (S4N) the (2N+K+1)-th pin P(2N+K+1) of the third row of pins, K is a positive integer and 1≤K≤N, so that a distance between any two pins having adjacent output order is d/2 which is suitable for the COF products having a pitch of d/2.

For example, if the number of pins is 2400, M=4 and N=600, and the specific distance d=44 um, when K=150, the distance between the 1950th pin P1950 of the fourth row of pins and the 1350th pin P1350 of the third row of pins having adjacent output orders S1 and S2 is d/2=22 um, the distance between the 1951th pin P1951 of the fourth row of pins and the 1351th pin P1351 of the third row of pins having adjacent output orders S2399 and S2400 is d/2=22 um. Therefore, the pin pitch requirement of the COF products can be met.

Then, another possible arranging way of the pins in the driving circuit of the invention will be introduced.

Figure 14:
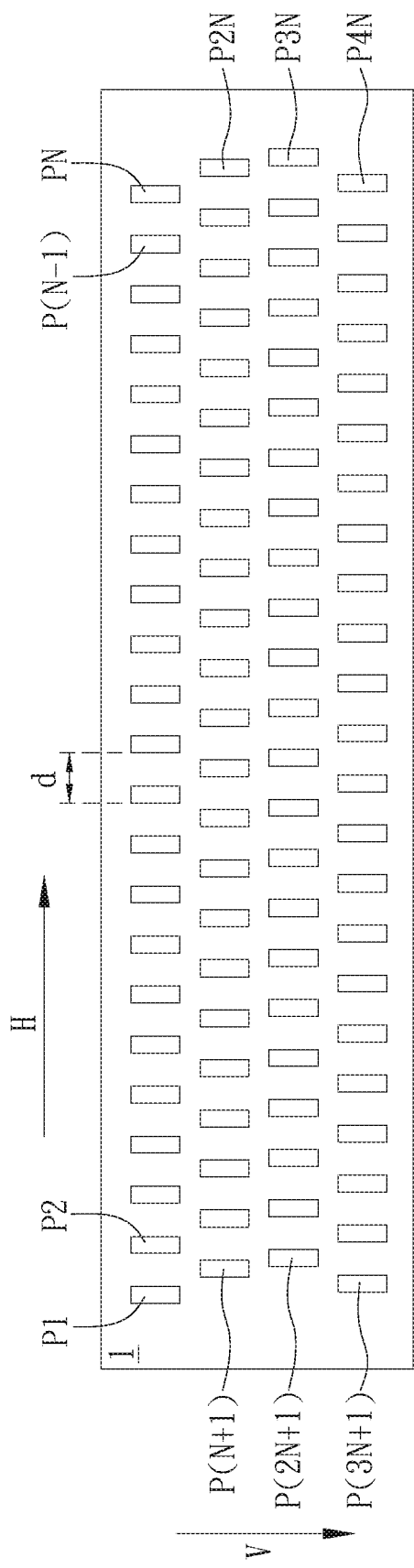
FIG. 14 illustrates a third possible arrangement of the pins in the driving circuit of the invention.

Please refer to FIG. 14. FIG. 14 illustrates a third possible arrangement of the pins in the driving circuit of the invention. As shown in FIG. 14, since M=4, the driving circuit 1 has 4N pins and the 4N pins are arranged along the horizontal direction H in a specific distance spaced to form four rows of pins. Wherein, the first pin P1, the second pin P2, . . . , and the N pin PN are arranged to form a first row of pins; the (N+1) pin P(N+1), the (N+2) pin P(N+2), . . . , and the 2N pin P2N are arranged to form a second row of pins; the (2N+1) pin P(2N+1), the (2N+2) pin P(2N+2), . . . , and the 3N pin P3N are arranged to form a third row of pins; the (3N+1) pin P(3N+1), the (3N+2) pin P(3N+2), . . . , and the 4N pin P4N are arranged to form a fourth row of pins. It should be noticed that the first row of pins, the second row of pins, the third row of pins, and the fourth row of pins are staggered along the vertical direction V in a third staggering way; in other words, the arrangement of different rows of pins along the vertical direction V is staggered instead of being aligned.

In a third staggering way shown in FIG. 14, a distance between the first pin P1 and the second pin P2 of the first row of pins along the first direction is equal to the specific distance d; a distance between the first pin P1 of the first row of pins and the (N+1) pin P(N+1) of the second row of pins along the first direction is d/2; a distance between the first pin P1 of the first row of pins and the (2N+1) pin P(2N+1) of the third row of pins along the first direction is 3d/4; a distance between the first pin P1 of the first row of pins and the (3N+1) pin P(3N+1) of the fourth row of pins along the first direction is d/4. That is to say, along the first direction, the third staggering way has the following arranging order: the first pin P1 of the first row of pins, the (3N+1) pin P(3N+1) of the fourth row of pins, the (N+1) pin P(N+1) of the second row of pins, the (2N+1) pin P(2N+1) of the third row of pins, and but not limited to this.

Then, a eleventh embodiment~a fifteenth embodiment are used to introduce different pin output orders of the pins of the driving circuit 1 when the driving circuit 1 has the second pin arranging way shown in FIG. 14 to be suitable for both COG and COF products.

Figure 15:
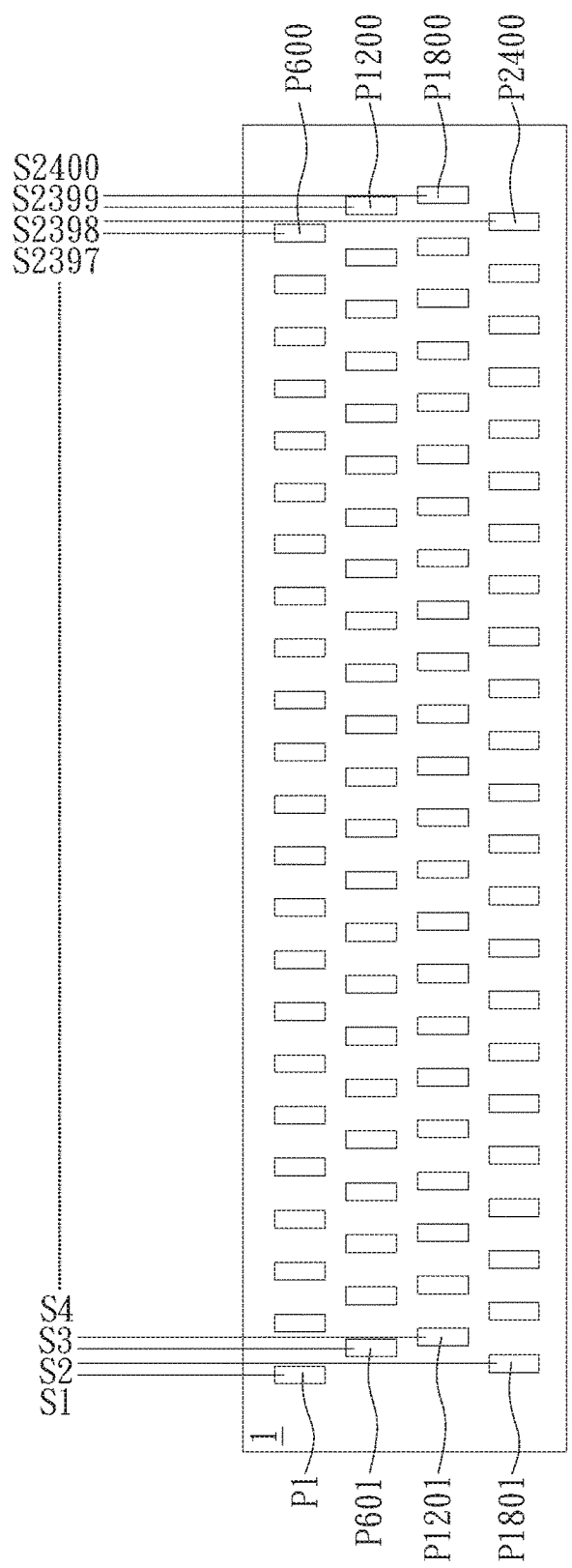
FIG. 15 illustrates an eleventh embodiment of the pin output order arranged in the invention for the COG mode.

Please refer to FIG. 15. FIG. 15 illustrates an eleventh embodiment of the pin output order arranged in the invention for the COG mode. In this embodiment, when an application mode of the driving circuit is a COG mode, the pin output order S1~S4N of the 4N pins arranged by the arranging module 10 is: (S1) the first pin P1 of the first row of pins, (S2) the (3N+1)-th pin P(3N+1) of the fourth row of pins, (S3) the (N+1)-th pin P(N+1) of the second row of pins, (S4) the (2N+1)-th pin P(2N+1) of the third row of pins, . . . , (S4N−3) the N-th pin PN of the first row of pins, (S4N−2) the 4N-th pin P4N of the fourth row of pins, (S4N−1) the 2N-th pin P2N of the second row of pins, and (S4N) the 3N-th pin P3N of the third row of pins, so that a distance between any two pins having adjacent output order is d/4 which is suitable for the COG products having a pitch of d/4.

For example, if the number of pins is 2400, M=4 and N=600, and the specific distance d=44 um, then the distance between the first pin P1 of the first row of pins and the 1801th pin P1801 of the fourth row of pins having adjacent output orders S1 and S2 is d/4=11 um. Therefore, the pin pitch requirement of the COG products can be met.

Figure 16:
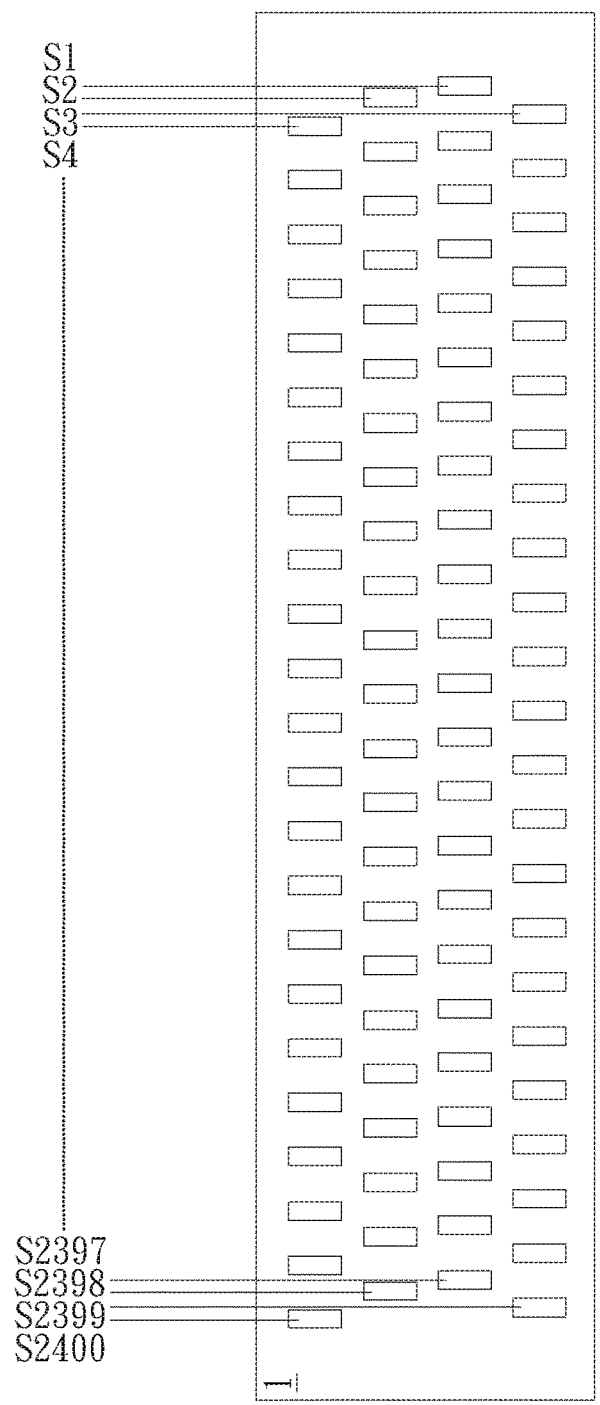
FIG. 16 illustrates a twelfth embodiment of the pin output order arranged in the invention for the COG mode.

Please refer to FIG. 16. FIG. 16 illustrates a twelfth embodiment of the pin output order arranged in the invention for the COG mode. In this embodiment, when an application mode of the driving circuit is a COG mode, the pin output order S1-54N of the 4N pins arranged by the arranging module 10 is: (S1) the 3N-th pin P3N of the third row of pins, (S2) the 2N-th pin P2N of the second row of pins, (S3) the 4N-th pin P4N of the fourth row of pins, (S4) the N-th pin PN of the first row of pins, . . . , (S4N−3) the (2N+1)-th pin P(2N+1) of the third row of pins, (S4N−2) the (N+1)-th pin P(N+1) of the second row of pins, (S4N−1) the (3N+1)-th pin P(3N+1) of the fourth row of pins, and (S4N) the first pin P1 of the first row of pins, so that a distance between any two pins having adjacent output order is d/4 which is suitable for the COG products having a pitch of d/4.

For example, if the number of pins is 2400, M=4 and N=600, and the specific distance d=44 um, then the distance between the 1800th pin P1800 of the third row of pins and the 1200th pin P1200 of the second row of pins having adjacent output orders S1 and S2 is d/4=11 um. Therefore, the pin pitch requirement of the COG products can be met.

Figure 17:
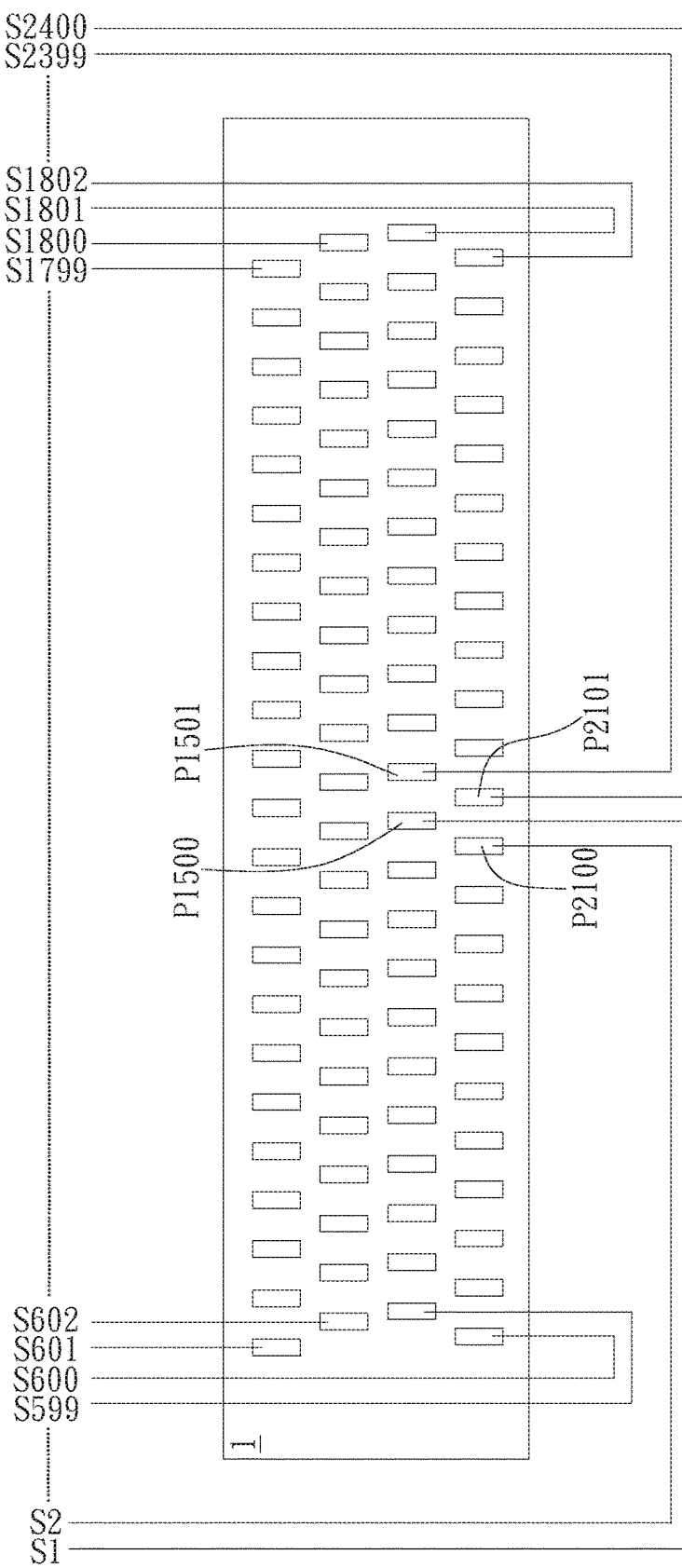
FIG. 17 illustrates a thirteenth embodiment of the pin output order arranged in the invention for the COF mode.

Please refer to FIG. 17. FIG. 17 illustrates a thirteenth embodiment of the pin output order arranged in the invention for the COF mode. In this embodiment, when an application mode of the driving circuit is a COF mode, the pin output order S1-54N of the 4N pins arranged by the arranging module 10 is: (S1) the (2N+K)-th pin P(2N+K) of the third row of pins, (S2) the (3N+K)-th pin P(3N+K) of the fourth row of pins, (S3) the (2N+K−1)-th pin P(2N+K−1) of the third row of pins, (S4) the (3N+K−1)-th pin P(3N+K−1) of the fourth row of pins, . . . , the (2N+1)-th pin P(2N+1) of the third row of pins, the (3N+1)-th pin P(3N+1) of the fourth row of pins, the first pin P1 of the first row of pins, the (N+1)-th pin P(N+1) of the second row of pins, . . . , the N-th pin PN of the first row of pins, the 2N-th pin P2N of the second row of pins, the 3N-th pin P3N of the third row of pins, the 4N-th pin P4N of the fourth row of pins, . . . , (S4N−1) the (2N+K+1)-th pin P(2N+K+1) of the third row of pins, and (S4N) the (3N+K+1)-th pin P(3N+K+1) of the fourth row of pins, K is a positive integer and 1≤K≤N, so that a distance between any two pins having adjacent output order is d/2 which is suitable for the COF products having a pitch of d/2.

For example, if the number of pins is 2400, M=4 and N=600, and the specific distance d=44 um, when K=300, the distance between the 1500th pin P1500 of the third row of pins and the 2100th pin P2100 of the fourth row of pins having adjacent output orders S1 and S2 is d/2=22 um. Therefore, the pin pitch requirement of the COF products can be met.

Figure 18:
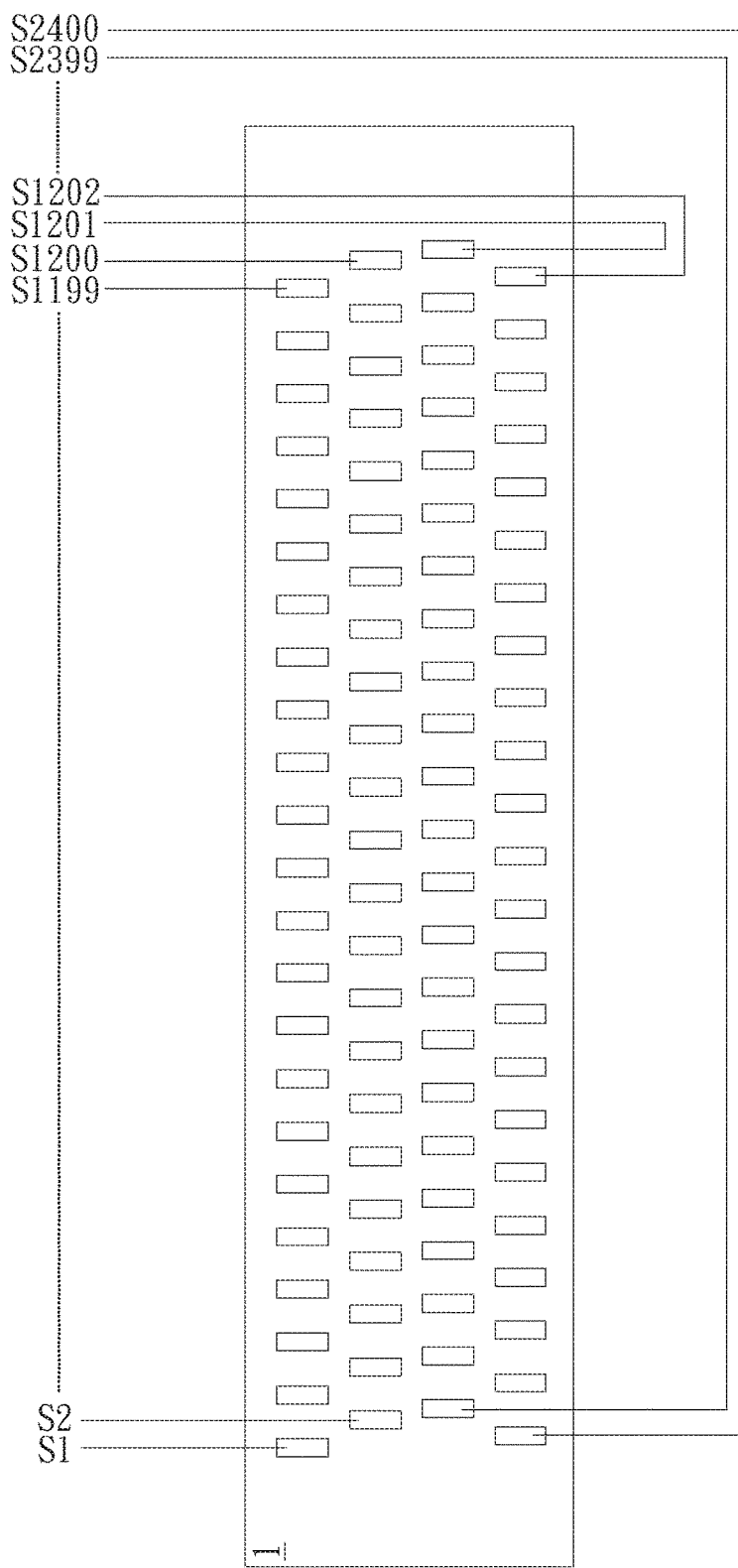
FIG. 18 illustrates a fourteenth embodiment of the pin output order arranged in the invention for the COF mode.

Please refer to FIG. 18. FIG. 18 illustrates a fourteenth embodiment of the pin output order arranged in the invention for the COF mode. In this embodiment, when an application mode of the driving circuit is a COF mode, the pin output order S1~S4N of the 4N pins arranged by the arranging module 10 is: (S1) the K-th pin PK of the first row of pins, (S2) the (N+K)-th pin P(N+K) of the second row of pins, (S3) the (K+1)-th pin P(K+1) of the first row of pins, (S4) the (N+K+1)-th pin P(N+K+1) of the second row of pins, . . . , the N-th pin PN of the first row of pins, the 2N-th pin P2N of the second row of pins, the 3N-th pin P3N of the third row of pins, the 4N-th pin P4N of the fourth row of pins, . . . , the (2N+1)-th pin P(2N+1) of the third row of pins, the (3N+1)-th pin P(3N+1) of the fourth row of pins, the first pin P1 of the first row of pins, the (N+1)-th pin P(N+1) of the second row of pins, . . . , (S4N−1) the (K−1)-th pin P(K−1) of the first row of pins, and (S4N) the (N+K−1)-th pin P(N+K−1) of the second row of pins, K is a positive integer and 1≤K≤N, so that a distance between any two pins having adjacent output order is d/2 which is suitable for the COF products having a pitch of d/2.

For example, if the number of pins is 2400, M=4 and N=600, and the specific distance d=44 um, when K=50, the distance between the 50th pin P50 of the first row of pins and the 650th pin P650 of the second row of pins having adjacent output orders S1 and S2 is d/2=22 um. Therefore, the pin pitch requirement of the COF products can be met.

Figure 19:
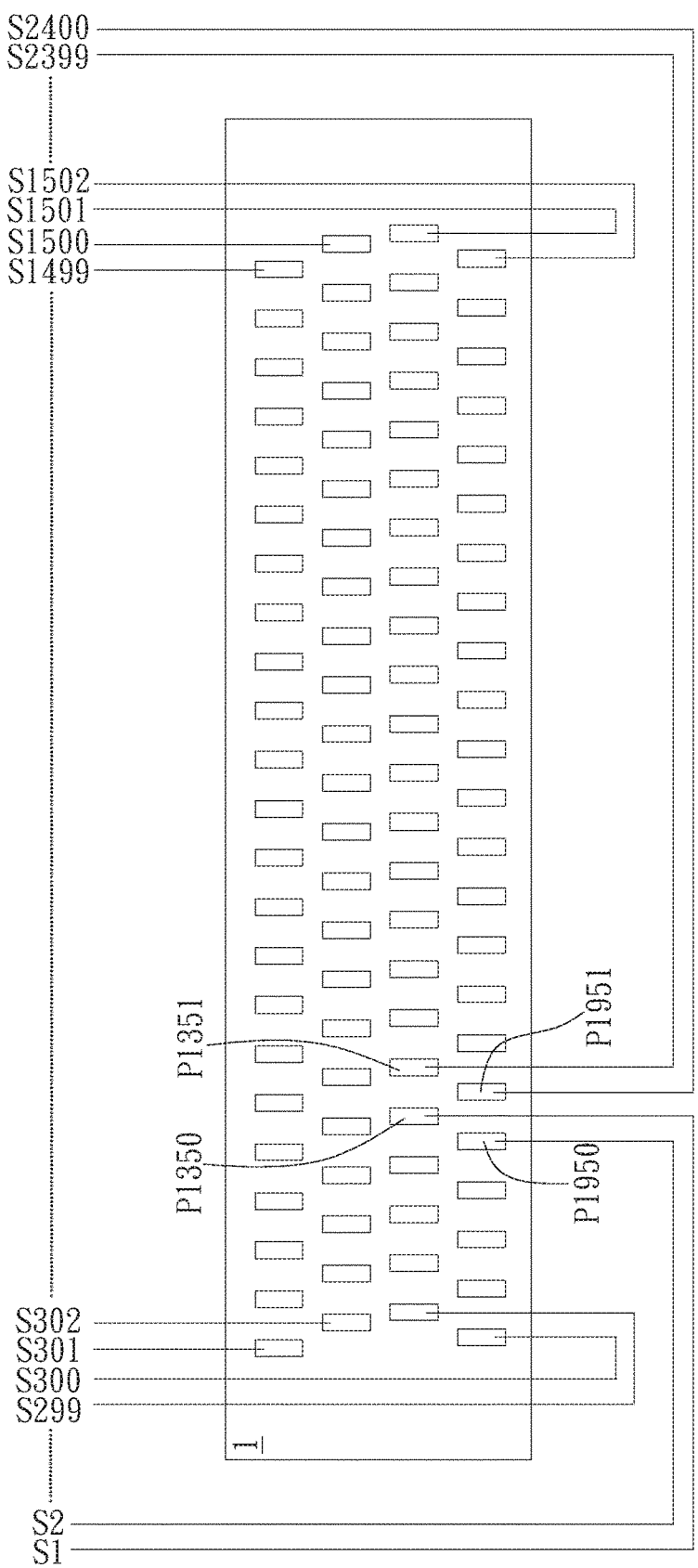
FIG. 19 illustrates a fifteenth embodiment of the pin output order arranged in the invention for the COF mode.

Please refer to FIG. 19. FIG. 19 illustrates a fifteenth embodiment of the pin output order arranged in the invention for the COF mode. In this embodiment, when an application mode of the driving circuit is a COF mode, the pin output order S1~S4N of the 4N pins arranged by the arranging module 10 is: (S1) the (2N+K)-th pin P(2N+K) of the third row of pins, (S2) the (3N+K)-th pin P(3N+K) of the fourth row of pins, (S3) the (2N+K−1)-th pin P(2N+K−1) of the third row of pins, (S4) the (3N+K−1)-th pin P(3N+K−1) of the fourth row of pins, . . . , the (2N+1)-th pin P(2N+1) of the third row of pins, the (3N+1)-th pin P(3N+1) of the fourth row of pins, the first pin P1 of the first row of pins, the (N+1)-th pin P(N+1) of the second row of pins, . . . , the N-th pin PN of the first row of pins, the 2N-th pin P2N of the second row of pins, the 3N-th pin P3N of the third row of pins, the 4N-th pin P4N of the fourth row of pins, . . . , (S4N−1) the (2N+K+1)-th pin P(2N+K+1) of the third row of pins, and (S4N) the (3N+K+1)-th pin P(3N+K+1) of the fourth row of pins, K is a positive integer and 1≤K≤N, so that a distance between any two pins having adjacent output order is d/2 which is suitable for the COF products having a pitch of d/2.

For example, if the number of pins is 2400, M=4 and N=600, and the specific distance d=44 um, when K=100, the distance between the 1300th pin P1300 of the third row of pins and the 1900th pin P1900 of the fourth row of pins having adjacent output orders S1 and S2 is d/2=22 um. Therefore, the pin pitch requirement of the COF products can be met.

Then, another possible arranging way of the pins in the driving circuit of the invention will be introduced.

Figure 20:
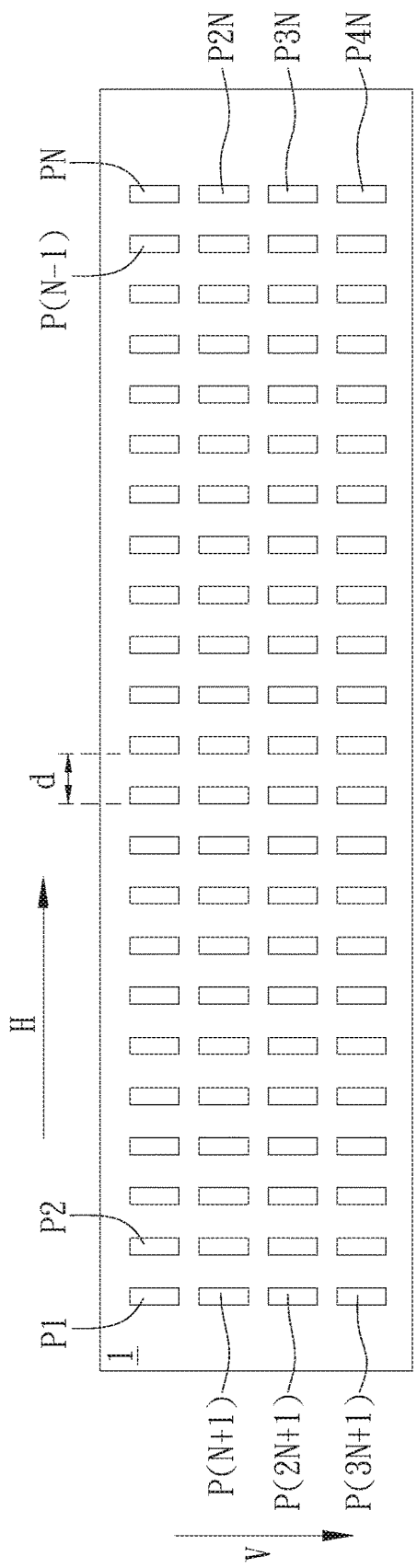
FIG. 20 illustrates a fourth possible arrangement of the pins in the driving circuit of the invention.

Please refer to FIG. 20. FIG. 20 illustrates a fourth possible arrangement of the pins in the driving circuit of the invention. As shown in FIG. 20, since M=4, the driving circuit 1 has 4N pins and the 4N pins are arranged along the horizontal direction H in a specific distance spaced to form four rows of pins. Wherein, the first pin P1, the second pin P2, . . . , and the N pin PN are arranged to form a first row of pins; the (N+1) pin P(N+1), the (N+2) pin P(N+2), . . . , and the 2N pin P2N are arranged to form a second row of pins; the (2N+1) pin P(2N+1), the (2N+2) pin P(2N+2), . . . , and the 3N pin P3N are arranged to form a third row of pins; the (3N+1) pin P(3N+1), the (3N+2) pin P(3N+2), . . . , and the 4N pin P4N are arranged to form a fourth row of pins.

It should be noticed that the first row of pins, the second row of pins, the third row of pins, and the fourth row of pins are aligned along the vertical direction V in an aligning way instead of being staggered along the vertical direction V in a staggering way.

In a fourth staggering way shown in FIG. 20, a distance between the first pin P1 and the second pin P2 of the first row of pins along the first direction is equal to the specific distance d; since the first row of pins, the second row of pins, the third row of pins, and the fourth row of pins are aligned along the vertical direction V in the aligning way, a distance between the first pin P1 of the first row of pins and the (N+1) pin P(N+1) of the second row of pins along the first direction, a distance between the first pin P1 of the first row of pins and the (2N+1) pin P(2N+1) of the third row of pins along the first direction, and a distance between the first pin P1 of the first row of pins and the (3N+1) pin P(3N+1) of the fourth row of pins along the first direction are 0.

Then, a sixteenth embodiment~a twentieth embodiment are used to introduce different pin output orders of the pins of the driving circuit 1 when the driving circuit 1 has the second pin arranging way shown in FIG. 20 to be suitable for both COG and COF products.

Figure 21:
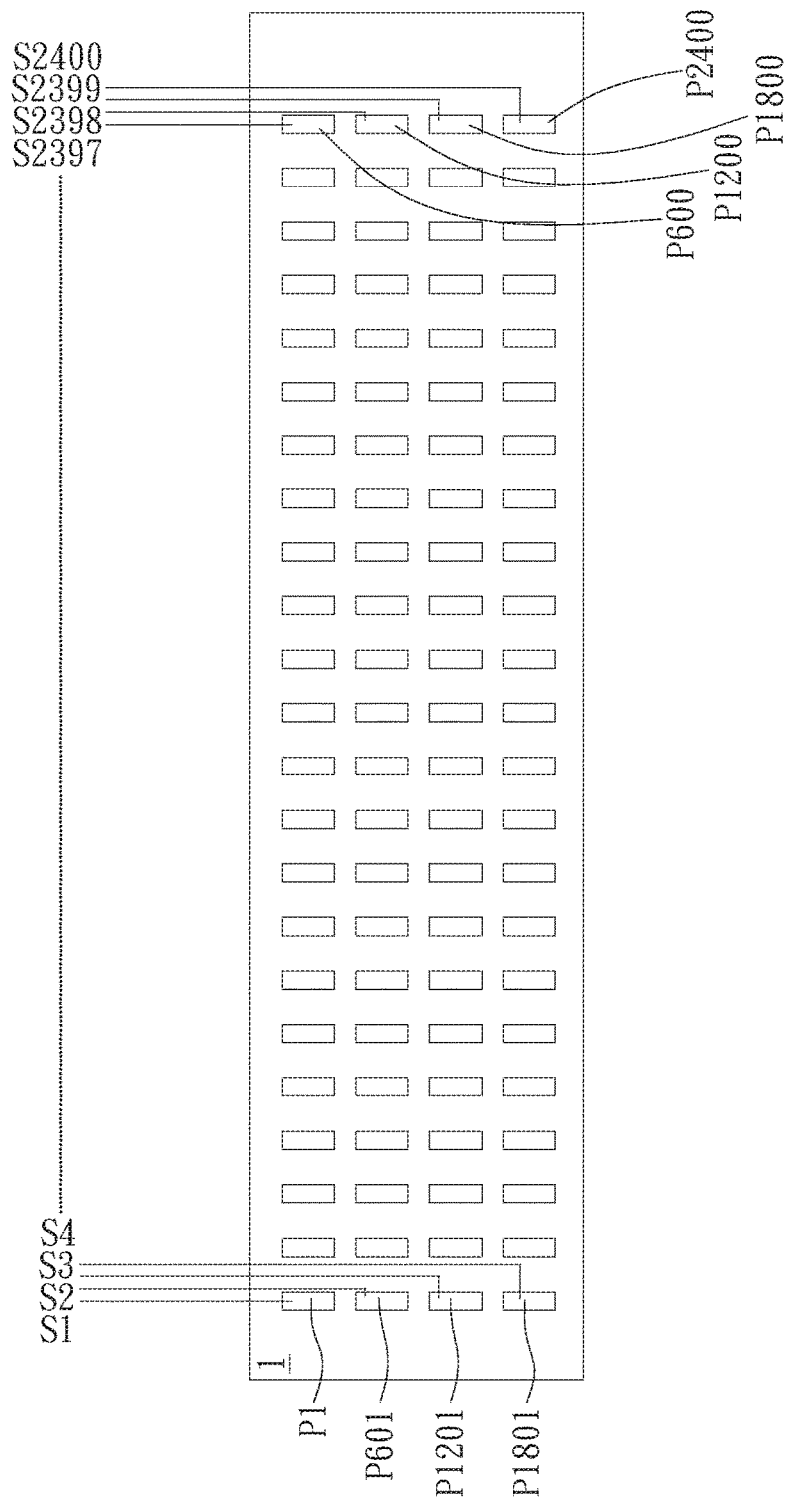
FIG. 21 illustrates a sixteenth embodiment of the pin output order arranged in the invention for the COG mode.

Please refer to FIG. 21. FIG. 21 illustrates a sixteenth embodiment of the pin output order arranged in the invention for the COG mode. In this embodiment, when an application mode of the driving circuit is a COG mode, the pin output order S1~S4N of the 4N pins arranged by the arranging module 10 is: (S1) the first pin P1 of the first row of pins, (S2) the (N+1)-th pin P(N+1) of the second row of pins, (S3) the (2N+1)-th pin P(2N+1) of the third row of pins, (S4) the (3N+1)-th pin P(3N+1) of the fourth row of pins, . . . , (S4N−3) the N-th pin PN of the first row of pins, (S4N−2) the 2N-th pin P2N of the second row of pins, (S4N−1) the 3N-th pin P3N of the third row of pins, and (S4N) the 4N-th pin P4N of the fourth row of pins, so that a distance between any two pins having adjacent output order is d/4 which is suitable for the COG products having a pitch of d/4.

For example, if the number of pins is 2400, M=4 and N=600, and the specific distance d=44 um, then the distance between the first pin P1 of the first row of pins and the 601th pin P601 of the second row of pins having adjacent output orders S1 and S2 is d/4=11 um. Therefore, the pin pitch requirement of the COG products can be met.

Figure 22:
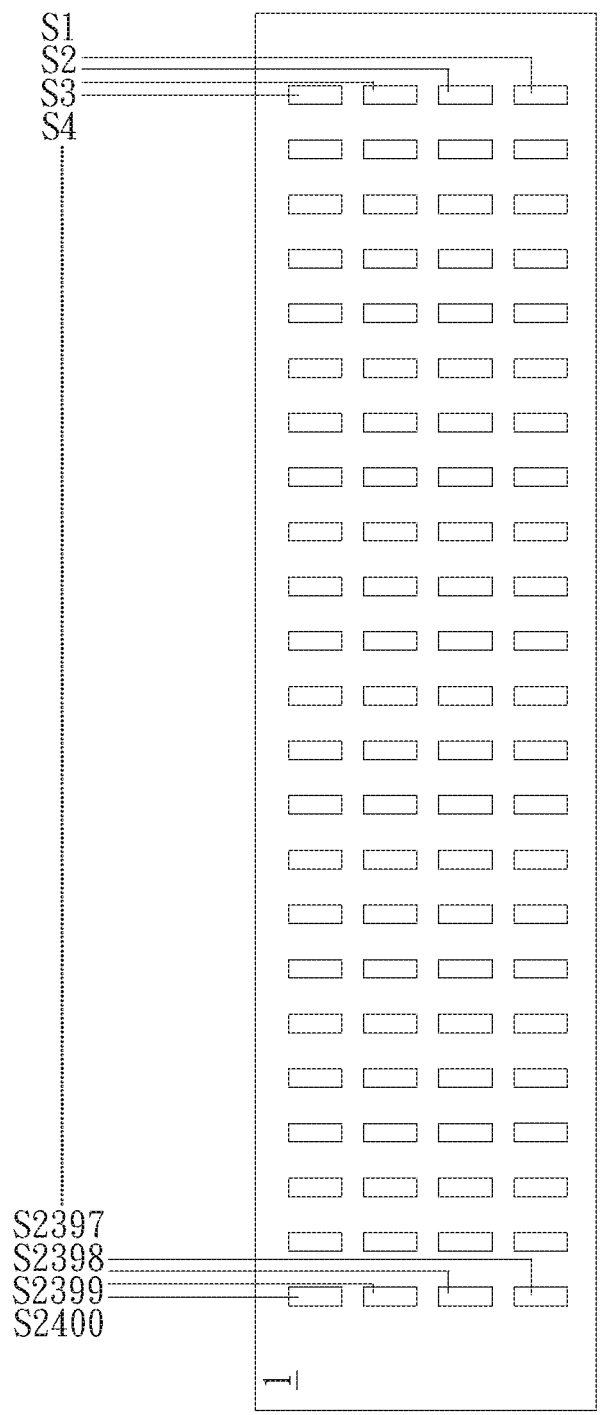
FIG. 22 illustrates a seventeenth embodiment of the pin output order arranged in the invention for the COG mode.

Please refer to FIG. 22. FIG. 22 illustrates a seventeenth embodiment of the pin output order arranged in the invention for the COG mode. In this embodiment, when an application mode of the driving circuit is a COG mode, the pin output order S1~S4N of the 4N pins arranged by the arranging module 10 is: (S1) the 4N-th pin P4N of the fourth row of pins, (S2) the 3N-th pin P3N of the third row of pins, (S3) the 2N-th pin P2N of the second row of pins, (S4) the N-th pin PN of the first row of pins, . . . , (S4N−3) the (3N+1)-th pin P(3N+1) of the fourth row of pins, (S4N−2) the (2N+1)-th pin P(2N+1) of the third row of pins, (S4N−1) the (N+1)-th pin P(N+1) of the second row of pins, and (S4N) the first pin P1 of the first row of pins, so that a distance between any two pins having adjacent output order is d/4 which is suitable for the COG products having a pitch of d/4.

For example, if the number of pins is 2400, M=4 and N=600, and the specific distance d=44 um, then the distance between the 2400th pin P2400 of the fourth row of pins and the 1800th pin P1800 of the third row of pins having adjacent output orders S1 and S2 is d/4=11 um. Therefore, the pin pitch requirement of the COG products can be met.

Figure 23:
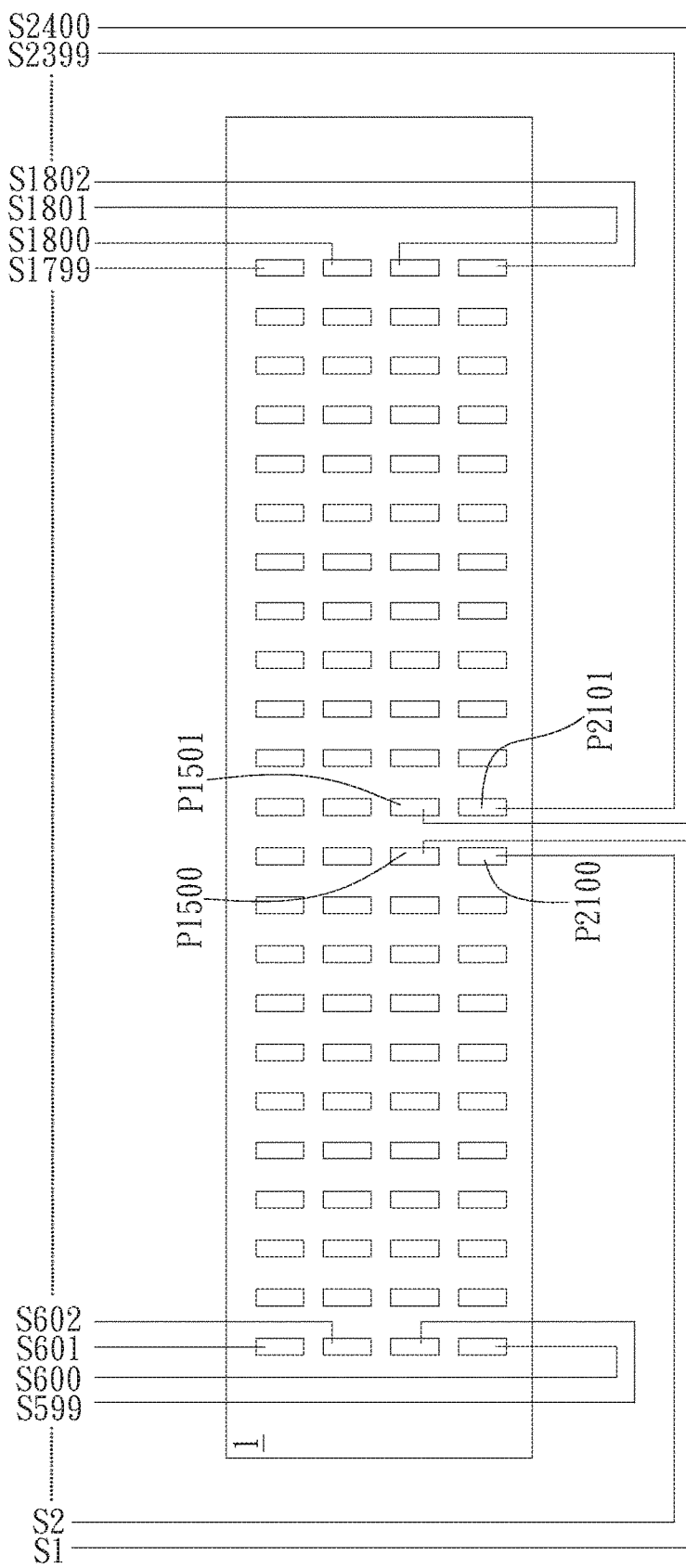
FIG. 23 illustrates an eighteenth embodiment of the pin output order arranged in the invention for the COF mode.

Please refer to FIG. 23. FIG. 23 illustrates an eighteenth embodiment of the pin output order arranged in the invention for the COF mode. In this embodiment, when an application mode of the driving circuit is a COF mode, the pin output order S1~S4N of the 4N pins arranged by the arranging module 10 is: (S1) the (2N+K)-th pin P(2N+K) of the third row of pins, (S2) the (3N+K)-th pin P(3N+K) of the fourth row of pins, (S3) the (2N+K−1)-th pin P(2N+K−1) of the third row of pins, (S4) the (3N+K−1)-th pin P(3N+K−1) of the fourth row of pins, . . . , the (2N+1)-th pin P(2N+1) of the third row of pins, the (3N+1)-th pin P(3N+1) of the fourth row of pins, the first pin P1 of the first row of pins, the (N+1)-th pin P(N+1) of the second row of pins, . . . , the N-th pin PN of the first row of pins, the 2N-th pin P2N of the second row of pins, the 3N-th pin P3N of the third row of pins, the 4N-th pin P4N of the fourth row of pins, . . . , (S4N−1) the (2N+K+1)-th pin P(2N+K+1) of the third row of pins, and (S4N) the (3N+K+1)-th pin P(3N+K+1) of the fourth row of pins, K is a positive integer and 1≤K≤N, so that a distance between any two pins having adjacent output order is d/2 which is suitable for the COF products having a pitch of d/2.

For example, if the number of pins is 2400, M=4 and N=600, and the specific distance d=44 um, when K=300, the distance between the 1500th pin P1500 of the third row of pins and the 2100th pin P2100 of the fourth row of pins having adjacent output orders S1 and S2 is d/2=22 um, and the distance between the 1501th pin P1500 of the third row of pins and the 2101th pin P2101 of the fourth row of pins having adjacent output orders S2399 and S2400 is d/2=22 um. Therefore, the pin pitch requirement of the COF products can be met.

Figure 24:
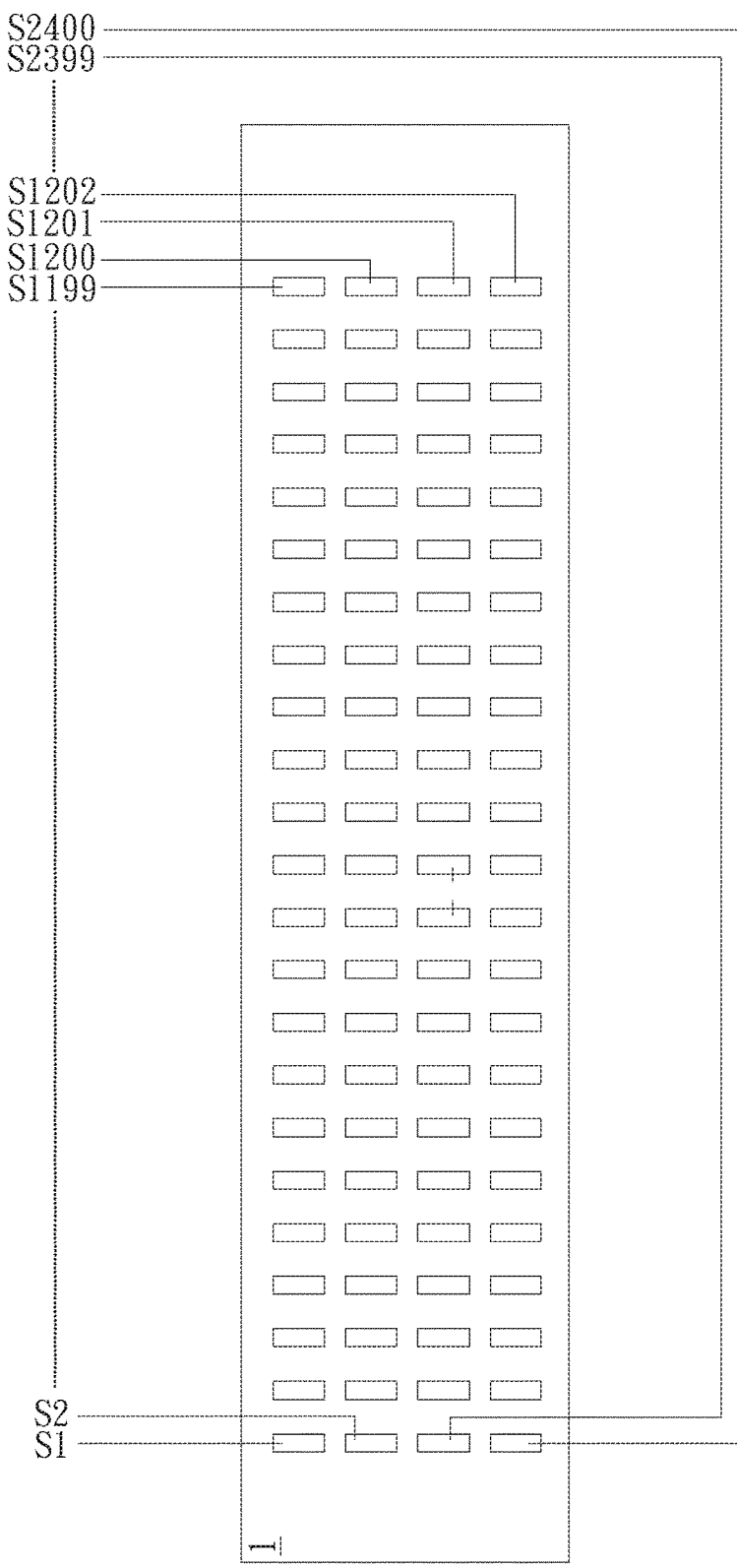
FIG. 24 illustrates a nineteenth embodiment of the pin output order arranged in the invention for the COF mode.

Please refer to FIG. 24. FIG. 24 illustrates a nineteenth embodiment of the pin output order arranged in the invention for the COF mode. In this embodiment, when an application mode of the driving circuit is a COF mode, the pin output order S1~S4N of the 4N pins arranged by the arranging module 10 is: (S1) the K-th pin PK of the first row of pins, (S2) the (N+K)-th pin P(N+K) of the second row of pins, (S3) the (K+1)-th pin P(K+1) of the first row of pins, (S4) the (N+K+1)-th pin P(N+K+1) of the second row of pins, . . . , the N-th pin PN of the first row of pins, the 2N-th pin P2N of the second row of pins, the 3N-th pin P3N of the third row of pins, the 4N-th pin P4N of the fourth row of pins, . . . , the (2N+1)-th pin P(2N+1) of the third row of pins, the (3N+1)-th pin P(3N+1) of the fourth row of pins, the first pin P1 of the first row of pins, the (N+1)-th pin P(N+1) of the second row of pins, . . . , (S4N−1) the (K−1)-th pin P(K−1) of the first row of pins, and (S4N) the (N+K−1)-th pin P(N+K−1) of the second row of pins, K is a positive integer and 1≤K≤N, so that a distance between any two pins having adjacent output order is d/2 which is suitable for the COF products having a pitch of d/2.

For example, if the number of pins is 2400, M=4 and N=600, and the specific distance d=44 um, when K=1, the distance between the first pin P1 of the first row of pins and the 601th pin P601 of the second row of pins having adjacent output orders S1 and S2 is d/2=22 um. Therefore, the pin pitch requirement of the COF products can be met.

Figure 25:
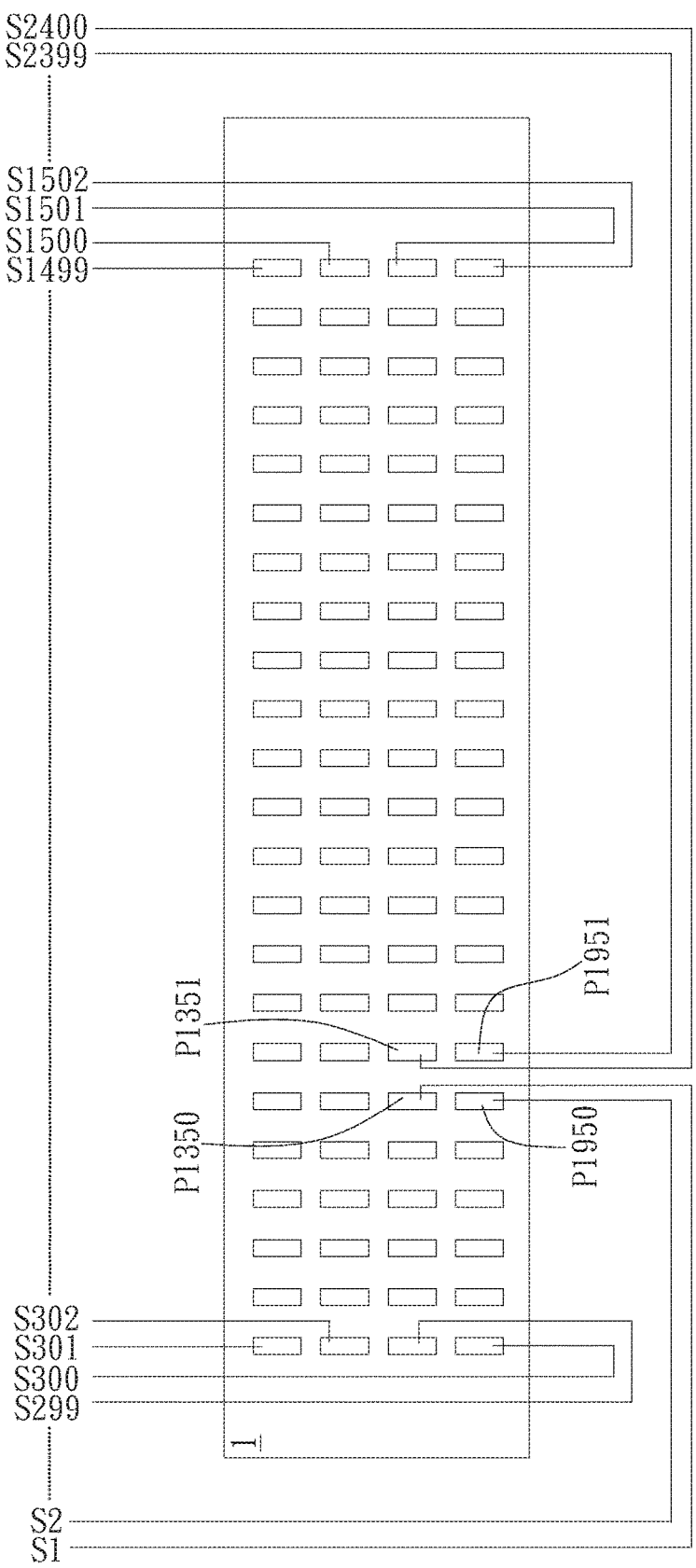
FIG. 25 illustrates a twentieth embodiment of the pin output order arranged in the invention for the COF mode.

Please refer to FIG. 25. FIG. 25 illustrates a twentieth embodiment of the pin output order arranged in the invention for the COF mode. In this embodiment, when an application mode of the driving circuit is a COF mode, the pin output order S1~S4N of the 4N pins arranged by the arranging module 10 is: (S1) the (2N+K)-th pin P(2N+K) of the third row of pins, (S2) the (3N+K)-th pin P(3N+K) of the fourth row of pins, (S3) the (2N+K−1)-th pin P(2N+K−1) of the third row of pins, (S4) the (3N+K−1)-th pin P(3N+K−1) of the fourth row of pins, . . . , the (2N+1)-th pin P(2N+1) of the third row of pins, the (3N+1)-th pin P(3N+1) of the fourth row of pins, the first pin P1 of the first row of pins, the (N+1)-th pin P(N+1) of the second row of pins, . . . , the N-th pin PN of the first row of pins, the 2N-th pin P2N of the second row of pins, the 3N-th pin P3N of the third row of pins, the 4N-th pin P4N of the fourth row of pins, . . . , (S4N−1) the (2N+K+1)-th pin P(2N+K+1) of the third row of pins, and (S4N) the (3N+K+1)-th pin P(3N+K+1) of the fourth row of pins, K is a positive integer and 1≤K≤N, so that a distance between any two pins having adjacent output order is d/2 which is suitable for the COF products having a pitch of d/2.

For example, if the number of pins is 2400, M=4 and N=600, and the specific distance d=44 um, when K=150, the distance between the 1350th pin P1350 of the third row of pins and the 1950th pin P1950 of the fourth row of pins having adjacent output orders S1 and S2 is d/2=22 um, and the distance between the 1351th pin P1351 of the third row of pins and the 1951th pin P1951 of the fourth row of pins having adjacent output orders S2399 and S2400 is d/2=22 um. Therefore, the pin pitch requirement of the COF products can be met.

Figure 26:
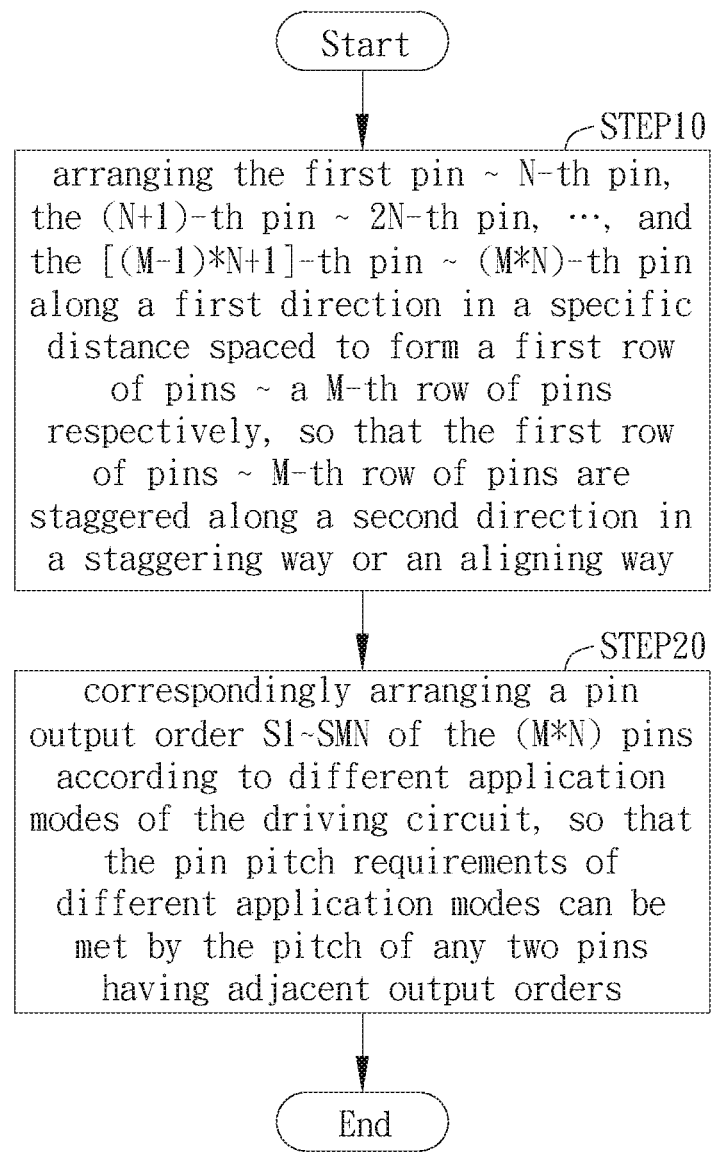
FIG. 26 illustrates a flowchart of the pin output order arranging method of another preferred embodiment of the invention.

Another preferred embodiment of the invention is a pin output order arranging method. In this embodiment, the pin output order arranging method is applied to a driving circuit. The driving circuit includes (M*N) pins. The (M*N) pins include a first pin, a second pin, . . . , and a (M*N)-th pin. Please refer to FIG. 26. FIG. 26 illustrates a flowchart of the pin output order arranging method of another preferred embodiment of the invention. As shown in FIG. 26, the pin output order arranging method includes the following steps:

STEP 10: arranging the first pin, the second pin, . . . , and an N-th pin of the (M*N) pins along a first direction (e.g., the horizontal direction) in a specific distance (e.g., 44 um) spaced to form a first row of pins, arranging a (N+1)-th pin, a (N+2)-th pin, . . . , and an 2N-th pin of the (M*N) pins along the first direction in the specific distance spaced to form a second row of pins, . . . , and arranging a [(M−1)*N+1]-th pin, a [(M−1)*N+2]-th pin, . . . , and a (M*N)-th pin of the (M*N) pins along the first direction in the specific distance spaced to form a M-th row of pins respectively, so that the first row of pins, the second row of pins, . . . , and the M-th row of pins are staggered along a second direction (e.g., the vertical direction) in a staggering way or an aligning way, and M and N are integers larger than 1;

STEP 20: correspondingly arranging a pin output order S1~SMN of the (M*N) pins according to different application modes of the driving circuit, so that the pin pitch requirements of different application modes (e.g., COG or COF modes) can be met by the pitch of any two pins having adjacent output orders (e.g., S1 and S2). As to the details of the pin output order arranging method, please refer to the above-mentioned first embodiment~fifteenth embodiment, they will be not repeated here.

Compared to the prior art, a driving circuit and a pin output order arranging method of the invention can randomly arrange the output order of all pins of the driving IC according to different applications of the driving IC, so that the pins of the driving circuit of the invention can be used in COG and COF products at the same time without increasing the pitch of the pins. Therefore, the drawbacks such as larger size and higher cost of the conventional driving IC can be effectively solved by the driving circuit and the pin output order arranging method of the invention and the application range of the driving IC can be also broadened.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

The invention claimed is:

1. A driving circuit having a pin output order arranging function, the driving circuit comprising:
(M*N) pins comprising a first pin, a second pin, . . . , and a (M*N)-th pin, wherein the first pin, the second pin, . . . , and an N-th pin of the (M*N) pins are arranged along a first direction in a specific distance spaced to form a first row of pins, a (N+1)-th pin, a (N+2)-th pin, . . . , and an 2N-th pin of the (M*N) pins are arranged along the first direction in the specific distance spaced to form a second row of pins, . . . , and a [(M−1)*N+1]-th pin, a [(M−1)*N+2]-th pin, . . . , and a (M*N)-th pin of the (M*N) pins are arranged along the first direction in the specific distance spaced to form a M-th row of pins; the first row of pins, the second row of pins, . . . , and the M-th row of pins are staggered along a second direction in a staggering way or an aligning way, and M and N are integers larger than 1; and
an arranging module, coupled to the (M*N) pins, the arranging module correspondingly arranging a pin output order S1~SMN of the (M*N) pins according to different application modes of the driving circuit.

2. The driving circuit of claim 1, wherein M=4, when an application mode of the driving circuit is a chip-on-glass (COG) mode, the pin output order S1~S4N of the (4*N) pins arranged by the arranging module is: (S1) the first pin, (S2) the (2N+1)-th pin, (S3) the (N+1)-th pin, (S4) the (3N+1)-th pin, . . . , (S4N−3) the N-th pin, (S4N−2) the 3N-th pin, (S4N−1) the 2N-th pin, and (S4N) the 4N-th pin, so that a distance between two pins having adjacent output order corresponds to the COG mode.

3. The driving circuit of claim 1, wherein M=4, when an application mode of the driving circuit is a COG mode, the pin output order S1~S4N of the (4*N) pins arranged by the arranging module is: (S1) the 4N-th pin, (S2) the 2N-th pin, (S3) the 3N-th pin, (S4) the N-th pin, . . . , (S4N−3) the (3N+1)-th pin, (S4N−2) the (N+1)-th pin, (S4N−1) the (2N+1)-th pin, and (S4N) the first pin, so that a distance between two pins having adjacent output order corresponds to the COG mode.

4. The driving circuit of claim 1, wherein M=4, when an application mode of the driving circuit is a chip-on-film (COF) mode, the pin output order S1~S4N of the (4*N) pins arranged by the arranging module is: (S1) the (3N+K)-th pin in the fourth row of pins, (S2) the (2N+K)-th pin in the third row of pins, (S3) the (3N+K−1)-th pin in the fourth row of pins, (S4) the (2N+K−1)-th pin in the third row of pins, . . . , the (3N+1)-th pin in the fourth row of pins, the (2N+1)-th pin in the third row of pins, the first pin in the first row of pins, the (N+1)-th pin in the second row of pins, . . . , the N-th pin in the first row of pins, the 2N-th pin in the second row of pins, the 4N-th pin in the fourth row of pins, the 3N-th pin in the third row of pins, . . . , (S4N−1) the (3N+K+1)-th pin in the fourth row of pins, and (S4N) the (2N+K+1)-th pin in the third row of pins, K is a positive integer and 1≤K≤N, so that a distance between two pins having adjacent output order corresponds to the COF mode.

5. The driving circuit of claim 1, wherein M=4, when an application mode of the driving circuit is a COF mode, the pin output order S1~S4N of the (4*N) pins arranged by the arranging module is: (S1) the K-th pin in the first row of pins, (S2) the (N+K)-th pin in the second row of pins, (S3) the (K+1)-th pin in the first row of pins, (S4) the (N+K+1)-th pin in the second row of pins, . . . , the 4N-th pin in the fourth row of pins, the 3N-th pin in the third row of pins, . . . , the (3N+1)-th pin in the fourth row of pins, the (2N+1)-th pin in the third row of pins, the first pin in the first row of pins, the (N+1)-th pin in the second row of pins, . . . , (S4N−1) the (K−1)-th pin in the first row of pins, and (S4N) the (N+K−1)-th pin in the second row of pins, K is a positive integer and 1≤K≤N, so that a distance between two pins having adjacent output order corresponds to the COF mode.

6. The driving circuit of claim 1, wherein M=4, when the first row of pins, the second row of pins, . . . , and the M-th row of pins are staggered in a first staggering way, a distance between the first pin in the first row of pins and the (2N+1)-th pin in the third row of pins along the first direction<a distance between the first pin in the first row of pins and the (N+1)-th pin in the second row of pins along the first direction<a distance between the first pin in the first row of pins and the (3N+1)-th pin in the fourth row of pins along the first direction.

7. The driving circuit of claim 1, wherein M=4, when an application mode of the driving circuit is a COG mode, the pin output order S1~S4N of the (4*N) pins arranged by the arranging module is: (S1) the first pin, (S2) the (N+1)-th pin, (S3) the (2N+1)-th pin, (S4) the (3N+1)-th pin, . . . , (S4N−3) the N-th pin, (S4N−2) the 2N-th pin, (S4N−1) the 3N-th pin, and (S4N) the 4N-th pin, so that a distance between two pins having adjacent output order corresponds to the COG mode.

8. The driving circuit of claim 1, wherein M=4, when an application mode of the driving circuit is a COG mode, the pin output order S1~S4N of the (4*N) pins arranged by the arranging module is: (S1) the 4N-th pin, (S2) the 3N-th pin, (S3) the 2N-th pin, (S4) the N-th pin, . . . , (S4N−3) the (3N+1)-th pin, (S4N−2) the (2N+1)-th pin, (S4N−1) the (N+1)-th pin, and (S4N) the first pin, so that a distance between two pins having adjacent output order corresponds to the COG mode.

9. The driving circuit of claim 1, wherein M=4, when an application mode of the driving circuit is a COF mode, the pin output order S1~S4N of the (4*N) pins arranged by the arranging module is: (S1) the (3N+K)-th pin in the fourth row of pins, (S2) the (2N+K)-th pin in the third row of pins, (S3) the (3N+K−1)-th pin in the fourth row of pins, (S4) the (2N+K−1)-th pin in the third row of pins, . . . , the (3N+1)-th pin in the fourth row of pins, the (2N+1)-th pin in the third row of pins, the first pin in the first row of pins, the (N+1)-th pin in the second row of pins, . . . , the N-th pin in the first row of pins, the 2N-th pin in the second row of pins, the 4N-th pin in the fourth row of pins, the 3N-th pin in the third row of pins, . . . , (S4N−1) the (3N+K+1)-th pin in the fourth row of pins, and (S4N) the (2N+K+1)-th pin in the third row of pins, K is a positive integer and 1≤K≤N, so that a distance between two pins having adjacent output order corresponds to the COF mode.

10. The driving circuit of claim 1, wherein M=4, when an application mode of the driving circuit is a COF mode, the pin output order S1~S4N of the (4*N) pins arranged by the arranging module is: (S1) the K-th pin in the first row of pins, (S2) the (N+K)-th pin in the second row of pins, (S3) the (K+1)-th pin in the first row of pins, (S4) the (N+K+1)-th pin in the second row of pins, . . . , the N-th pin in the first row of pins, the 2N-th pin in the second row of pins, the 4N-th pin in the fourth row of pins, the 3N-th pin in the third row of pins, . . . , the (3N+1)-th pin in the fourth row of pins, the (2N+1)-th pin in the third row of pins, the first pin in the first row of pins, the (N+1)-th pin in the second row of pins, . . . , (S4N−1) the (K−1)-th pin in the first row of pins, and (S4N) the (N+K−1)-th pin in the second row of pins, K is a positive integer and 1≤K≤N, so that a distance between two pins having adjacent output order corresponds to the COF mode.

11. The driving circuit of claim 1, wherein M=4, when the first row of pins, the second row of pins, . . . , and the M-th row of pins are staggered in a second staggering way, a distance between the first pin in the first row of pins and the (N+1)-th pin in the second row of pins along the first direction<a distance between the first pin in the first row of pins and the (2N+1)-th pin in the third row of pins along the first direction<a distance between the first pin in the first row of pins and the (3N+1)-th pin in the fourth row of pins along the first direction.

12. The driving circuit of claim 1, wherein M=4, when an application mode of the driving circuit is a COG mode, the pin output order S1~S4N of the (4*N) pins arranged by the arranging module is: (S1) the first pin, (S2) the (3N+1)-th pin, (S3) the (N+1)-th pin, (S4) the (2N+1)-th pin, . . . , (S4N−3) the N-th pin, (S4N−2) the 4N-th pin, (S4N−1) the 2N-th pin, and (S4N) the 3N-th pin, so that a distance between two pins having adjacent output order corresponds to the COG mode.

13. The driving circuit of claim 1, wherein M=4, when an application mode of the driving circuit is a COG mode, the pin output order S1~S4N of the (4*N) pins arranged by the arranging module is: (S1) the 3N-th pin, (S2) the 2N-th pin, (S3) the 4N-th pin, (S4) the N-th pin, . . . , (S4N−3) the (2N+1)-th pin, (S4N−2) the (N+1)-th pin, (S4N−1) the (3N+1)-th pin, and (S4N) the first pin, so that a distance between two pins having adjacent output order corresponds to the COG mode.

14. The driving circuit of claim 1, wherein M=4, when an application mode of the driving circuit is a COF mode, the pin output order S1~S4N of the (4*N) pins arranged by the arranging module is: (S1) the (2N+K)-th pin in the third row of pins, (S2) the (3N+K)-th pin in the fourth row of pins, (S3) the (2N+K−1)-th pin in the third row of pins, (S4) the (3N+K−1)-th pin in the fourth row of pins, . . . , the (2N+1)-th pin in the third row of pins, the first pin in the first row of pins, the (N+1)-th pin in the second row of pins, . . . , the N-th pin in the first row of pins, the 2N-th pin in the second row of pins, the 3N-th pin in the third row of pins, the 4N-th pin in the fourth row of pins, . . . , (S4N−1) the (2N+K+1)-th pin in the third row of pins, and (S4N) the (3N+K+1)-th pin in the fourth row of pins, K is a positive integer and 1≤K≤N, so that a distance between two pins having adjacent output order corresponds to the COF mode.

15. The driving circuit of claim 1, wherein M=4, when an application mode of the driving circuit is a COF mode, the pin output order S1~S4N of the (4*N) pins arranged by the arranging module is: (S1) the K-th pin in the first row of pins, (S2) the (N+K)-th pin in the second row of pins, (S3) the (K+1)-th pin in the first row of pins, (S4) the (N+K+1)-th pin in the second row of pins, . . . , the N-th pin in the first row of pins, the 2N-th pin in the second row of pins, the 3N-th pin in the third row of pins, the 4N-th pin in the fourth row of pins, . . . , the (2N+1)-th pin in the third row of pins, the (3N+1)-th pin in the fourth row of pins, the first pin in the first row of pins, the (N+1)-th pin in the second row of pins, . . . , (S4N−1) the (K−1)-th pin in the first row of pins, and (S4N) the (N+K−1)-th pin in the second row of pins, K is a positive integer and 1≤K≤N, so that a distance between two pins having adjacent output order corresponds to the COF mode.

16. The driving circuit of claim 1, wherein M=4, when the first row of pins, the second row of pins, . . . , and the M-th row of pins are staggered in a third staggering way, a distance between the first pin in the first row of pins and the (3N+1)-th pin in the fourth row of pins along the first direction<a distance between the first pin in the first row of pins and the (N+1)-th pin in the second row of pins along the first direction<a distance between the first pin in the first row of pins and the (2N+1)-th pin in the third row of pins along the first direction.

17. The driving circuit of claim 1, wherein M=4, when an application mode of the driving circuit is a COG mode, the pin output order S1~S4N of the (4*N) pins arranged by the arranging module is: (S1) the first pin, (S2) the (N+1)-th pin, (S3) the (2N+1)-th pin, (S4) the (3N+1)-th pin, . . . , (S4N−3) the N-th pin, (S4N−2) the 2N-th pin, (S4N−1) the 3N-th pin, and (S4N) the 4N-th pin, so that a distance between two pins having adjacent output order corresponds to the COG mode.

18. The driving circuit of claim 1, wherein M=4, when an application mode of the driving circuit is a COG mode, the pin output order S1~S4N of the (4*N) pins arranged by the arranging module is: (S1) the 4N-th pin, (S2) the 3N-th pin, (S3) the 2N-th pin, (S4) the N-th pin, . . . , (S4N−3) the (3N+1)-th pin, (S4N−2) the (2N+1)-th pin, (S4N−1) the (N+1)-th pin, and (S4N) the first pin, so that a distance between two pins having adjacent output order corresponds to the COG mode.

19. The driving circuit of claim 1, wherein M=4, when an application mode of the driving circuit is a COF mode, the pin output order S1~S4N of the (4*N) pins arranged by the arranging module is: (S1) the (2N+K)-th pin in the third row of pins, (S2) the (3N+K)-th pin in the fourth row of pins, (S3) the (2N+K−1)-th pin in the third row of pins, (S4) the (3N+K−1)-th pin in the fourth row of pins, . . . , the (2N+1)-th pin in the third row of pins, the (3N+1)-th pin in the fourth row of pins, the first pin in the first row of pins, the (N+1)-th pin in the second row of pins, . . . , the N-th pin in the first row of pins, the 2N-th pin in the second row of pins, the 3N-th pin in the third row of pins, the 4N-th pin in the fourth row of pins, . . . , (S4N−1) the (2N+K+1)-th pin in the third row of pins, and (S4N) the (3N+K+1)-th pin in the fourth row of pins, K is a positive integer and 1≤K≤N, so that a distance between two pins having adjacent output order corresponds to the COF mode.

20. The driving circuit of claim 1, wherein M=4, when an application mode of the driving circuit is a COF mode, the pin output order S1~S4N of the (4*N) pins arranged by the arranging module is: (S1) the K-th pin in the first row of pins, (S2) the (N+K)-th pin in the second row of pins, (S3) the (K+1)-th pin in the first row of pins, (S4) the (N+K+1)-th pin in the second row of pins, . . . , the N-th pin in the first row of pins, the 2N-th pin in the second row of pins, the 3N-th pin in the third row of pins, the 4N-th pin in the fourth row of pins, . . . , (2N+1)-th pin in the third row of pins, the (3N+1)-th pin in the fourth row of pins, the first pin in the first row of pins, the (N+1)-th pin in the second row of pins, . . . , (S4N−1) the (K−1)-th pin in the first row of pins, and (S4N) the (N+K−1)-th pin in the second row of pins, K is a positive integer and 1≤K≤N, so that a distance between two pins having adjacent output order corresponds to the COF mode.

21. The driving circuit of claim 1, wherein M=4, when the first row of pins, the second row of pins, . . . , and the M-th row of pins are staggered in a second staggering way, a distance between the first pin in the first row of pins and the (N+1)-th pin in the second row of pins along the first direction<a distance between the first pin in the first row of pins and the (2N+1)-th pin in the third row of pins along the first direction<a distance between the first pin in the first row of pins and the (3N+1)-th pin in the fourth row of pins along the first direction.

22. A pin output order arranging method applied to a driving circuit, the driving circuit comprising (M*N) pins, the (M*N) pins comprising a first pin, a second pin, . . . , and a (M*N)-th pin, the pin output order arranging method comprising steps of:
(a) arranging the first pin, the second pin, . . . , and an N-th pin of the (M*N) pins along a first direction in a specific distance spaced to form a first row of pins, arranging a (N+1)-th pin, a (N+2)-th pin, . . . , and an 2N-th pin of the (M*N) pins along the first direction in the specific distance spaced to form a second row of pins, . . . , and arranging a [(M−1)*N+1]-th pin, a [(M−1)*N+2]-th pin, . . . , and a (M*N)-th pin of the (M*N) pins along the first direction in the specific distance spaced to form a M-th row of pins respectively, so that the first row of pins, the second row of pins, . . . , and the M-th row of pins are staggered along a second direction in a staggering way or an aligning way, and M and N are integers larger than 1; and
(b) correspondingly arranging a pin output order S1~SMN of the (M*N) pins according to different application modes of the driving circuit.

23. The pin output order arranging method of claim 22, wherein M=4, when an application mode of the driving circuit is a COG mode, the pin output order S1~S4N of the (4*N) pins arranged by the step (b) is: (S1) the first pin, (S2) the (2N+1)-th pin, (S3) the (N+1)-th pin, (S4) the (3N+1)-th pin, . . . , (S4N−3) the N-th pin, (S4N−2) the 3N-th pin, (S4N−1) the 2N-th pin, and (S4N) the 4N-th pin, so that a distance between two pins having adjacent output order corresponds to the COG mode.

24. The pin output order arranging method of claim 22, wherein M=4, when an application mode of the driving circuit is a COG mode, the pin output order S1~S4N of the (4*N) pins arranged by the step (b) is: (S1) the 4N-th pin, (S2) the 2N-th pin, (S3) the 3N-th pin, (S4) the N-th pin, . . . , (S4N−3) the (3N+1)-th pin, (S4N−2) the (N+1)-th pin, (S4N−1) the (2N+1)-th pin, and (S4N) the first pin, so that a distance between two pins having adjacent output order corresponds to the COG mode.

25. The pin output order arranging method of claim 22, wherein M=4, when an application mode of the driving circuit is a chip-on-film (COF) mode, the pin output order S1~S4N of the (4*N) pins arranged by the step (b) is: (S1) the (3N+K)-th pin in the fourth row of pins, (S2) the (2N+K)-th pin in the third row of pins, (S3) the (3N+K−1)-th pin in the fourth row of pins, (S4) the (2N+K−1)-th pin in the third row of pins, . . . , the (3N+1)-th pin in the fourth row of pins, the (2N+1)-th pin in the third row of pins, the first pin in the first row of pins, the (N+1)-th pin in the second row of pins, . . . , the N-th pin in the first row of pins, the 2N-th pin in the second row of pins, the 4N-th pin in the fourth row of pins, the 3N-th pin in the third row of pins, . . . , (S4N−1) the (3N+K+1)-th pin in the fourth row of pins, and (S4N) the (2N+K+1)-th pin in the third row of pins, K is a positive integer and 1≤K≤N, so that a distance between two pins having adjacent output order corresponds to the COF mode.

26. The pin output order arranging method of claim 22, wherein M=4, when an application mode of the driving circuit is a COF mode, the pin output order S1~S4N of the (4*N) pins arranged by the step (b) is: (S1) the K-th pin in the first row of pins, (S2) the (N+K)-th pin in the second row of pins, (S3) the (K+1)-th pin in the first row of pins, (S4) the (N+K+1)-th pin in the second row of pins, . . . , the 4N-th pin in the fourth row of pins, the 3N-th pin in the third row of pins, . . . , the (3N+1)-th pin in the fourth row of pins, the (2N+1)-th pin in the third row of pins, the first pin in the first row of pins, the (N+1)-th pin in the second row of pins, . . . , (S4N−1) the (K−1)-th pin in the first row of pins, and (S4N) the (N+K−1)-th pin in the second row of pins, K is a positive integer and 1≤K≤N, so that a distance between two pins having adjacent output order corresponds to the COF mode.

27. The pin output order arranging method of claim 22, wherein M=4, when the first row of pins, the second row of pins, . . . , and the M-th row of pins are staggered in a first staggering way, a distance between the first pin in the first row of pins and the (2N+1)-th pin in the third row of pins along the first direction<a distance between the first pin in the first row of pins and the (N+1)-th pin in the second row of pins along the first direction<a distance between the first pin in the first row of pins and the (3N+1)-th pin in the fourth row of pins along the first direction.

28. The pin output order arranging method of claim 22, wherein M=4, when an application mode of the driving circuit is a COG mode, the pin output order S1~S4N of the (4*N) pins arranged by the step (b) is: (S1) the first pin, (S2) the (N+1)-th pin, (S3) the (2N+1)-th pin, (S4) the (3N+1)-th pin, . . . , (S4N−3) the N-th pin, (S4N−2) the 2N-th pin, (S4N−1) the 3N-th pin, and (S4N) the 4N-th pin, so that a distance between two pins having adjacent output order corresponds to the COG mode.

29. The pin output order arranging method of claim 22, wherein M=4, when an application mode of the driving circuit is a COG mode, the pin output order S1~S4N of the (4*N) pins arranged by the step (b) is: (S1) the 4N-th pin, (S2) the 3N-th pin, (S3) the 2N-th pin, (S4) the N-th pin, . . . , (S4N−3) the (3N+1)-th pin, (S4N−2) the (2N+1)-th pin, (S4N−1) the (N+1)-th pin, and (S4N) the first pin, so that a distance between two pins having adjacent output order corresponds to the COG mode.

30. The pin output order arranging method of claim 22, wherein M=4, when an application mode of the driving circuit is a COF mode, the pin output order S1~S4N of the (4*N) pins arranged by the step (b) is: (S1) the (3N+K)-th pin in the fourth row of pins, (S2) the (2N+K)-th pin in the third row of pins, (S3) the (3N+K−1)-th pin in the fourth row of pins, (S4) the (2N+K−1)-th pin in the third row of pins, . . . , the (3N+1)-th pin in the fourth row of pins, the (2N+1)-th pin in the third row of pins, the first pin in the first row of pins, the (N+1)-th pin in the second row of pins, . . . , the N-th pin in the first row of pins, the 2N-th pin in the second row of pins, the 4N-th pin in the fourth row of pins, the 3N-th pin in the third row of pins, . . . , (S4N−1) the (3N+K+1)-th pin in the fourth row of pins, and (S4N) the (2N+K+1)-th pin in the third row of pins, K is a positive integer and 1≤K≤N, so that a distance between two pins having adjacent output order corresponds to the COF mode.

31. The pin output order arranging method of claim 22, wherein M=4, when an application mode of the driving circuit is a COF mode, the pin output order S1~S4N of the (4*N) pins arranged by the step (b) is: (S1) the K-th pin in the first row of pins, (S2) the (N+K)-th pin in the second row of pins, (S3) the (K+1)-th pin in the first row of pins, (S4) the (N+K+1)-th pin in the second row of pins, . . . , the N-th pin in the first row of pins, the 2N-th pin in the second row of pins, the 4N-th pin in the fourth row of pins, the 3N-th pin in the third row of pins, . . . , the (3N+1)-th pin in the fourth row of pins, the (2N+1)-th pin in the third row of pins, the first pin in the first row of pins, the (N+1)-th pin in the second row of pins, . . . , (S4N−1) the (K−1)-th pin in the first row of pins, and (S4N) the (N+K−1)-th pin in the second row of pins, K is a positive integer and 1≤K≤N, so that a distance between two pins having adjacent output order corresponds to the COF mode.

32. The pin output order arranging method of claim 22, wherein M=4, when the first row of pins, the second row of pins, . . . , and the M-th row of pins are staggered in a second staggering way, a distance between the first pin in the first row of pins and the (N+1)-th pin in the second row of pins along the first direction<a distance between the first pin in the first row of pins and the (2N+1)-th pin in the third row of pins along the first direction<a distance between the first pin in the first row of pins and the (3N+1)-th pin in the fourth row of pins along the first direction.

33. The pin output order arranging method of claim 22, wherein M=4, when an application mode of the driving circuit is a COG mode, the pin output order S1~S4N of the (4*N) pins arranged by the step (b) is: (S1) the first pin, (S2) the (3N+1)-th pin, (S3) the (N+1)-th pin, (S4) the (2N+1)-th pin, . . . , (S4N−3) the N-th pin, (S4N−2) the 4N-th pin, (S4N−1) the 2N-th pin, and (S4N) the 3N-th pin, so that a distance between two pins having adjacent output order corresponds to the COG mode.

34. The pin output order arranging method of claim 22, wherein M=4, when an application mode of the driving circuit is a COG mode, the pin output order S1~S4N of the (4*N) pins arranged by the step (b) is: (S1) the 3N-th pin, (S2) the 2N-th pin, (S3) the 4N-th pin, (S4) the N-th pin, . . . , (S4N−3) the (2N+1)-th pin, (S4N−2) the (N+1)-th pin, (S4N−1) the (3N+1)-th pin, and (S4N) the first pin, so that a distance between two pins having adjacent output order corresponds to the COG mode.

35. The pin output order arranging method of claim 22, wherein M=4, when an application mode of the driving circuit is a COF mode, the pin output order S1~S4N of the (4*N) pins arranged by the step (b) is: (S1) the (2N+K)-th pin in the third row of pins, (S2) the (3N+K)-th pin in the fourth row of pins, (S3) the (2N+K−1)-th pin in the third row of pins, (S4) the (3N+K−1)-th pin in the fourth row of pins, . . . , the (2N+1)-th pin in the third row of pins, the first pin in the first row of pins, the (N+1)-th pin in the second row of pins, . . . , the N-th pin in the first row of pins, the 2N-th pin in the second row of pins, the 3N-th pin in the third row of pins, the 4N-th pin in the fourth row of pins, . . . , (S4N−1) the (2N+K+1)-th pin in the third row of pins, and (S4N) the (3N+K+1)-th pin in the fourth row of pins, K is a positive integer and 1≤K≤N, so that a distance between two pins having adjacent output order corresponds to the COF mode.

36. The pin output order arranging method of claim 22, wherein M=4, when an application mode of the driving circuit is a COF mode, the pin output order S1~S4N of the (4*N) pins arranged by the step (b) is: (S1) the K-th pin in the first row of pins, (S2) the (N+K)-th pin in the second row of pins, (S3) the (K+1)-th pin in the first row of pins, (S4) the (N+K+1)-th pin in the second row of pins, . . . , the N-th pin in the first row of pins, the 2N-th pin in the second row of pins, the 3N-th pin in the third row of pins, the 4N-th pin in the fourth row of pins, . . . , the (2N+1)-th pin in the third row of pins, the (3N+1)-th pin in the fourth row of pins, the first pin in the first row of pins, the (N+1)-th pin in the second row of pins, . . . , (S4N−1) the (K−1)-th pin in the first row of pins, and (S4N) the (N+K−1)-th pin in the second row of pins, K is a positive integer and 1≤K≤N, so that a distance between two pins having adjacent output order corresponds to the COF mode.

37. The pin output order arranging method of claim 22, wherein M=4, when the first row of pins, the second row of pins, . . . , and the M-th row of pins are staggered in a third staggering way, a distance between the first pin in the first row of pins and the (3N+1)-th pin in the fourth row of pins along the first direction<a distance between the first pin in the first row of pins and the (N+1)-th pin in the second row of pins along the first direction <a distance between the first pin in the first row of pins and the (2N+1)-th pin in the third row of pins along the first direction.

38. The pin output order arranging method of claim 22, wherein M=4, when an application mode of the driving circuit is a COG mode, the pin output order S1~S4N of the (4*N) pins arranged by the step (b) is: (S1) the first pin, (S2) the (N+1)-th pin, (S3) the (2N+1)-th pin, (S4) the (3N+1)-th pin, . . . , (S4N−3) the N-th pin, (S4N−2) the 2N-th pin, (S4N−1) the 3N-th pin, and (S4N) the 4N-th pin, so that a distance two pins having adjacent output order corresponds to the COG mode.

39. The pin output order arranging method of claim 22, wherein M=4, when an application mode of the driving circuit is a COG mode, the pin output order S1~S4N of the (4*N) pins arranged by the step (b) is: (S1) the 4N-th pin, (S2) the 3N-th pin, (S3) the 2N-th pin, (S4) the N-th pin, . . . , (S4N−3) the (3N+1)-th pin, (S4N−2) the (2N+1)-th pin, (S4N−1) the (N+1)-th pin, and (S4N) the first pin, so that a distance between two pins having adjacent output order corresponds to the COG mode.

40. The pin output order arranging method of claim 22, wherein M=4, when an application mode of the driving circuit is a COF mode, the pin output order S1~S4N of the (4*N) pins arranged by the step (b) is: (S1) the (2N+K)-th pin in the third row of pins, (S2) the (3N+K)-th pin in the fourth row of pins, (S3) the (2N+K−1)-th pin in the third row of pins, (S4) the (3N+K−1)-th pin in the fourth row of pins, . . . , the (2N+1)-th pin in the third row of pins, the (3N+1)-th pin in the fourth row of pins, the first pin in the first row of pins, the (N+1)-th pin in the second row of pins, . . . , the N-th pin in the first row of pins, the 2N-th pin in the second row of pins, the 3N-th pin in the third row of pins, the 4N-th pin in the fourth row of pins, . . . , (S4N−1) the (2N+K+1)-th pin in the third row of pins, and (S4N) the (3N+K+1)-th pin in the fourth row of pins, K is a positive integer and 1≤K≤N, so that a distance between two pins having adjacent output order corresponds to the COF mode.

41. The pin output order arranging method of claim 22, wherein M=4, when an application mode of the driving circuit is a COF mode, the pin output order S1~S4N of the (4*N) pins arranged by the step (b) is: (S1) the K-th pin in the first row of pins, (S2) the (N+K)-th pin in the second row of pins, (S3) the (K+1)-th pin in the first row of pins, (S4) the (N+K+1)-th pin in the second row of pins, . . . , the N-th pin in the first row of pins, the 2N-th pin in the second row of pins, the 3N-th pin in the third row of pins, the 4N-th pin in the fourth row of pins, . . . , the (2N+1)-th pin in the third row of pins, the (3N+1)-th pin in the fourth row of pins, the first pin in the first row of pins, the (N+1)-th pin in the second row of pins, . . . , (S4N−1) the (K−1)-th pin in the first row of pins, and (S4N) the (N+K−1)-th pin in the second row of pins, K is a positive integer and 1≤K≤N, so that a distance between two pins having adjacent output order corresponds to the COF mode.

42. The pin output order arranging method of claim 22, wherein M=4, when the first row of pins, the second row of pins, . . . , and the M-th row of pins are staggered in a second staggering way, a distance between the first pin in the first row of pins and the (N+1)-th pin in the second row of pins along the first direction<a distance between the first pin in the first row of pins and the (2N+1)-th pin in the third row of pins along the first direction<a distance between the first pin in the first row of pins and the (3N+1)-th pin in the fourth row of pins along the first direction.

\* \* \* \* \*